(12) United States Patent
Menard et al.

(10) Patent No.: US 10,534,137 B2
(45) Date of Patent: Jan. 14, 2020

(54) MIRROR BASED MICROELECTROMECHANICAL SYSTEMS AND METHODS

(71) Applicants: Michael Menard, Verdun (CA); Frederic Nabki, Montreal (CA); Mohamed Rahim, Montreal (CA); Jonathan Briere, Terrebonne (CA); Philippe-Olivier Beaulieu, Chateauguay (CA)

(72) Inventors: Michael Menard, Verdun (CA); Frederic Nabki, Montreal (CA); Mohamed Rahim, Montreal (CA); Jonathan Briere, Terrebonne (CA); Philippe-Olivier Beaulieu, Chateauguay (CA)

(73) Assignee: Transfert Plus Societe en Commandite, Montreal (CA)

( * ) Notice: Subject to any disclaimer, the term of this patent is extended or adjusted under 35 U.S.C. 154(b) by 0 days.

(21) Appl. No.: 16/048,687

(22) Filed: Jul. 30, 2018

(65) Prior Publication Data

US 2018/0364420 A1    Dec. 20, 2018

Related U.S. Application Data

(63) Continuation of application No. 15/124,259, filed as application No. PCT/CA2015/000136 on Mar. 9, 2015, now Pat. No. 10,067,293.

(Continued)

(51) Int. Cl.
*G02B 6/12*    (2006.01)
*G02B 6/35*    (2006.01)

(Continued)

(52) U.S. Cl.
CPC ........... *G02B 6/3518* (2013.01); *G02B 6/124* (2013.01); *G02B 6/12007* (2013.01);
(Continued)

(58) Field of Classification Search
CPC .......................... G02B 6/4206; G02B 6/3518; G02B 6/12007; G02B 6/124; G02B 6/3596; G02B 6/4208; G02B 6/0841
See application file for complete search history.

(56) References Cited

U.S. PATENT DOCUMENTS

2002/0197002 A1* 12/2002 Lin ....................... B81B 3/0008
385/18
2003/0008420 A1* 1/2003 Chang ................ G02B 26/0841
438/4

(Continued)

*Primary Examiner* — Thomas A Hollweg
*Assistant Examiner* — Mary A El-Shammaa
(74) *Attorney, Agent, or Firm* — Rosenberg, Klein & Lee

(57) ABSTRACT

Unlike most MEMS device configurations which simply switch between two positions in many optical devices the state of a MEMS mirror is important in all transition positions. It may determine the characteristics of an optical delay line system and by that an optical coherence tomography system in one application and in another the number of wavelength channels and the dynamic wavelength switching capabilities in the other. The role of the MEMS is essential and it is responsible for altering the paths of the different wavelengths in either device. It would be beneficial to improve the performance of such MEMS and thereby the performance of the optical components and optical systems they form part of. The inventors have established improvements to the design and implementation of such MEMS mirrors as well as optical waveguide technologies to in-plane optical processing as well as the mid infrared for optical spectroscopy.

22 Claims, 37 Drawing Sheets

Related U.S. Application Data

(60) Provisional application No. 61/949,474, filed on Mar. 7, 2014.

(51) Int. Cl.
*G02B 6/124* (2006.01)
*G02B 6/42* (2006.01)
*G02B 26/08* (2006.01)

(52) U.S. Cl.
CPC ......... *G02B 6/3596* (2013.01); *G02B 6/4208* (2013.01); *G02B 26/0841* (2013.01)

(56) References Cited

U.S. PATENT DOCUMENTS

| | | | | |
|---|---|---|---|---|
| 2006/0049826 A1* | 3/2006 | Daneman | ............. | G02B 6/3518 324/207.13 |
| 2007/0160321 A1* | 7/2007 | Wu | .................... | G02B 6/12007 385/24 |

* cited by examiner

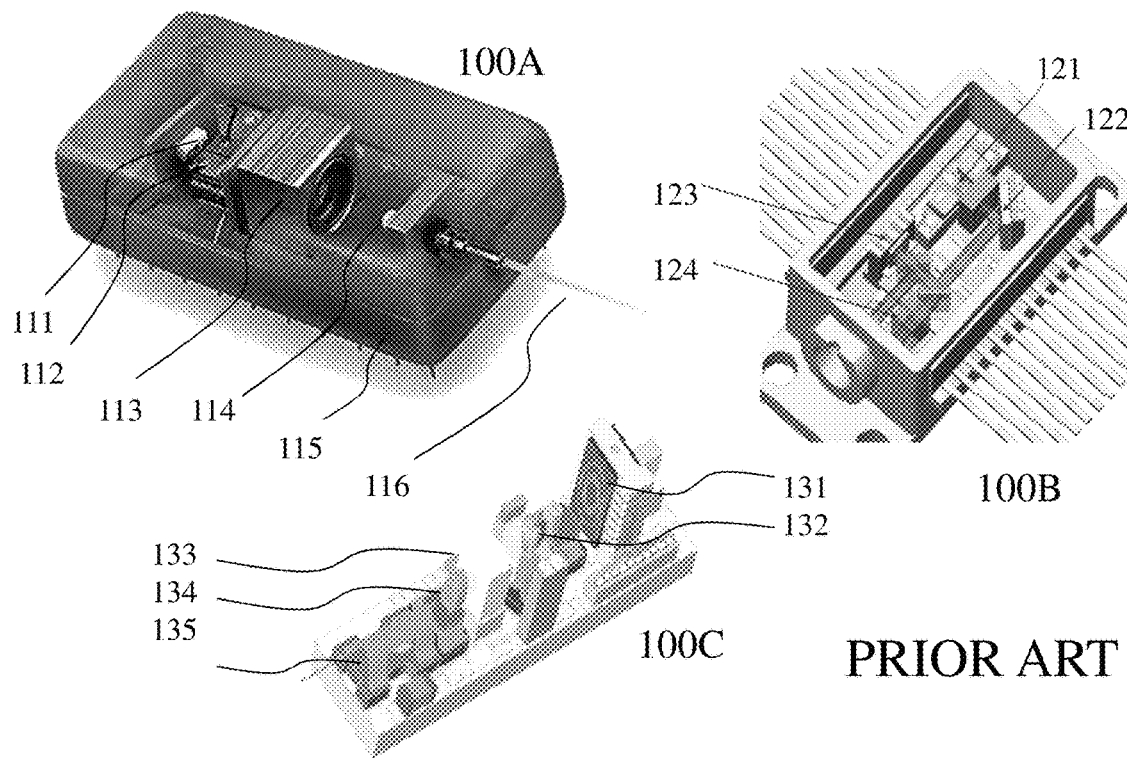
PRIOR ART
Figure 1
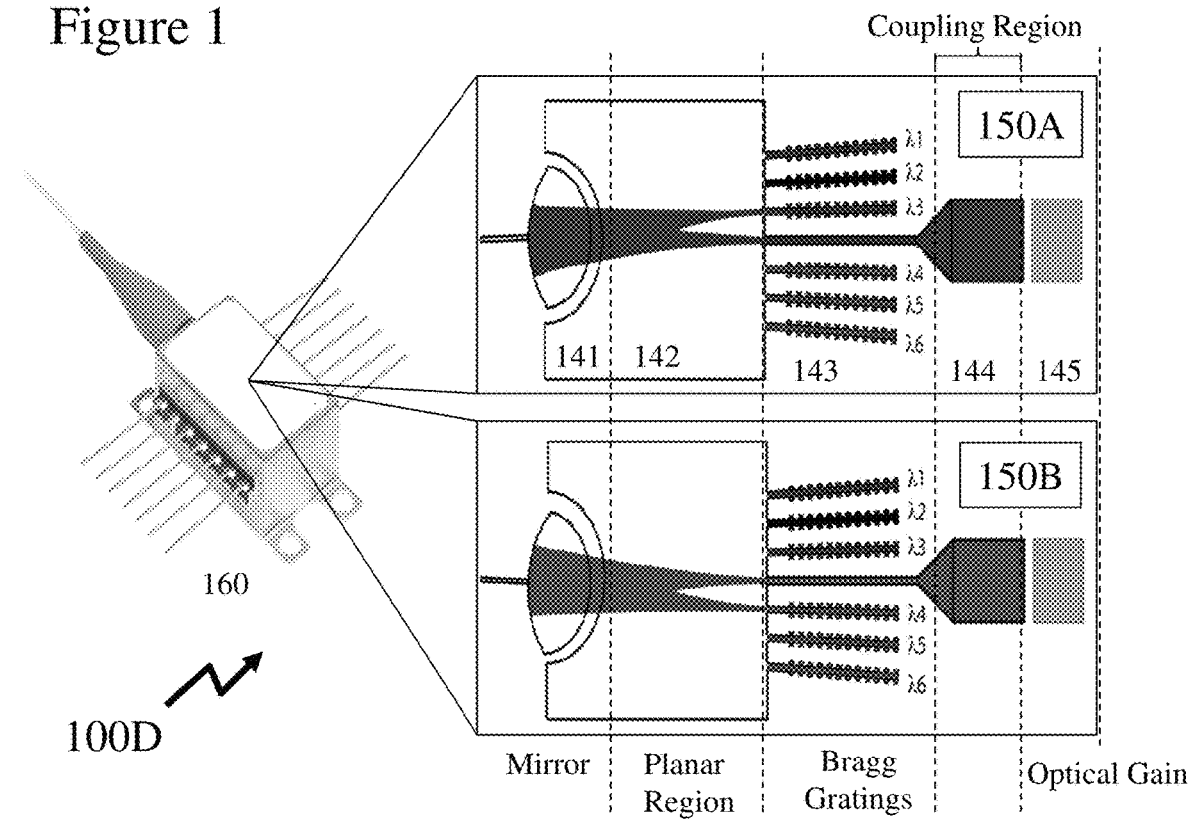

300B

300C

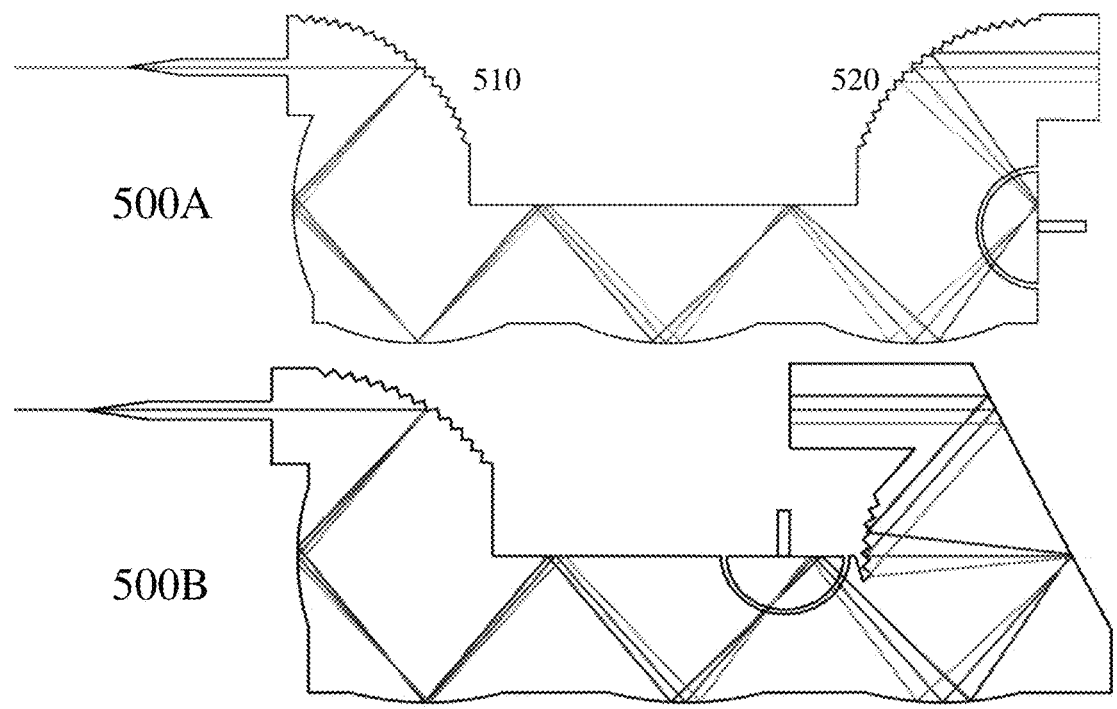
Figure 5
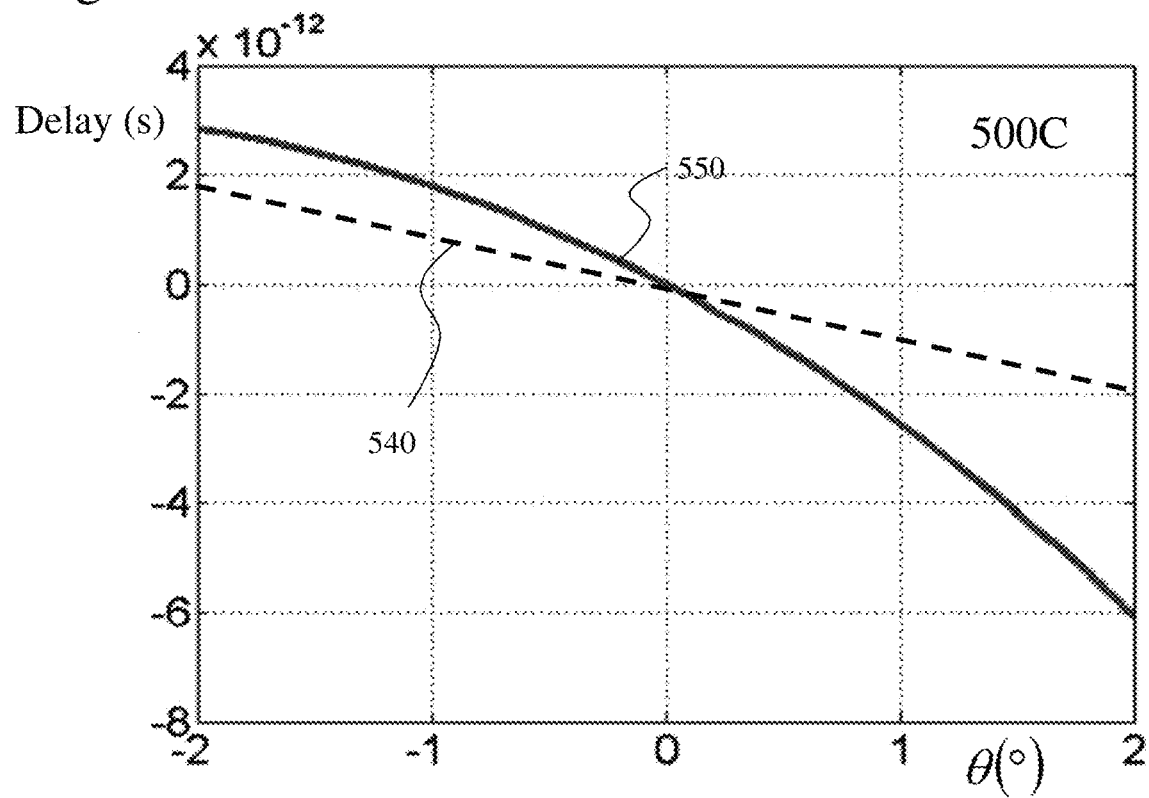

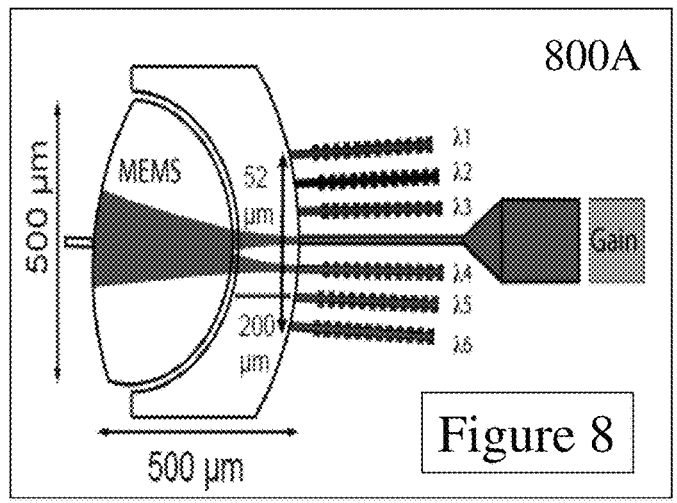
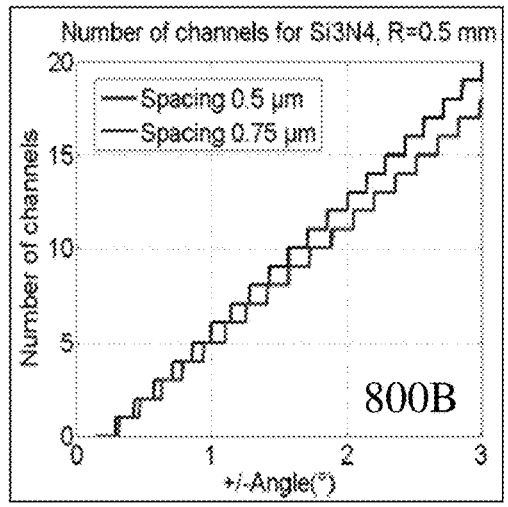
Figure 8
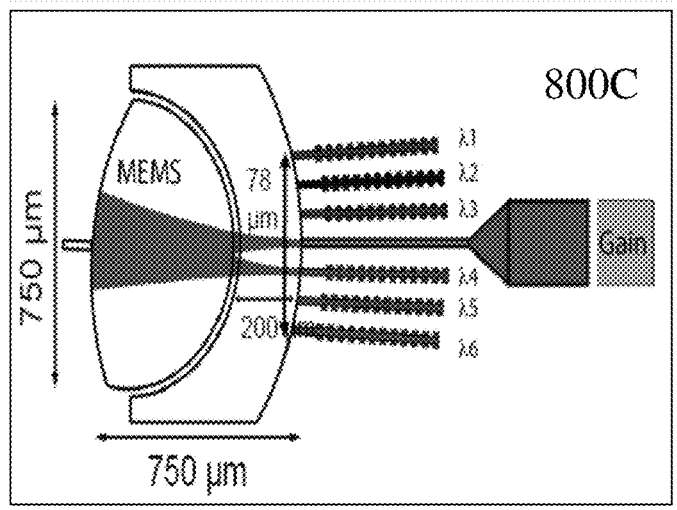
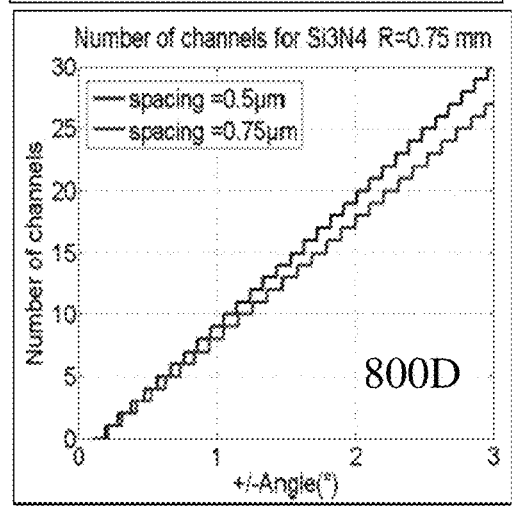
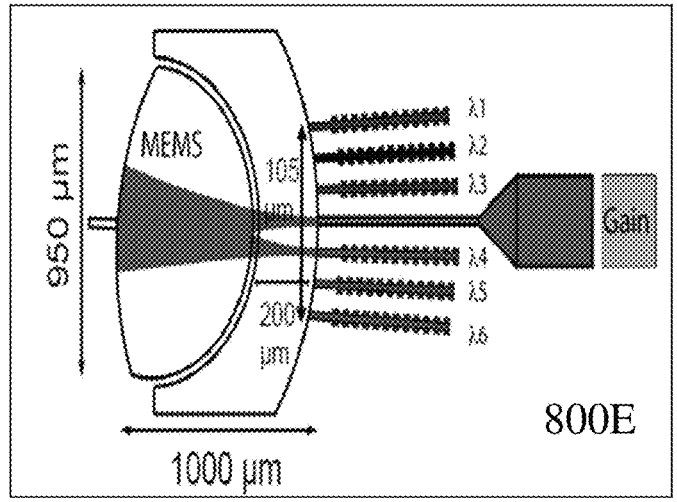
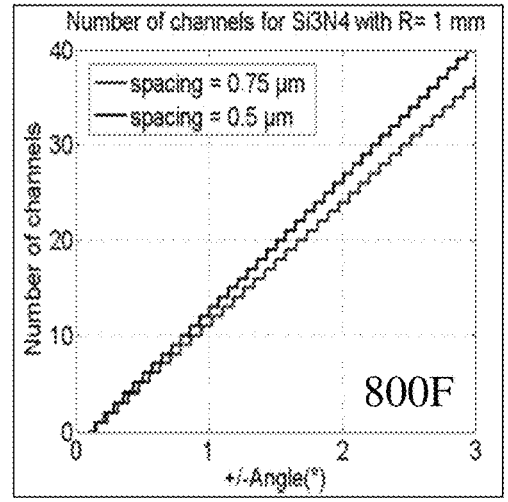

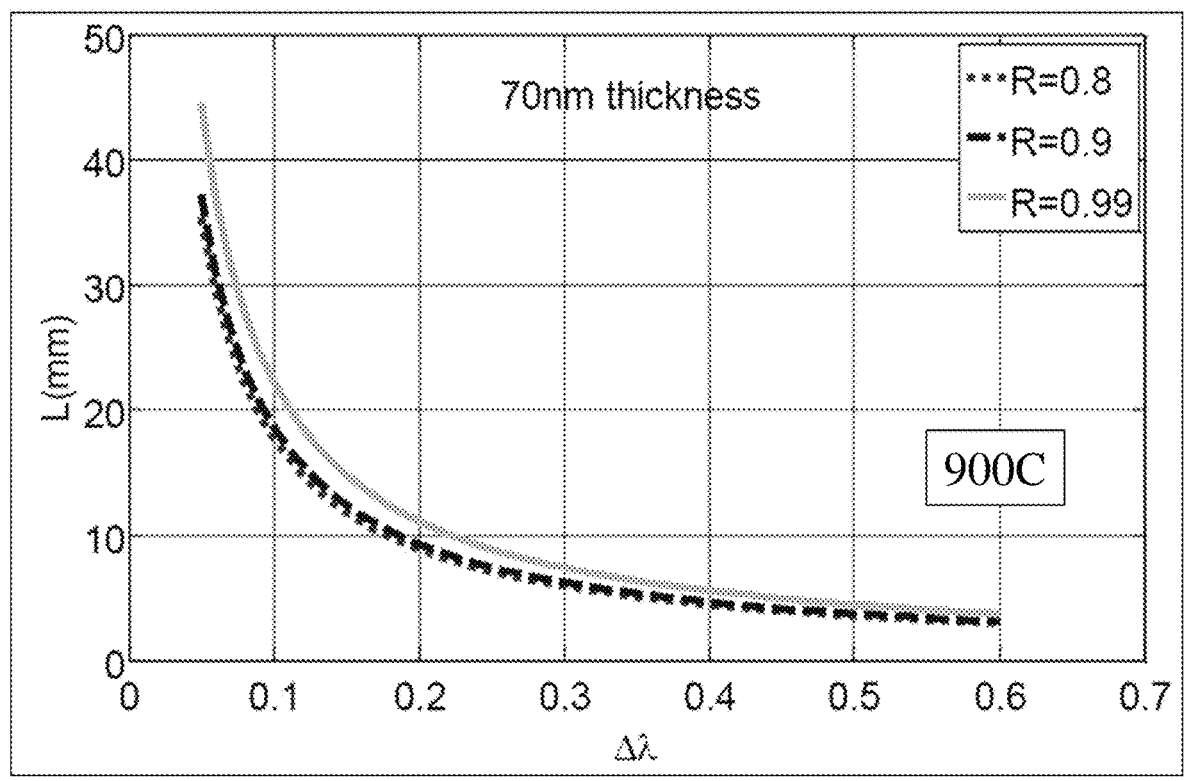
Figure 9B
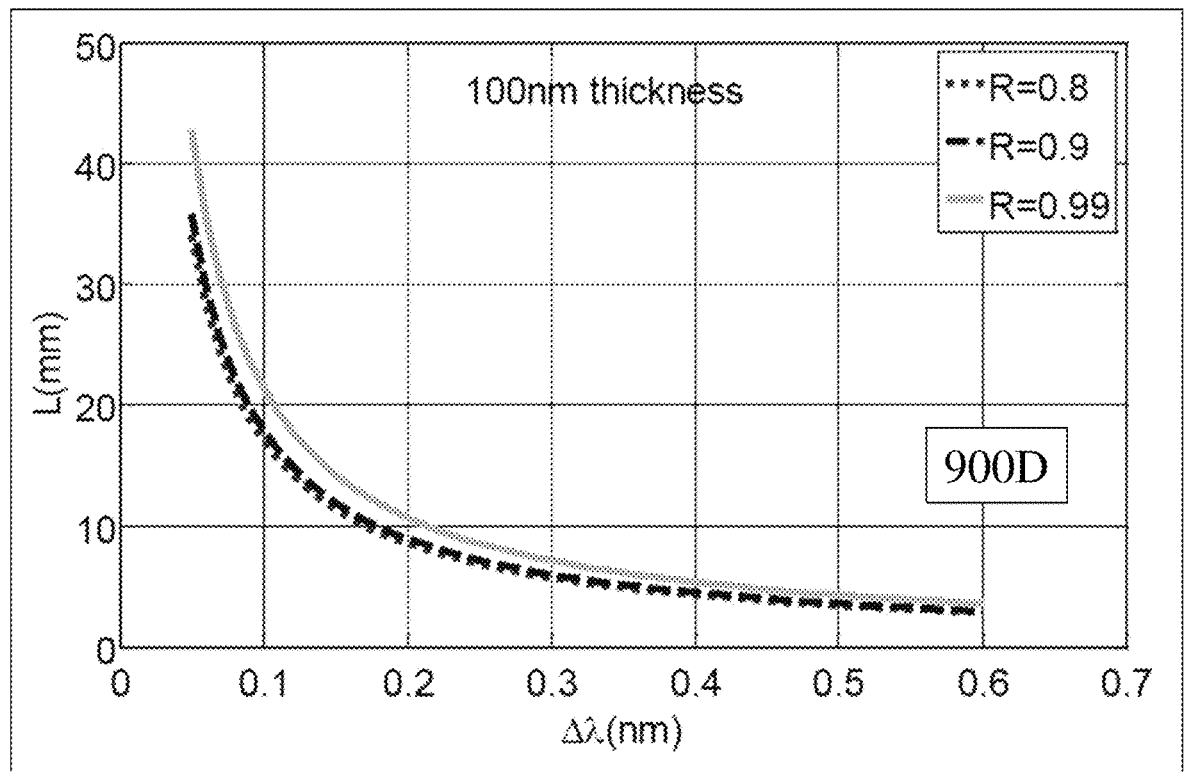

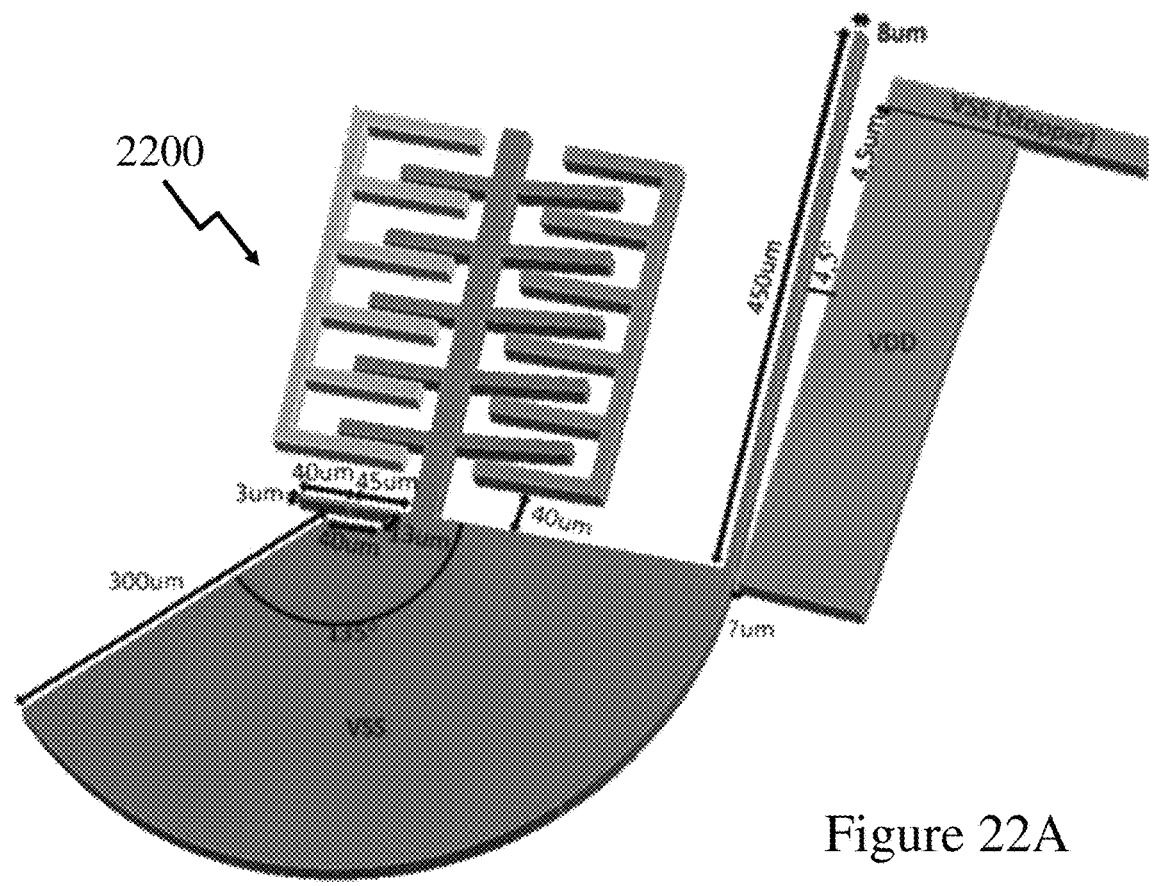
Figure 22A
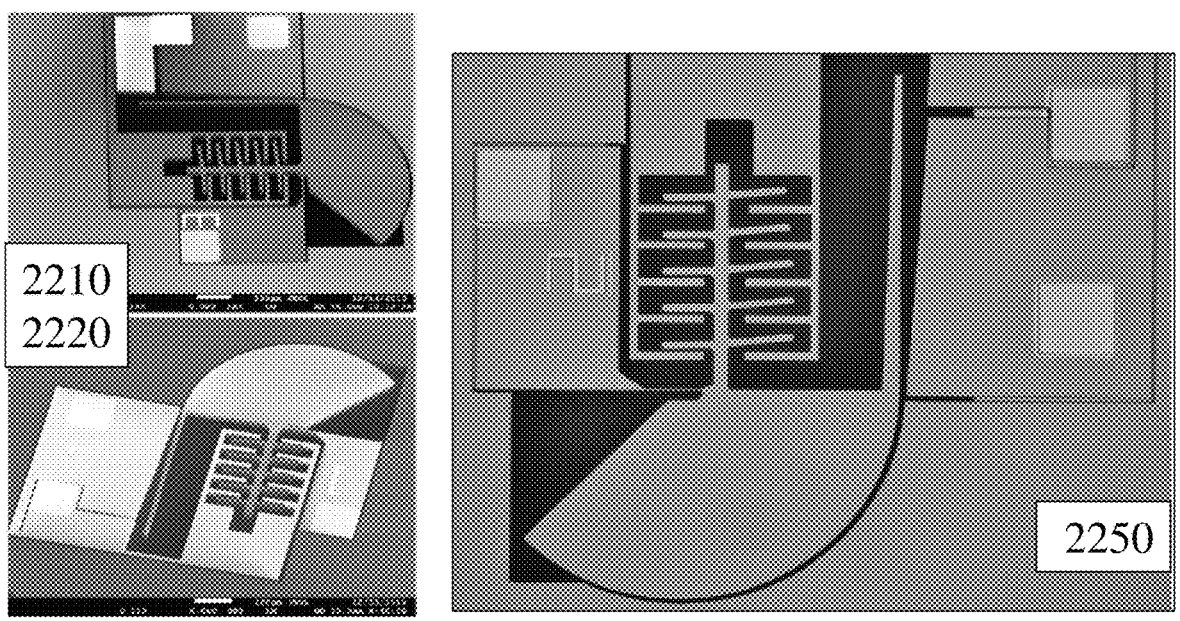

2500

2900A

2900B

MIRROR BASED MICROELECTROMECHANICAL SYSTEMS AND METHODS

CROSS-REFERENCE TO RELATED APPLICATIONS

This application claims the benefit as a continuation of U.S. patent application Ser. No. 15/124,259 filed on Sep. 7, 2016, which itself claims the benefit of priority as a 371 National Phase Application of PCT/CA2015/000136 filed Mar. 9, 2015, which itself claims the benefit of U.S. Provisional Patent Application 61/949,474 filed Mar. 7, 2014, the entire contents of all being incorporated herein by reference.

FIELD OF THE INVENTION

This invention relates to microelectromechanical systems and more particular to designs and enhancements for MEMS mirrors and optical components exploiting such MEMS mirror elements.

BACKGROUND OF THE INVENTION

Wavelength division multiplexing (WDM) has enabled telecommunication service providers to fully exploit the transmission capacity of optical fibers in their core network. State of the art systems in long-haul networks now have aggregated capacities of terabits per second. Moreover, by providing multiple independent multi-gigabit channels, WDM technologies offer service providers with a straight forward way to build networks and expand networks to support multiple clients with different requirements. At the same time these technologies have evolved down through the local area networks to the subscriber access networks and into data centers to support the continuing inexorable demand for data. In order to reduce costs, enhance network flexibility, reduce spares, and provide reconfigurability many service providers have migrated away from fixed wavelength transmitters, receivers, and transceivers, to wavelength tunable transmitters, receivers, and transceivers as well as wavelength dependent add-drop multiplexer, space switches etc.

At the same time, improvements in imaging technology have had a great impact on modern medicine. Imaging is a powerful tool that allows non-invasive diagnostics, helps to plan and direct surgical interventions, and facilitates treatment monitoring. One emerging imaging techniques is Optical Coherence Tomography (OCT), which can provide high-resolution 3D images. This technique is a non-invasive and non-contact technology. In the last decade, optical coherence tomography has found applications in several medical fields, including ophthalmology, dermatology, cardiology, dentistry, neurology, and gastroenterology.

At first sight, the provisioning of wavelength tunable transmitters, receivers, and transceivers for optical telecommunications may seem to have little in common with medical imaging systems operating at video frame rates with cycling speed rates of over 1 kHz and delay ranges of more than 3.33 ps to support millimeter depth penetration using OCT. However, in both applications the requirements for smaller footprint, improved performance, and reduced cost have led to the adoption of monolithic optical circuit technologies, hybrid optoelectronic integration, and exploitation of technologies such as microelectromechanical systems (MEMS).

A common MEMS element to both is a MEMS mirror capable of deflection under electronic control. However, unlike most MEMS device configurations where the MEMS is used to simply switch between two positions in these devices the state of MEMS is important in all transition positions. Additionally, in the optical system designs described according to embodiments of the invention the MEMS mirror rotates in-plane. The characteristics of the MEMS determines the characteristics of the whole optical delay line system and by that the OCT system in one and in the other the number of wavelength channels and the dynamic wavelength switching capabilities in the other. The role of the MEMS is essential and it is responsible for altering the paths of the different wavelengths in either device.

Accordingly, it would be beneficial to improve the performance of such MEMS and thereby the performance of the optical components and optical systems they form part of. Beneficially, the inventors have established a range of improvements to the design and implementation of such MEMS mirrors as well as optical waveguide technologies supporting the extension of these device concepts in the mid-infrared for optical spectroscopy for example.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microelectromechanical systems and more particular to designs and enhancements for MEMS mirrors and optical components exploiting such MEMS mirror elements.

In accordance with an embodiment of the invention there is provided a device comprising a microelectromechanical element, the microelectromechanical element having at least a front surface and a back surface, and an optical circuit disposed adjacent to the microelectromechanical element having a coupling surface having a profile matching the front surface.

In accordance with an embodiment of the invention there is provided a device comprising:
a microelectromechanical element, the microelectromechanical element having at least a front surface and a back surface;
an optical circuit disposed adjacent to the microelectromechanical element having a coupling surface having a profile matching the front surface; and
a linear microelectromechanical actuator coupled to the microelectromechanical element.

In accordance with an embodiment of the invention there is provided a device comprising:
a microelectromechanical element, the microelectromechanical element having at least a front surface and a back surface and comprising a predetermined portion formed from a predetermined ceramic material; and
an optical circuit disposed adjacent to the microelectromechanical element having a coupling surface having a profile matching the front surface, the optical circuit comprising a waveguide having a core formed from the predetermined ceramic material.

In accordance with an embodiment of the invention there is provided a device comprising:

a microelectromechanical element comprising a predetermined portion of a microelectromechanical device having a pivot point and performing rotation around the pivot point under actuation; and an anchor spring attached to a predetermined portion of the microelectromechanical element, wherein the anchor spring engages against a predetermined portion of the microelectromechanical device once the microelectromechanical element has rotated a predetermined angle.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 depicts fixed and tunable semiconductor optical sources according to the prior art together with a tunable semiconductor optical source according to an embodiment of the invention;

FIG. 5 depicts the tunable delay line performance for the tunable optical delay line components and their designs according to the embodiments of the invention;

FIG. 8 depicts schematics for silicon nitride core waveguide based circuits according to embodiments of the invention and their resulting optical channel counts with varying maximum rotation angle of the MEMS mirror;

FIG. 9B depicts Bragg grating length versus grating bandwidth for silicon nitride core waveguides;

FIG. 22A depicts a SC-MEMSM and actuator according to an embodiment of the invention;

FIG. 35 depicts design variants of an anchor spring according to embodiments of the invention to reduce MEMS pull-in.

DETAILED DESCRIPTION

Figure 2:
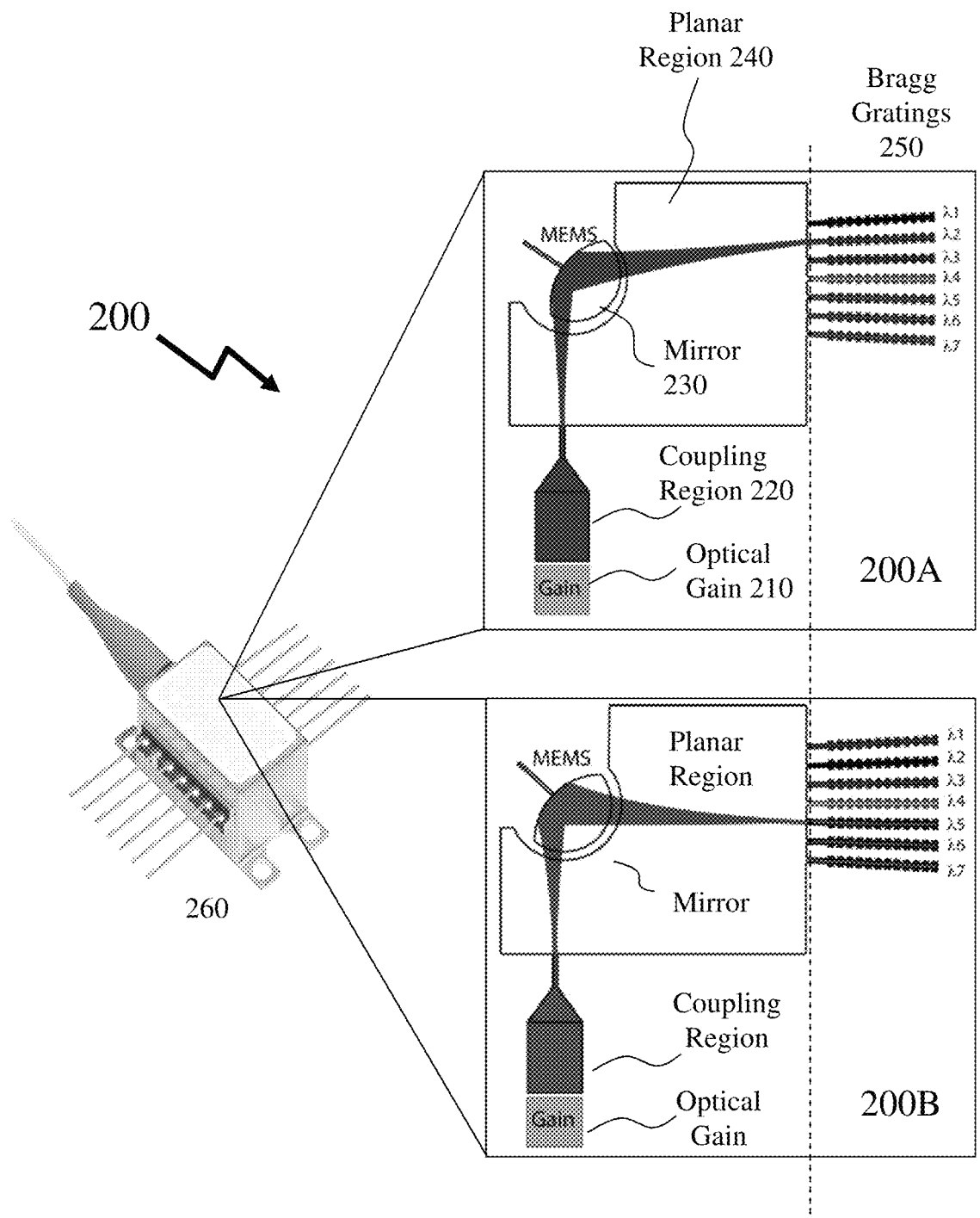
FIG. 2 depicts a tunable semiconductor optical source according to an embodiment of the invention.

The present invention is directed to microelectromechanical systems and more particular to designs and enhancements for MEMS mirrors and optical components exploiting such MEMS mirror elements.

The ensuing description provides exemplary embodiment (s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

1. APPLICATIONS

1A: Wavelength Tunable Optical Source

As noted supra wavelength tunable optical sources and/or receivers have significant benefit in the provisioning of transmitters, receivers, and transceivers within todays optical communication networks and evolving requirements for optical networks with dynamic wavelength allocation, reduced installation complexity, single line card designs, and reconfigurability. Within the prior art several approaches have been employed to date and whilst these have demonstrated high performance transmitters they suffer limitations such as assembly complexity, achievable performance, and cost. Two such prior art approaches are depicted in second and third images 100B and 100C respectively in comparison to a standard fixed wavelength laser source in first image 100A.

In first image 100A a fixed wavelength laser source is depicted in a dual-in line (DIL) package configuration 115 and comprises monitor photodiode (not identified for clarity) and laser diode die 111 mounted upon a chip carrier 112 which comprises a thermistor (not identified for clarity) for monitoring the temperature as the laser diode die 111 has a fast wavelength versus temperature profile. The output of the laser diode die 111 is coupled via an optical lens—optical isolator assembly 113 such that is focused at a location 113 wherein the optical fiber within a ferrule assembly 114, for example, is positioned and assembled to couple the optical signal to the network via optical fiber pigtail 116. The laser diode die 111 may, for example, be a distributed feedback (DFB) laser, a distributed Bragg reflector (DBR) laser or a monolithic externally modulated DFB laser.

Accordingly, in second image 100B a wavelength settable transmitter assembly prior to optical fiber pigtailing and sealing is depicted. As shown the assembly comprises a laser array 121, MEMS switch array 122, monitor photodiode 123 and wavelength locker 124. The wavelength locker 124 provides a means of locking the laser array 121 to a predetermined grid, such as 100 GHz C-band grid of long-haul telecommunications around 1550 nm. Accordingly, the laser array 121 comprises an array of optical sources monolithically integrated into the same semiconductor die, e.g. 40 DFB lasers. The provisioning of the selected wavelength for the transmitter is determined by the provisioning of electrical drive current to the appropriate DFB laser within the laser array 121 and the switching of the appropriate MEMS switch element within the MEMS switch array 122. As such the approach is costly in that not only must a monolithic indium phosphide (InP) M-channel DFB laser array be implemented but also an array of M MEMS switches. Accordingly, in some instances the free-space optical interconnect from the laser array 121 to optical fiber (not depicted for clarity) is replaced by a wavelength division multiplexer, such as an array waveguide grating (AWG) on the same die as the laser array 121.

Third image 100C depicts an alternate wavelength tunable transmitter exploiting a an external cavity laser (ECL) configuration wherein rather than the laser diode die having two high reflectivity facets to support the required cavity oscillation to provide gain within the semiconductor device the laser diode die has one or no high reflectivity facets and forms a resonant optical cavity with one or two external mirrors. In this instance a single external mirror 131 is employed in conjunction with a semiconductor optical amplifier (SOA) die 132 that has a high reflectivity facet towards the optical fiber pigtail 135 and a low reflectivity facet towards the external mirror 131. The resultant laser output is coupled from the SOA die 132 to the optical fiber pigtail 135 via isolator 133 and lens 134. In this instance the external mirror 132 is a tunable Fabry-Perot cavity filter 131 that provides for wavelength dependent reflectivity such that the output of the assembly is wavelength specific according to the settings of the tunable Fabry-Perot cavity filter 131 allowing the emission wavelength to be adjusted. However, the characteristics of the source are now defined by the quality of the Fabry-Perot cavity filter, which even when implemented using a MEMS construction does not achieve the sidelobe rejection of the DFB approaches.

Accordingly, it would beneficial to provide a tunable wavelength transmitter which can be fabricated at reduced cost commensurate with the pricing expectations of telecom system providers and telecom original equipment manufacturers (OEMs) for high volume generalized deployment within optical access networks, local area network, and data centers for example. Accordingly, the inventors have established a hybrid circuit implementation exploiting an ECL configuration utilizing an InGaAsP SOA, for 1310 nm or 1550 nm wavelength ranges, in conjunction with a silicon MEMS wavelength selective reflector (MEMS-WSR). As depicted in fourth image 100D the approach exploits a silicon based MEMS-WSR which comprises a coupling region 144 for coupling between the SOA 145, a tunable MEMS mirror 141, and an array of Bragg reflectors 143. The optical signals are coupled between the coupling region 144 and the array of Bragg reflectors 143 by a planar waveguide region 142 wherein the diverging optical signals from the Bragg reflector 143 are re-focussed by the tunable MEMS mirror 141. Accordingly, as depicted in first and second schematics 150A and 150B the wavelength operation of the ECL is therefore controlled by the routing selection of the mirror 141 to a selected Bragg grating within the array of Bragg reflectors 143.

Referring to FIG. 2 an alternate configuration 200 for an ECL 260 exploiting silicon photonics and MEMS is depicted in first and second schematics 200A and 200B respectively. Accordingly, an optical gain element 210 is coupled via a coupling region 220 to planar waveguide region 240. The diverging optical signal from the optical gain element 210 is coupled to a selected Bragg grating within an array of Bragg reflectors 250 via the planar waveguide region 240 and MEMS mirror 230 wherein the design of the MEMS mirror 230 is such that the optical signal is coupled and re-focussed to the plane of the waveguides forming part of the Bragg gratings within the array of Bragg reflectors 250.

It would be evident that in addition to wavelength tunable transmitters the approach of a MEMS mirror in conjunction with an array of Bragg reflectors may also form part of wavelength tunable receivers, reconfigurable optical add—drop multiplexers (ROADMs), wavelength selective optical switches, and other wavelength selective structures, for example.

1B: Integrated Continually Tunable Optical Delay Line

As outlined supra one of the Optical Coherence Tomography approaches is TD-OCT where a reference light signal is scanned with a variable delay and then compared with the light reflected back from the sample to measure the time of flight. A schematic representation of a basic TD-OCT system is presented in FIG. 3 in schematic 300A. As depicted the optical output of a broadband source 305 is coupled via circulator 310 to a passive splitter 315 wherein it is split in two: the first part is used as a reference and propagates to a variable delay line 325 which is controlled via a driver 330; whilst the other part is used to scan the sample 320. The light reflected from the sample is combined with the reference and the resulting interference is captured with a photodetector 335. The resulting photodetector 335 output is coupled via a de-modulator 340 to a controller 345. The interference pattern generated at the photodetector 335 is used to generate an image along the depth of the sample 320. The variable delay line 325 is an essential component in TD-OCT systems as it defines the maximum speed and depth of the scans.

The new optical delay line system is a miniature and new designed version of the bulk Fourier domain optical delay line system as known within the prior art, see for example Rollins et al. in "In Vivo Video Rate Optical Coherence Tomography" (Optics Express, Vol. 3, No. 6, 21914). Within an embodiment of the invention an optical signal from integrated optical waveguide is projected directly onto the active surface of a MEMS mirror. The system is designed, according to an embodiment of the invention, to be implemented on a silicon-on-insulator (SiO2) substrate because it is a widely available and mature and flexible technology and it is easier to merge with MEMS fabrication processes.

However, unlike the majority of MEMS configurations where the MEMS device is used as switch between two positions in this device the state of the MEMS is important in all transition positions. The characteristics of the MEMS thereby determine to a large degree the characteristics of the whole optical delay line system and by that the OCT system. The role of the MEMS is to alter the paths of the different wavelengths in order to generate a new path difference between the wavelengths thereby creating the delay time. The inventors have exploited two different MEMS and the characteristics of each one are presented in schematic 300D in FIG. 3B which shows a schematic representation of the integrated opto-electromechanical system. The entire system fits in an area of 12 mm by 8 mm. The light from the broadband source is coupled to the planar waveguide 350B that forms the delay line with a ridge waveguide 350A. The beam then propagates into the planar waveguide 350B where in it reflects off all the gratings and mirrors encountered.

Figure 3A:
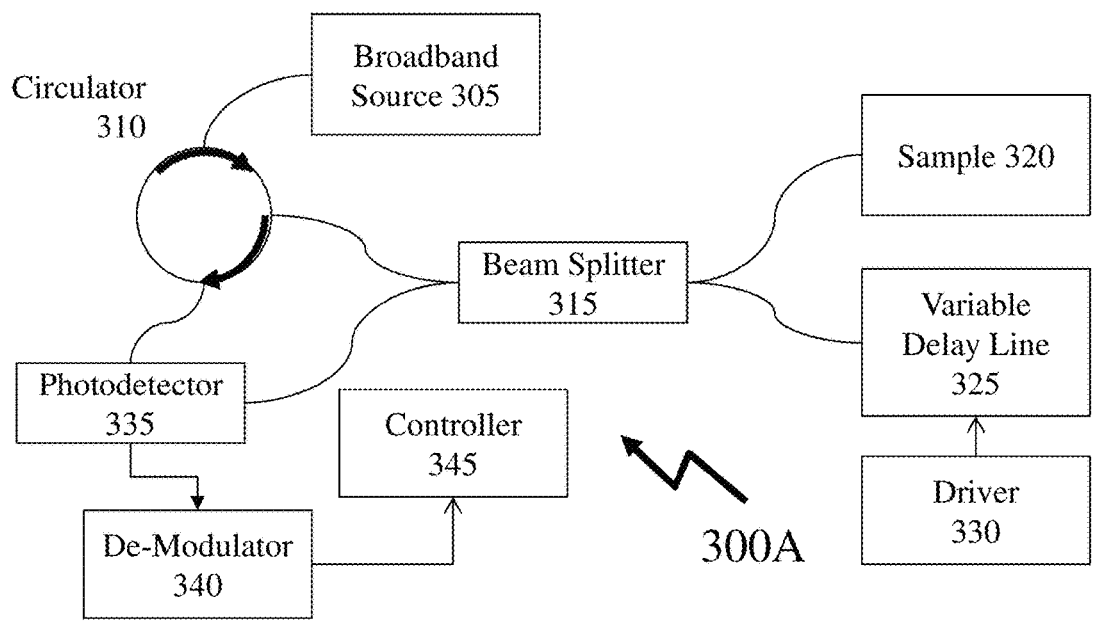
FIG. 3A depicts an optical coherence tomography (OCT) system together with the design and performance of a polarization independent reflecting coating for a silicon MEMS according to an embodiment of the invention.
Figure 3A:
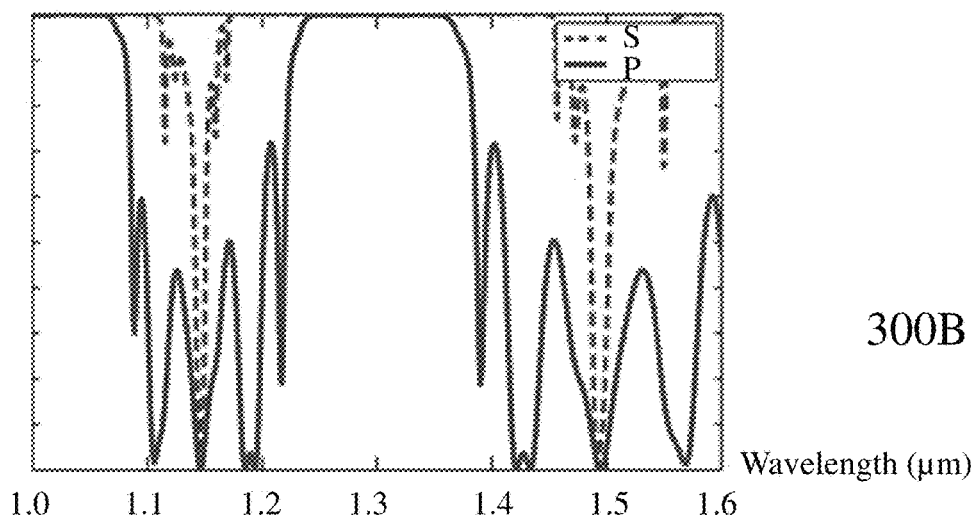
Figure 3A:
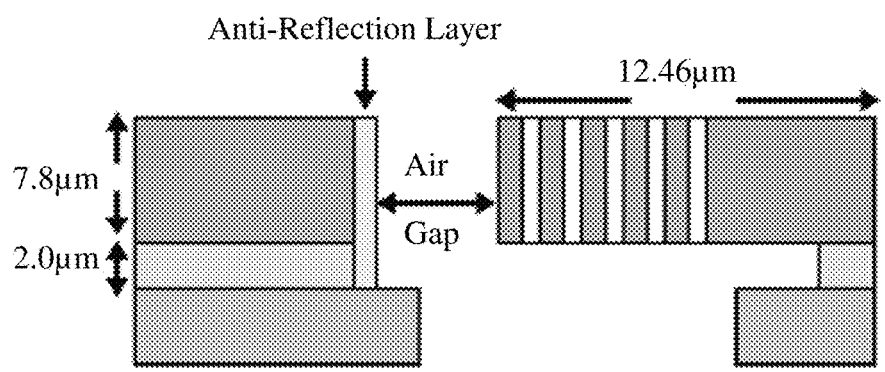
Figure 3B:
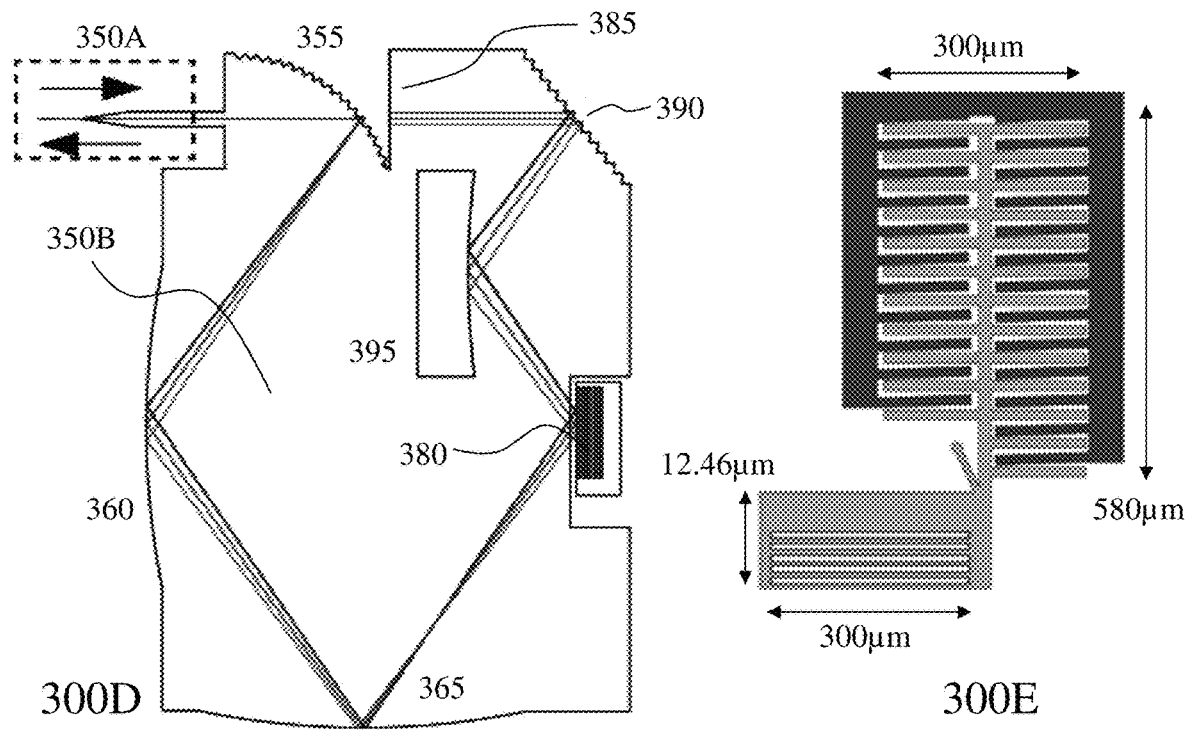
FIG. 3B depicts a tunable optical delay line for an OCT system exploiting a MEMS mirror according to an embodiment of the invention and its performance.
Figure 3B:
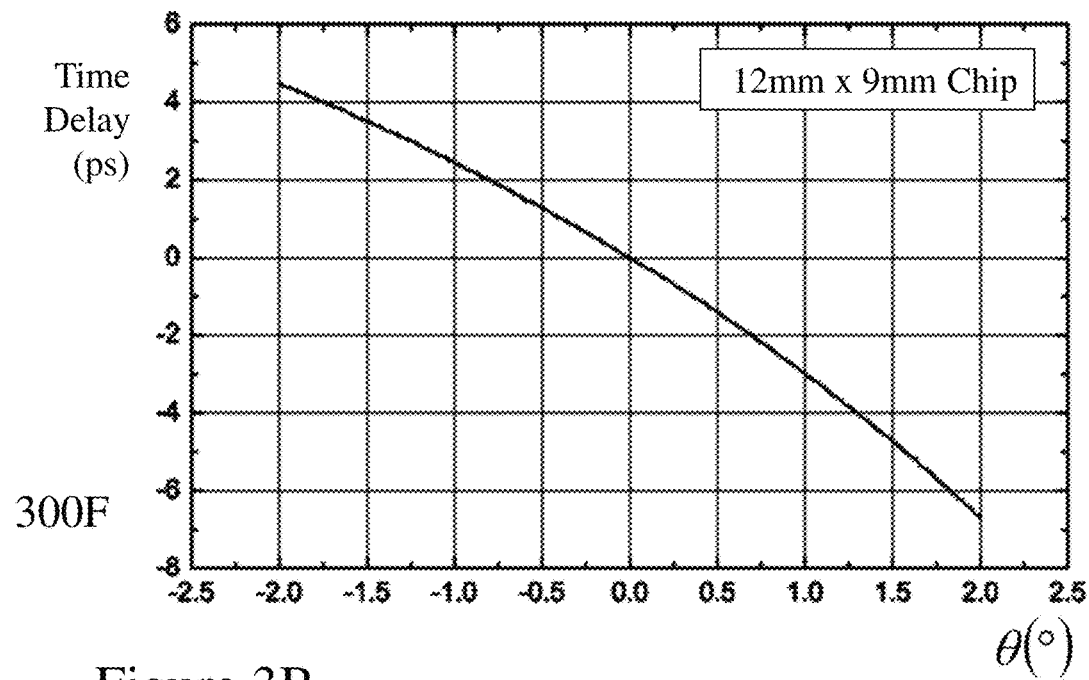

First and second echelle gratings 355 and 390 respectively provide the required wavelength dispersion such that the incident optical signal to the device is split into several paths according to wavelength, as shown by the different lines in FIG. 3B. Within an embodiment of the invention the order number, in this case p=1.15 µm and m=1, and α=38 and β=16 are the incidence and reflection angles, respectively. The first to third mirrors 360, 365, and 395 respectively are used to enlarge the path difference taken by the different wavelengths, that path difference between different wavelengths generates the time delay. The first to third mirrors 360, 365, and 395 respectively are curved to allow the refocusing of the optical signals, and to prevent the beams from leaving the system even with different tilt angles of the MEMS. The fourth mirror 385 is perpendicular to the incident optical signals to retro-reflect them such that they re-traverse the optical path back to the ridge waveguide 350A. All these reflecting surfaces, first to fourth mirrors 360, 365, 395, and 385 are obtained by a simple etch step of the planar waveguide. The other reflecting element is the MEMS 380 which provides for tunability of the delay induced by the device. Assuming that the refractive index of silicon is 3.47 and the incidence angles on all reflecting surfaces are larger than the critical angle of 16.75°, the conditions for total internal reflections at these surfaces are fulfilled. Therefore, metallization of the reflecting surfaces is not needed for first to third mirrors 360, 365, and 395 thereby simplifying the fabrication process.

Moreover, to avoid losses from clipping the optical signal by having reflecting surfaces smaller than the optical beam, all optical surfaces in the device were designed to be at least 3 times larger than the incident beam radius, which is defined as where the power is reduced to $1/e^2$ from the peak. This ensures that the system has negligible clipping losses. The MEMS Bragg mirror 380 within an embodiment of the invention consists of 5 and ½ pairs of silicon/air interfaces, with a 7.8 µm thickness, 300 µm long, and 12.46 µm wide as depicted in side view 300C in FIG. 3A of the planar waveguide 350B and the MEMS mirror 380 is presented. The MEMS Bragg mirror 380 is released from the substrate by removing a 2 µm thick $SiO_2$ layer under the MEMS Bragg mirror 380, leaving a fixed anchor that is connected to an immovable part of the substrate. Graph 300D in FIG. 3A shows a simulation the reflection of S and P polarization on the MEMS Bragg mirror 380; the MEMS Bragg mirror 380 was optimized for the appropriate incidence angle in this case of 54°. MEMS schematic 300E in FIG. 3B depicts a top view of the MEMS Bragg mirror 380 and its comb drive with the anchor as the center of the rotation. The largest losses within the device are sustained at the air gap between the MEMS Bragg mirror 380 and the planar waveguide 350B due to the near field diffraction from the optical waveguide into free space. In the embodiments of the invention implemented by the inventors due to the thickness of the planar waveguide 350B the optical mode, is relatively large, 7.8 µm, and the air gap is small. The air gap is dependent upon the MEMS angle and varies between approximately 1 µm to approximately 23 µm. Moreover, reflection at the planar waveguide surface at this interface is suppressed with parylene antireflection coatings, the impact of this diffraction is minimal. For the fundamental mode, the coupling between the reflected beam and the planar waveguide is always exceeding 83%.

Now referring to second schematic 400C the design outlined here is essentially the same as that depicted in schematic 300D in FIG. 3B except that MEMS Bragg mirror 380 has been replaced by semi-circular MEMS mirror (SC-MEMSM) 480B. SC-MEMSM schematic 400A in FIG. 4 depicts a top view of the SC-MEMSM 480B and its deformation as grayscale shading while in rotation. The SC-MEMSM anchor and its comb drive are not shown for clarity. The SC-MEMSM has a half disk shape with thickness 7.8 µm and 300 µm radius which is released from the substrate by removing a 2 µm thick $SiO_2$ layer under the half disk, leaving a fixed anchor that is connected to an immovable part of the substrate.

This mirror shape keeps the air gap distance between the mirror and the planar waveguide fixed during the rotation of the MEMS mirror, thus keeping optical losses low and constant. This is important in order for the losses to be as uniform as possible for all delay set points. The largest losses are sustained at the air gap because of the near field diffraction from the optical waveguide into free space. In this system, because the thickness of the waveguide and hence the optical mode, is relatively large 7.8 µm, and the air gap is kept small in comparison with the optical mode, the impact of this diffraction is minimal. For the fundamental mode and a 0.98 µm air gap, the coupling between the diffracted beam and the planar waveguide is approximately 99%. Moreover, reflections are suppressed through the use of parylene antireflection coatings and by making the length of the air gap an odd multiple of one quarter of the broadband source central wavelength. This minimizes unwanted reflections through destructive interference.

Due to the architecture of the optical delay line circuit, second schematic 400C, actuation of the SC-MEMSM is required in only one angular direction, thus simplifying the actuator required, and reducing its impact on the resonant frequency on the SC-MEMSM. In addition, the comb drive has angled stator fingers, in order to ensure that the comb can sufficiently rotate without its movable fingers colliding with the stator fingers. The SC-MEMSM must provide a rotational displacement θ, e.g. 2° degrees. The required vertical displacement, d, of the comb drive is geometrically defined by Equation (1)

$$d = A_M \tan(\theta) \quad (1)$$

$A_M$ is the distance between the comb drive attachment and the mirror center point, and θ is the rotational angle.

Optimal dimensions and placement for the comb drive were derived from analysis and simulation. Notably, fixing the maximal rotation to be 2°, end attaching the comb drive at 17 µm from the mirror center point the required vertical displacement of the comb drive is calculated to be less than 0.6 µm. This displacement is achieved with a minimum comb gap of 1.8 µm and 24 150 µm-long by 17 µm-wide comb fingers.

Graph 300F in FIG. 3B depicts a plot of the induced optical delay versus rotation angle, where the time delay for an angle of 0° is taken as the reference. The calculations are given for rotation angles varying from $-2° \leq \theta \leq 2°$, which were achieved with the implemented SC-MEMSM devices using the fabrication processes and designs implemented. The time delay difference achievable, $-6.9 \text{ ps} \leq \tau \leq 4.2 \text{ ps}$ enables a total time delay range larger than 10 ps. The OCT time delay devices depicted in schematics 300D in FIG. 3B and 400C in FIG. 4A whilst providing monolithic optical time delay lines for TD-OCT systems have two issues, the fabrication process and the linearity of delay with angle. Considering the former then the mirrors used in this design have cylindrical shape with a radius of curvature of 14 mm. If we consider that, the optical beam has a beam-waist of approximately 50 µm, then the depth of the curved mirror is about 22 nm. This has a significant impact on the fabrication process due to the limitations imposed by micro-fabrication technique on the achievable resolution of the mirror surface. This order of resolution is not possible to implement with most of the lower cost and/or low complexity manufacturing techniques. A change in the design and thus in the size of the curved mirror is important therefore in considering a successful large-scale production of the optical delay line system.

The latter problem is the curvature to the delay, which is attributed to small group velocity dispersion (second order dispersion) within the optical circuit. In high performance OCT systems where second order dispersion could limit the resolution, this effect could be mitigated with a more complex echelle grating design, in which the grating period is varied. In order to address these two issues the inventors established new device designs and their respective time delay profiles calculated.

Figure 4A:
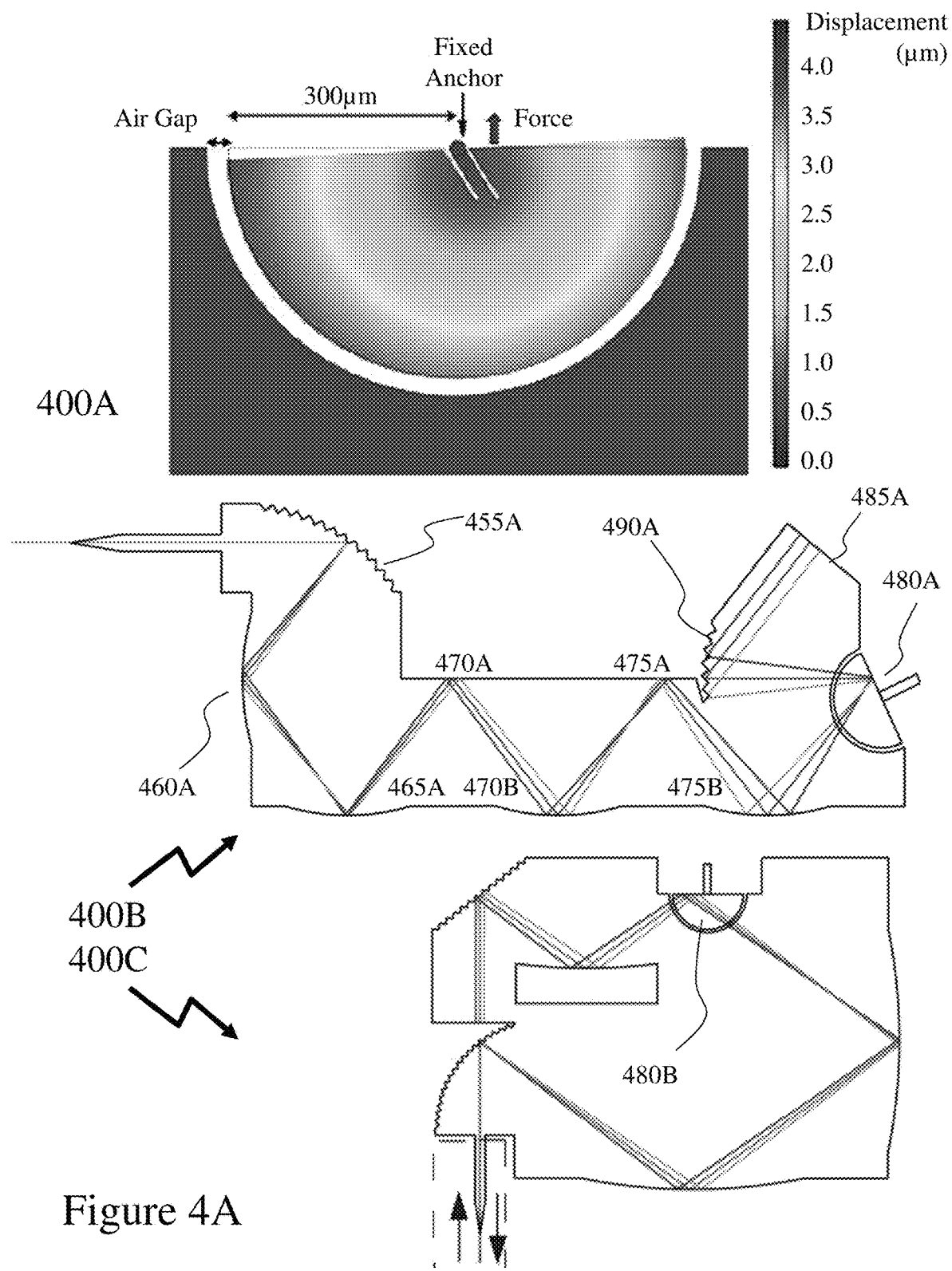
FIG. 4A depicts a MEMS mirror and tunable optical delay line components according to embodiments of the invention.

Within these designs the calculation were made for a grating period of 5 µm, in silicon 1.44 µm, and the third grating order. The use of higher order dispersion is beneficial because it generates a larger dispersion angle, which affects positively the total path difference and thus allows the creation of longer delay difference. First schematic 400B in FIG. 4A shows the representation of a first design of the second generation time delay circuits. The entrance and the exit of the broadband light are the same as used in the previous design except the fact; the angle of incidence is adjusted so that the reflected light of the central wavelength is normal to the gratings. The system consists of 10 reflective surfaces. Two of these are first and second gratings 455A and 490A respectively. In this case the angle of incidence of the first grating 455A is chosen in a way that the reflected is normal to the surface of the grating whereas the angle of incidence on the second grating 490A is normal to the grating. The reason for this being to insure the symmetrical dispersion on both sides of the central wavelength.

First to fourth curved mirrors 460A, 465A, 470B and 475B act as the lenses of a bulk optical system and re-collimate the light inside the system. First to third flat mirrors 470A, 475A, and 485A provide folding of the structure for smaller footprint. The SC-MEMSM 480A comprises the final reflective mirror and is placed such that at this surface the optical beam has been re-focussed/re-collimated to occupy a small beam size, in this case not more than 200 µm. The radius of the curved mirrors is the same for first to fourth curved mirrors 460A, 465A, 470B and 475B. In fact the radius of these mirrors determines how large the system will be and the distance between the reflective mirrors defines the difference in the path and hence the delay. As examples two different setup are given and the delay time calculated for two different radius of curvature of the mirrors.

Figure 4B:
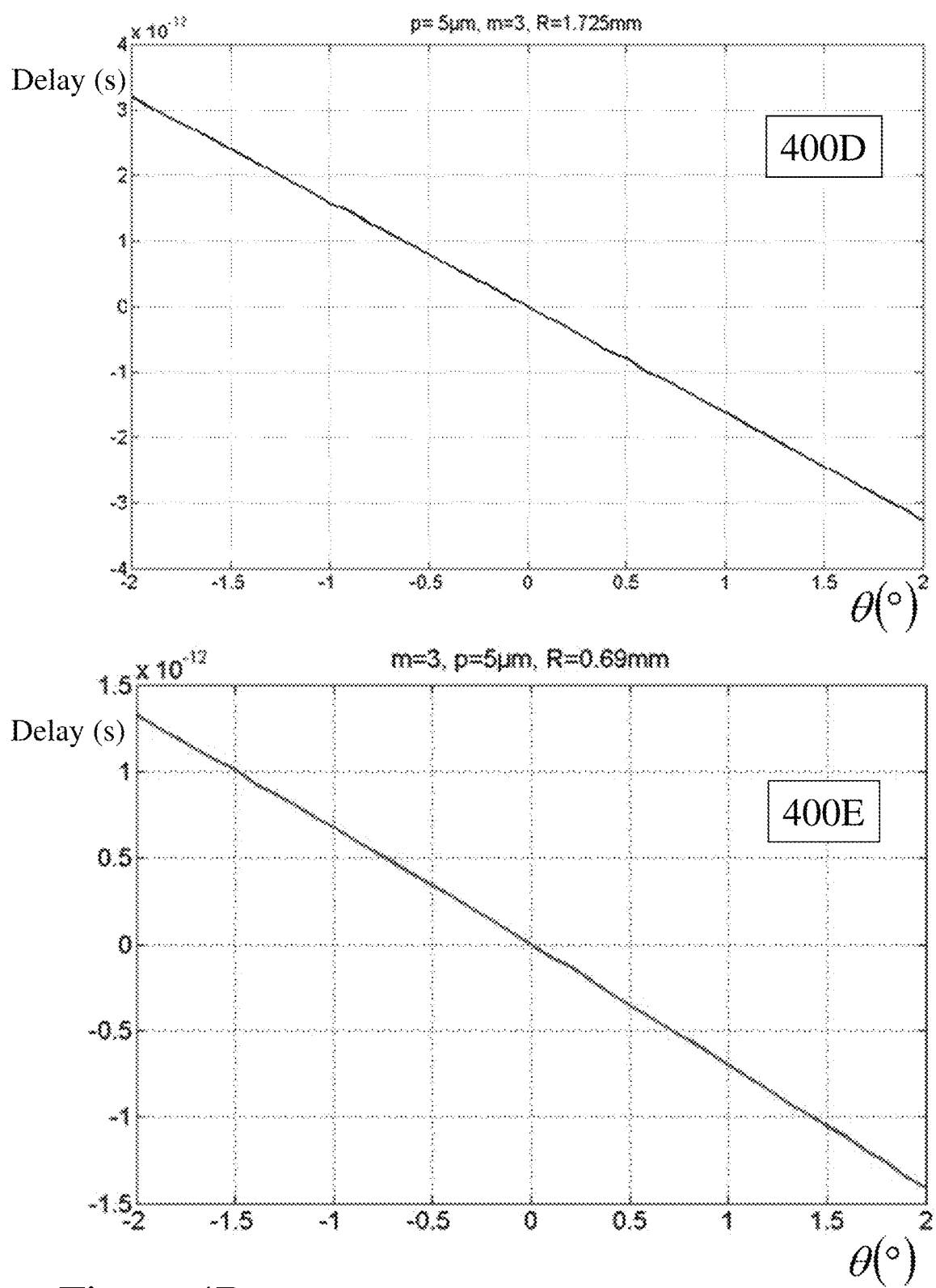
FIG. 4B depicts the tunable delay line performance for the tunable optical delay line components according to the embodiments of the invention depicted in FIG. 4A.

First graph 400D in FIG. 4B the plot of the delay versus rotation angle with the time delay for an angle of 0° taken as the reference for a mirror curvature radius R=1.725 mm and the first grating with curvature radius R=1.5 mm. These relatively small radiuses enable the use of large-scale fabrication technique commonly used in fabrication processes for silicon MEMS devices. If we consider a beam radius of 50 µm, the depth of the mirror necessary to cover this surface is 724 nm. This value is large enough to be considered for micro-fabrication. For rotation angles $-2° \leq \theta \leq 2°$, the time delay difference varies from $-3.15 \text{ ps} \leq \tau \leq 3.15 \text{ ps}$. This design allows 6.3 ps delay difference. The dependence of the delay on the rotation angle is highly linear, this linearity means that the second order dispersion (group velocity dispersion) has been reduced. The second radius size is R=0.69 mm this produces a mirror depth of 1824 nm for a beam radius of 50 µm. This value is even larger than the one from the last design and even fabrication techniques with lower resolution can be also considered. Second graph 400E in FIG. 4B depicts the delay versus rotation angle is plotted. The calculations reveal that for a rotation angles varying from $-2° \leq \theta \leq 2°$. The time delay difference varies from $-1.4 \text{ ps} \leq \tau \leq 1.4 \text{ ps}$ and hence a total delay time of 2.8 ps is obtained.

Subsequently additional design changes were made to yield a third generation optical time delay device, depicted in first schematic 500A in FIG. 5. One such design change to facilitate the fabrication process is the position of the second grating 520. The entrance and the exit were carefully chosen at 0.5 mm from the first grating 510. The curved mirrors have a 0.966 mm radius of curvature and the incidence on the second grating 520 is again adjusted so that the reflected light is normal to grating. The SC-MEMSM again has at this surface the light re-collimated to occupy a very small surface. First curve 540 in graph 500C in FIG. 5 shows the plot of the optical delay versus the rotation angle. Now for rotation angles varying from $-2° \le \theta \le 2°$ the time delay difference varies from $-1.8$ ps$\le \tau \le 1.8$ ps for a total delay time of 3.6 ps Another design option is to implement an asymmetric design such as depicted in second schematic 500B in FIG. 5 where the aim is to generate a maximum time delay difference, however this can generate a second order dispersion. As evident from the second schematic 500B this design is quite similar to the designs presented supra with some critical change. First the SC-MEMSM is placed earlier within the optical circuit allowing for increased propagation path for the spectrally dispersed beam. This design is called asymmetric because the beam is not symmetrically dispersed on both sides of the central wavelength and it is this fact that creates the group velocity dispersion. Accordingly, for $-2° \le \theta \le 2°$ rotation angles, which are achievable with the proposed MEMS mirror, the time delay difference for the implemented circuit design as depicted by second curve 550 in FIG. 5 varies from $-2.0$ ps$\le \tau \le 6.4$ ps yielding a maximum delay variation of 8.4 ps. Whilst larger than the delays induced within the other circuits of comparable dimensions it is clearly a non-linear delay versus rotation angle profile such that a small increase in controller complexity would be required to provide the appropriate rotation for a desire delay.

The natural frequency of the SC-MEMSM devices simulated and implemented according to embodiments of the invention have a natural frequency that exceed 12 kHz. Accordingly, the delay can be scanned at frequencies up to approximately 10 kHz 1C: Optical Spectrometer Within many fields from research to quality control to safety optical spectrometry is employed to determine and/or monitor materials either through the light reflected, transmitted, or radiated such as through photoluminscence for example. Different Materials have different optical spectra for each of these and accordingly either a composition may be determined or the presence of a material confirmed by one or more of these optical spectra. For example, carbon monoxide has absorption lines at approximately 1.6 µm, 2.4 µm, and 4.8 µm whilst methane has broader absorption peaks at approximately 1.7 µm, 2.3 µm, 3.2 µm and 7.9 µm and ammonia peaks at approximately 2 µm, 2.3 µm, 3 µm, 6 µm and 10 µm. In analytical systems the methodology is usually to scan across a range of frequencies to detect the absorption bands and then fit materials to the resulting spectra. In detection/alarm type applications the material of interest is known and hence the spectrometer needs to verify whether there is absorption or not. Accordingly, a spectrometer addressing the later application may be required to only monitor a few wavelengths.

Figure 6:
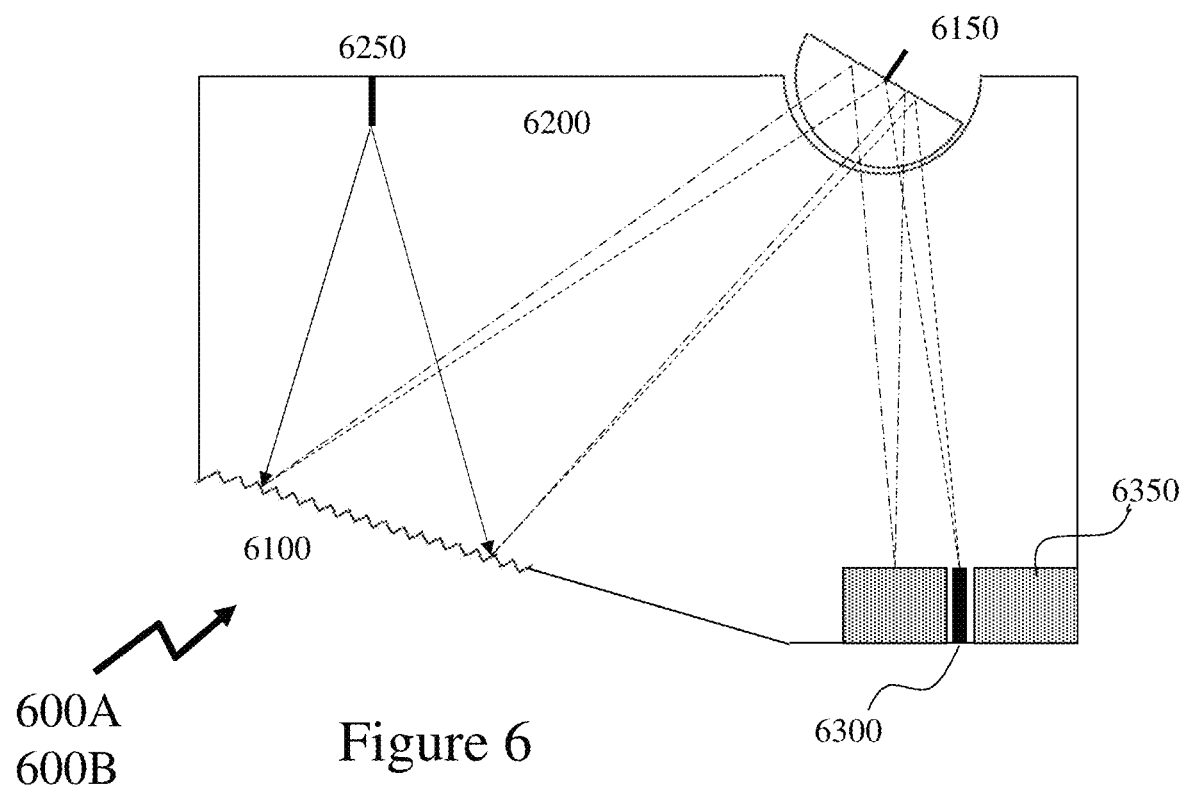
FIG. 6 depicts optical spectrometer designs exploiting MEMS mirrors according to embodiments of the invention.
Figure 6:
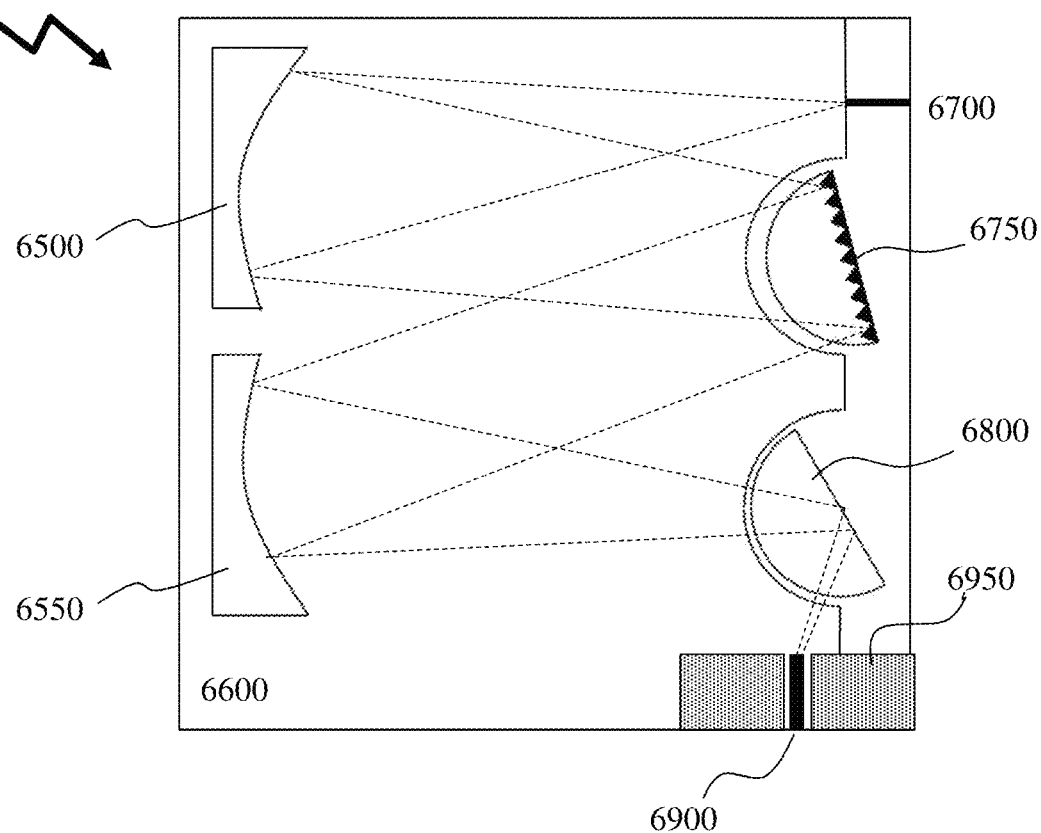

Referring to FIG. 6 there are depicted first and second optical spectrometers 600A and 600B according to embodiments of the invention providing the ability to form compact, monolithic implementations with the potential for low cost and small footprint. Such optical spectrometers may scan rapidly across a predetermined range or step quickly through a predetermined sequence. First spectrometer 600A comprises an input optical waveguide 6250, which may alternatively be an optical port for direct coupling from an external environment rather than via an optical fiber, which couples to planar waveguide 6200. The optical signals reflect from grating 6100 and are coupled to the SC-MEMSM 6150 wherein they are reflected towards the output waveguide 6300. Disposed either side of the output waveguide 6300 are absorbers 6350 to absorb the optical signals not coupled to the output waveguide 6300 which may otherwise reflect through varying paths in varying intensities to couple to the output waveguide 6300. Accordingly, rotation of the SC-MEMS 6150 results in different wavelengths being coupled to the output waveguide 6300. The output waveguide 6300 may be coupled to an optical photodetector within the visible and near-infrared (near-IR) or coupled to a micro-bolometer for the mid-IR.

Similarly, second spectrometer 600B comprises an input optical waveguide 6700 that couples to a planar waveguide 6600 and subsequently to a grating 6750 and output waveguide 6900 disposed between absorbers 6950. However, in this instance the optical path from the input optical waveguide 6700 to the grating 6750 is folded by first reflector 6500 and the optical path from the grating 6750 to the output waveguide 6900 is similarly folded through second reflector 6550 and steered through SC-MEMSM 6800. The grating 6750 is similarly a semi-circular MEMS device but now rather than a mirror on the back surface there is etched a grating. Accordingly, the angle of the grating 6750 to the optical beam can be adjusted as well as the focusing optical signals may be steered by the SC-MEMSM 6800. Accordingly, the second spectrometer 6800 may provide increased resolution through the folded optical path and rotatable grating.

Within other embodiments of the invention a reflective filter structure such as described supra in respect of fourth image 100D in FIG. 4 and FIG. 2 may be employed to step through predetermined wavelength sequence, defined by the reflective filters, wherein the reflected signal is coupled via a circulator to a photodetector or bolometer.

2. Designs for Different Optical Waveguide Technologies

2A: 850 NM and Mid-Infrared—Silicon Carbide Core

The choice of the wavelength of operation for an OCT system is a compromise between resolution and penetration depth. Scattering tissues are usually imaged at 1.3 µm whereas in ophthalmic applications, 0.8 µm is usually preferred to resolve the details of the retina, see for example Drexler et al in "Optical Coherence Tomography: Technology and Applications" (Springer, 2008). However, it would be beneficial for broad exploitation of the integrated optical time delay circuit for this to operate in these two wavelength ranges with minimal adjustments. However, silicon waveguides are not transparent below 1.1 µm. Furthermore, for other applications such as molecular spectroscopy, for example, it would be desirable operate in the mid-infrared (mid-IR) between 3.0 µm$\le \lambda \le 5.0$ µm Stoichiometric amorphous silicon nitride is transparent 0.3 µm$\le \lambda \le 11.0$ µm whilst hexagonal crystalline silicon carbide transmits light 0.5 µm$\le \lambda \le 20.0$ µm, see for example Palik in "Handbook of Optical Constants of Solids" (Academic Press, 1985). Both materials can be deposited through a variety of processes, which makes it easy and affordable to tailor waveguides to multiple applications. Whilst deposited materials can have optical properties that deviate from those reported for bulk materials the experimental measurements found in the literature indicate that for each of these materials these have acceptable properties for low loss optical waveguides over the desired transparency window.

Accordingly, the inventors propose a novel integrated waveguide structure supporting MEMS manufacturing, depicted in first waveguide cross-section 700A, where the core is silicon carbide 770 and the cladding layers are formed with silicon nitride 740. With the ability to deposit silicon carbide 770 in multiple stages an alternative design may implement MEMS elements such as MEMS mirror entirely from silicon carbide 770 in conjunction with silicon carbide optical waveguides. Other ceramic materials in addition to silicon carbide and silicon nitride that may be employed according to the devices being implement include silicon dioxide ($SiO_2$), aluminum nitride (AlN), alumina ($Al_2O_3$), zirconia ($ZrO_2$), and diamond (C).

2B: Telecommunications Window (1300 nm & 1550 nm)—Silicon Nitride Core 2B.1: Optical Waveguide Design Referring to third waveguide cross-section 700B in FIG. 7 there is depicted a waveguide geometry according to an embodiment of the invention comprising a 5 μm lower silicon dioxide 730 cladding, a 70 nm silicon nitride ($Si_3N_4$) 740 core, and a 5 μm upper silicon dioxide 730 cladding. The waveguide cross-section 700B is depicted where the optical waveguide couples via the air gap to the SC-MEMSM which is similarly formed from the same material stack as the optical waveguide.

Referring to Table 1 there is depicted the calculated coupling for varying air gap with varying silicon nitride 740 core thickness. It is evident from this analysis that thinning the silicon nitride 740 core results in an increasing optical beam waist, increased coupling at an initial air gap of 200 nm, and increased air gap for a predetermined optical insertion loss limit, e.g. a 1 dB insertion loss penalty (80%). Accordingly, for an effective waveguide mode index of 1.492 the ideal anti-reflection coating for the optical waveguide to air would have a refractive index of 1.23 centre) at design radii of 0.5 mm, 0.75 mm, and 1.00 mm. The corresponding maximum numbers of channels accessible for these design radii with 0.5 μm channel spacing are 40, 60, and 80 respectively.

Figure 9A:
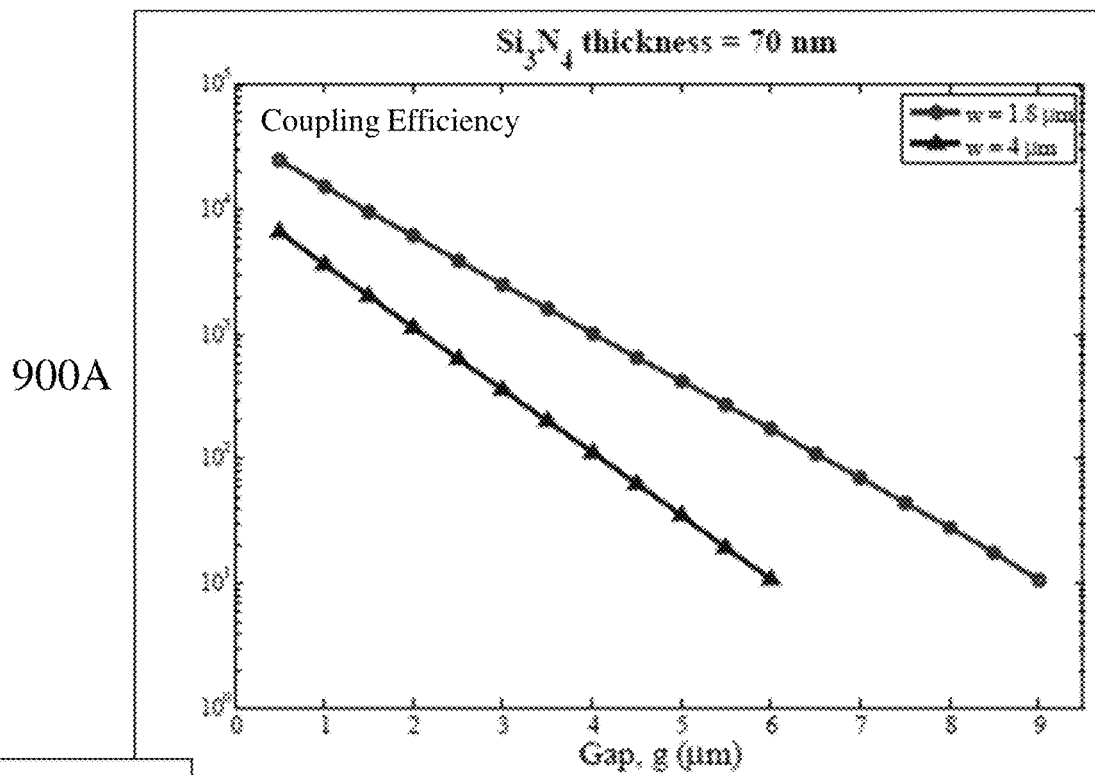
FIG. 9A depicts inter-waveguide coupling strength for silicon nitride core waveguides as a function of inter-waveguide gap for two different core waveguide thicknesses.
Figure 9A:
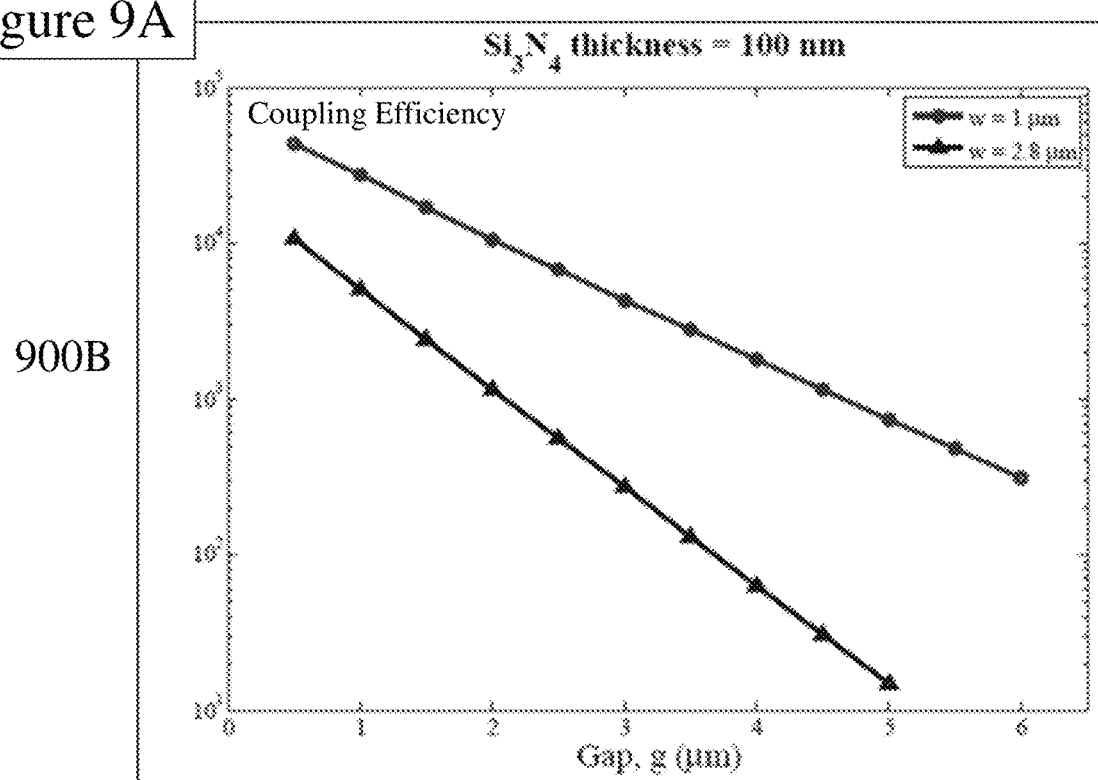

Once the optical signals have been coupled by the SC-MEMSM into the optical waveguides connecting to the Bragg gratings then the waveguide spacing should be increased in order to reduce the optical (parasitic) coupling from the desired waveguide to the adjacent waveguides. Referring to first and second graphs 900A and 900B in FIG. 9A the calculated coupling coefficient for 70 nm and 100 nm thick silicon nitride 720 cores are depicted as a function of waveguide gap (spacing). In first graph 900A the plots represent waveguide widths of 1.8 μm and 4.0 μm respectively, the single mode width limit being approximately 4.5 μm. In second graph the plot represent waveguide widths of 1.0 μm and 2.8 μm respectively, the single mode width limit being approximately 3.0 μm. Accordingly, the resulting waveguide gaps for 20 dB power cross-talk between the target waveguide and adjacent waveguides are given in Table 2 for a parallel waveguide region of length 10 mm

TABLE 2

Waveguide Spacings for Bragg Waveguide Sections with 70 nm Silicon Nitride Core

| 70 nm Thickness | | 100 nm Thickness | |
| --- | --- | --- | --- |
| W (μm) | Gap (μm) | W (μm) | Gap (μm) |
| 1.8 | 8.9 | 2.8 | 5.0 |
| 4.0 | 5.9 | 1.0 | 9.7 |

TABLE 1

Coupling Efficiency with Air Gap Length for Varying Waveguide Geometries

| $Si_3N_4$ Thickness (nm) | Effective Index | Beam Waist (nm) | Air Gap Length | | | | | |
| --- | --- | --- | --- | --- | --- | --- | --- | --- |
| | | | 200 nm | 500 nm | 750 nm | 1 μm | 2 μm | 3 μm |
| 570 | 1.829 | 394 | 69.56% | 20.71% | | | | |
| 200 | 1.600 | 441 | 78.98% | 33.00% | 15.91% | | | |
| 100 | 1.512 | 720 | 96.48% | 81.12% | 64.885 | 49.48% | 16.22% | |
| 70 | 1.492 | 986 | 98.98% | 93.92% | 87.20% | 79.12% | 46.72% | 25.70% |

2B.2: MEMS Circuit Designs

Referring to FIG. 8 there are depicted first to third circuits 800A, 800C, and 800E respectively for SC-MEMSM with design radii of 0.5 mm, 0.75 mm, and 1.00 mm. In each instance the optical waveguides coupling to the Bragg reflectors are spaced 200 μm away from the edge of the SC-MEMSM and in each instance the distance from the pivot mounting of the SC-MEMSM to the optical waveguides is equal to the radius of the SC-MEMSM. Accordingly, the resulting widths of the SC-MEMSM in the three designs depicted in first to third circuits 800A to 800C respectively are 500 μm, 750 μm, and 950 μm. Accordingly considering a maximum angular rotation of the SC-MEMSM as ±3° then the lateral spacing between the upper and lower end waveguides are 52 μm, 78 μm, and 105 μm respectively. Referring to first to third graphs 800B, 800D, and 800F respectively there are therefore depicted the number of accessible channels for optical waveguides having spacings of 0.5 μm and 0.75 μm respectively. Accordingly, for 0.75 μm spaced waveguides the maximum number of channels accessible are 36 (±18 channels from centre), 54 (±27 channels from centre), and 74 (±37 channels from Within the simulations of all waveguides a commercial Institute of Microelectronics (IME) process exploiting deep UV stepper based photolithography at 248 nm was assumed. This offers 180 nm and 200 nm minimum exclusion distances. Accordingly, Bragg gratings were modelled in both the 70 nm and 100 nm thick silicon nitride 720 cores to establish the bandwidth ($\Delta\lambda$) which is the wavelength spacing between the first minima of the grating transfer function which is given by Equation (2).

$$\Delta\lambda = \left[\frac{2\delta n_0 \eta}{\pi}\right]\lambda \qquad (2)$$

where $\delta n_0$ is the variation in refractive index between the refractive index of the waveguide with and without the grating, $\lambda$ the centre wavelength, and $\eta$ the fraction of the power within the core of the waveguide. Accordingly, the resulting grating length required as a function of $\Delta\lambda$ for varying waveguide reflectivity values are depicted for these 70 nm and 100 nm thick silicon nitride 740 cores in first and second graphs 900C and 900D respectively in FIG. 9B. In each instance for a Δλ=0.15 the grating length must be greater than 10 mm Referring to Tables 3 and 4 there are depicted grating design and grating simulation results for cladding modulated first order gratings within each of the 70 nm and 100 nm thick silicon nitride 720 cores respectively where Λ is the pitch of the grating, g the separation of the inner edges of waveguide and grating, and w is the width of the grating elements.

TABLE 3

Grating Design Parameters for Nitride Core Waveguide Designs

| Thickness (nm) | $N_P$ | Λ (nm) | g (μm) | w (nm) |
|---|---|---|---|---|
| 70 | 8322 | 533 | 1.000 | 180 |
| 100 | 8123 | 527 | 1.050 | 180 |

TABLE 4

Grating Assumptions and Simulations for Nitride Core Waveguide Designs

| | Theoretical Assumptions | | | | Simulation Results | | |
|---|---|---|---|---|---|---|---|
| Thickness | Δλ (null to null) | R | L (mm) | K | Δλ (null to null) | Δλ (3 dB) | R | L (mm) |
| 70 | 0.4 | 0.8 | 4.436 | 325 | 0.41 | 0.25 | 0.82 | 4.4 |
| 100 | 0.4 | 0.8 | 4.265 | 338 | 0.39 | 0.24 | 0.81 | 4.3 |

2B.3: MEMS Process Flow

Figure 10:
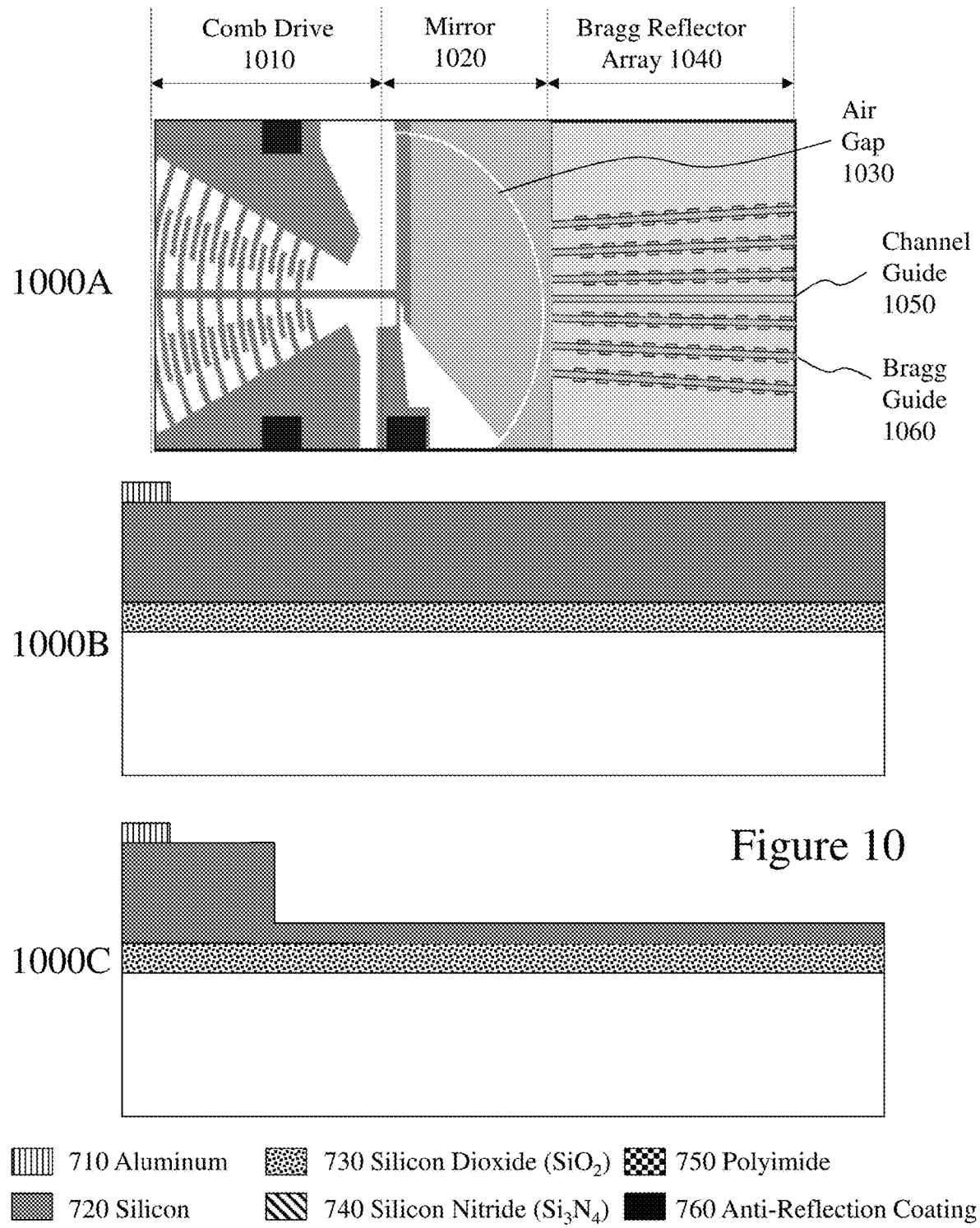
FIGS. 10 to 13 depict an exemplary process flow for manufacturing a Bragg grating waveguide array and a tunable MEMS mirror according to an embodiment of the invention.

Referring to first schematic 1000A in FIG. 10 there is depicted a plan view of a wavelength dependent reflector (WADER) circuit comprising an SC-MEMSM mirror 1020 attached to a comb drive 1010 and then a Bragg reflector array 1040 comprising a central channel waveguide 1050 which couples light into and out of the wavelength dependent reflector circuit and arrays of Bragg waveguides 1060 disposed either side of the channel waveguide via the air gap 1030 and the SC-MEMSM 1020. In other embodiments of the wavelength dependent reflector circuit the Bragg waveguides 1060 may be disposed symmetrically either side of the channel waveguide, asymmetrically with different channel counts either side of the channel waveguide, and asymmetrically to one side of the channel waveguide. Such design considerations may be based upon factors including, but not limited to, the angular rotation range of the SC-MEMSM mirror 1020, the number of wavelength channels, the design of the MEMS comb drive 1010, position of other optical elements such as optical gain elements, photodetectors, etc., and the design of the electrostatic driver circuit for the MEMS comb drive 1010.

Accordingly, referring to second schematic 1000B in FIG. 10 a cross-section of the WADER circuit is depicted in cross-sectional view comprising silicon dioxide (SiO2) 730, silicon (Si) 720, and aluminum (Al) 710 which has already been patterned and etched. Considering a typical silicon-on-insulator (SOI) substrate then the Si 720 is 5 μm thick. The Al 710 may be sputtered with a thickness of 300 nm which after patterning through a lithography process may be removed using a standard Al wet etch process. Subsequently in third schematic 1000C the WADER circuit is depicted after the exposed Si 720 has been pattered lithographically and deep etched to remove 4.5 μm using a deep reactive ion etching (DRIE) process using sulphur hexafluoride (SF$_6$) and octafluorocyclobutane (C$_4$F$_8$) after which the resist is stripped.

Figure 11:
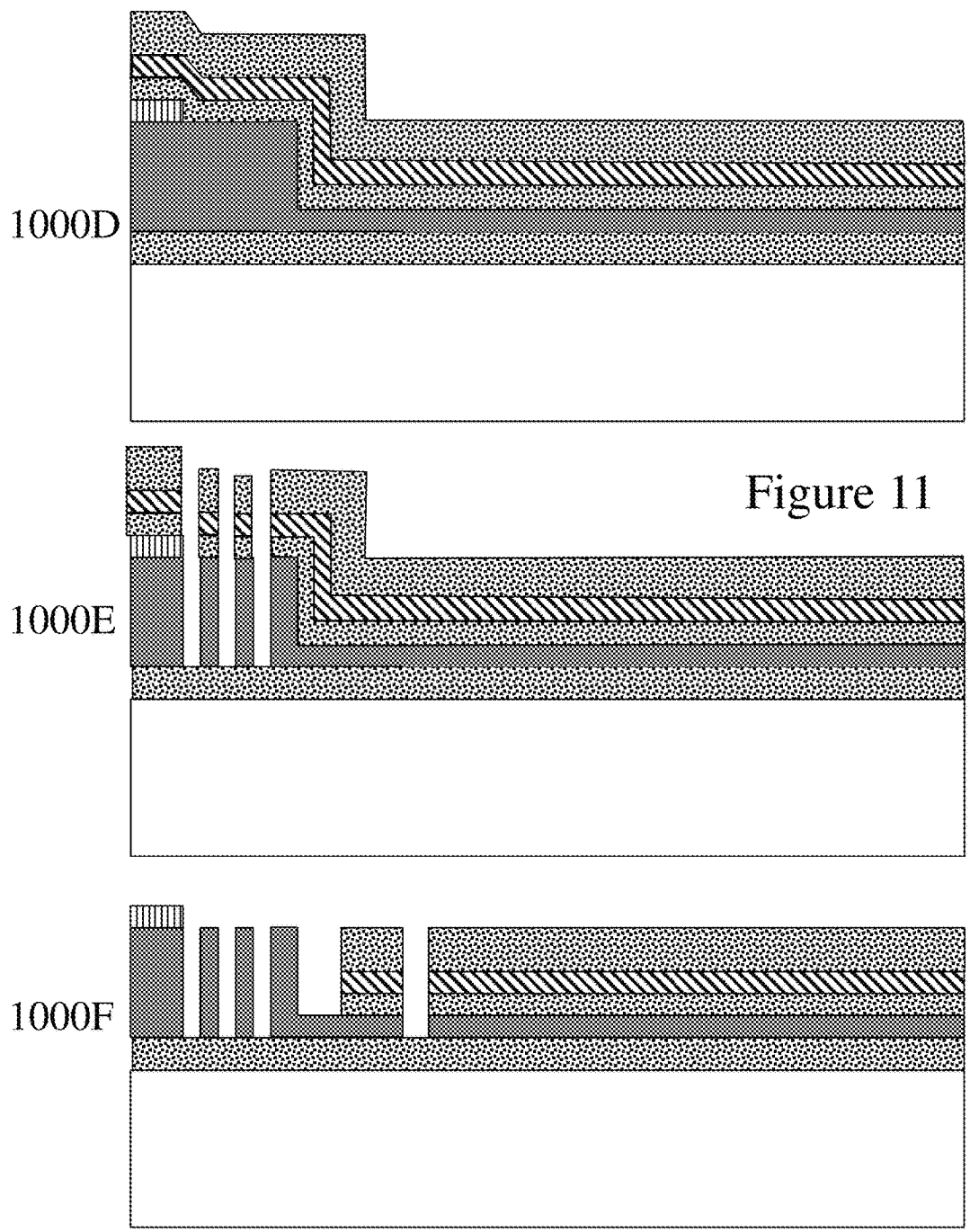

Now referring to fourth schematic 1000D in FIG. 11 the optical waveguide layer stack is deposited comprising 4 μm SiO2 730, 100 nm silicon nitride (Si3N4) 740, and 4 μm SiO2 730. The deposition being for example through chemical vapour deposition (CVD). Next in fifth schematic 1000E in FIG. 11 the WADER circuit is depicted after the optical waveguides and comb drive openings have been defined, using a DRIE etching process with a SF$_6$—C$_4$F$_8$—Argon (Ar) process having an aspect ratio of 1:1.6 to etch the 4 μm SiO2 730—100 nm silicon nitride (Si3N4) 740—4 μm SiO2 730 stack, and the comb drive has been defined using a DRIE etching process with a SF$_6$—C$_4$F$_8$ process having an aspect ratio of 1:1 to etch the 5 μm Si 720.

Subsequently in sixth schematic 1000F in FIG. 11 the WADER circuit cross-section is depicted after the air gap has been formed and the excess regions of the optical waveguides atop the comb drive etc. have been removed. These steps are achieved using a DRIE etching process with a SF$_6$—C$_4$F$_8$—Argon (Ar) process having an aspect ratio of 1:8 to etch the SiO2 730—Si3N4 740—SiO2 730 stack, and the comb drive has been defined using a DRIE etching process with a SF$_6$—C$_4$F$_8$ having an aspect ratio of 2:1 to etch the 0.5 μm Si 720. Whereas the preceding steps were carried out with a critical dimension of approximately 5 μm the photolithography for the air gap processes have a critical dimension of approximately 1 μm. Within a variant of the process flow the process sequences leading to fifth and sixth schematics 1000E and 1000F may be reversed such that the excess waveguide stack is removed and the waveguides define prior to etching the actuator.

Figure 12:
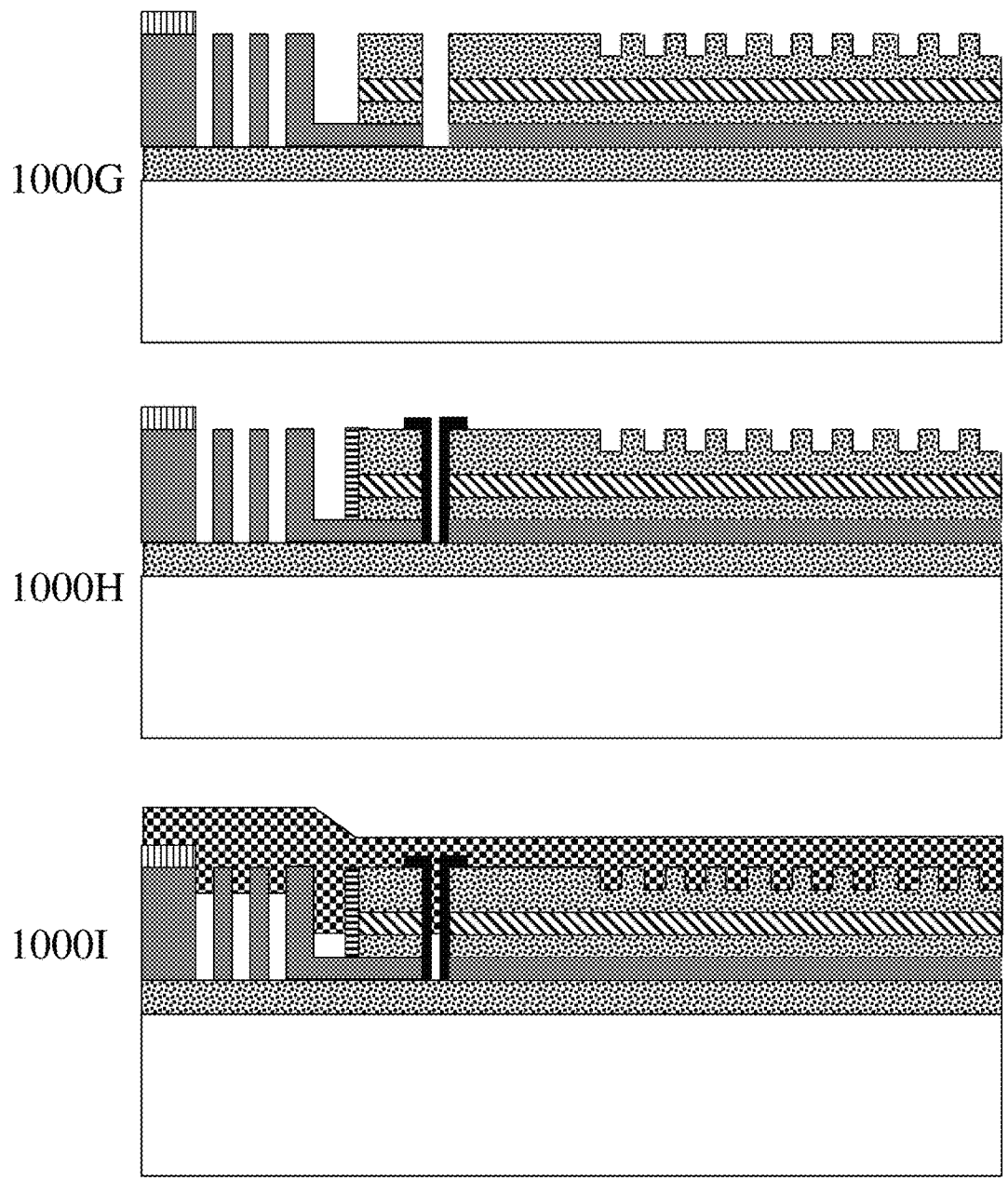

Next in seventh schematic 1000G in FIG. 12 the Bragg grating sections of the optical Bragg reflectors are photolithographically defined and etched using a DRIE etching process with a SF$_6$—C$_4$F$_8$—Argon (Ar) process having an aspect ratio of 1:8 to partially etch the upper cladding comprising SiO2 730. Due to the requirements of the Bragg grating process resolution of approximately 180 nm or better is necessary at this stage.

Now referring to eighth schematic 1000H in FIG. 12 a reflective layer, gold (Au) 780, is deposited and patterned onto the SC-MEMSM mirror sidewalls and anti-reflection (AR) coatings 760 are deposited and patterned onto the SC-MEMSM mirror sidewall and optical waveguide sidewall either side of the air gap. The AR coating 760 may be magnesium fluoride, MgF$_2$, for example with a thickness of 280 nm. Subsequently as depicted in ninth schematic 1000I the front surface of the WADER circuit is protected for wafer backside processing steps that follow. Accordingly, polyimide 750 with a thickness of 5 μm may be spin-coated onto the wafer and cured, e.g. 300° C. for 2 hours. Optionally at this point the substrate may also be thinned using Chemical Mechanical Polishing (CMP) for example.

Figure 13:
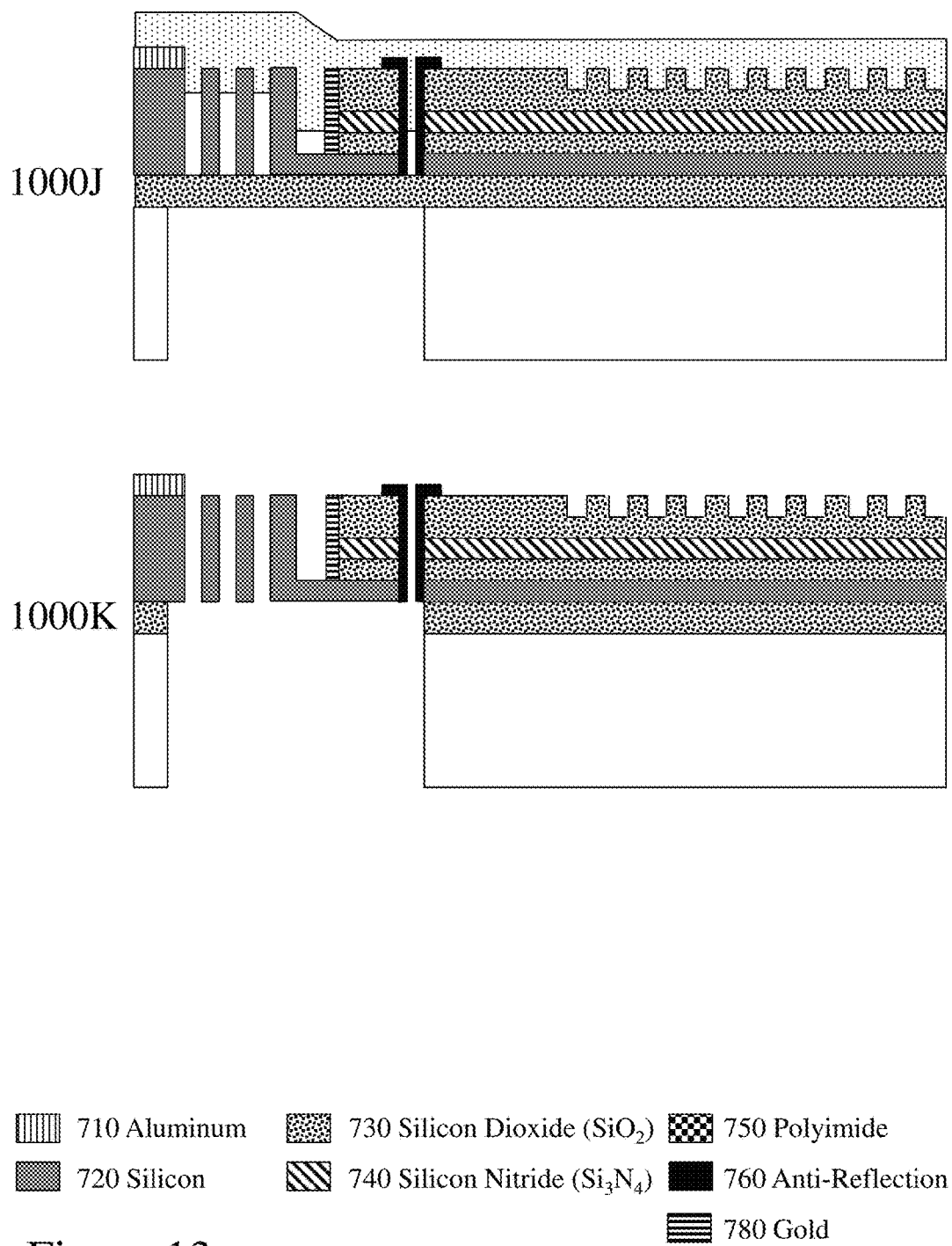

In ninth schematic 1000I in FIG. 13 the substrate, e.g. silicon, is lithographically processed to define the trench below the MEMS comb drive and SC-MEMSM mirror sections of the WADER circuit. This may, for example, be via a DRIE using SF$_6$—C$_4$F$_8$ stopping at the SiO2 730 layer. Then in tenth schematic 1000J the SiO2 720 is etched from the backside using an RIE process, for example, followed by resist stripping, wafer dicing, polyimide removal by plasma ashing, for example, and mechanical polishing of the WADER circuit die sidewall for connection between the channel waveguide and optical fiber. The final device being depicted in eleventh schematic 1000K.

2C. Telecommunications Window (1300 nm & 1550 nm)—Silicon Core

2C.1 Optical Waveguide Design

Figure 7:
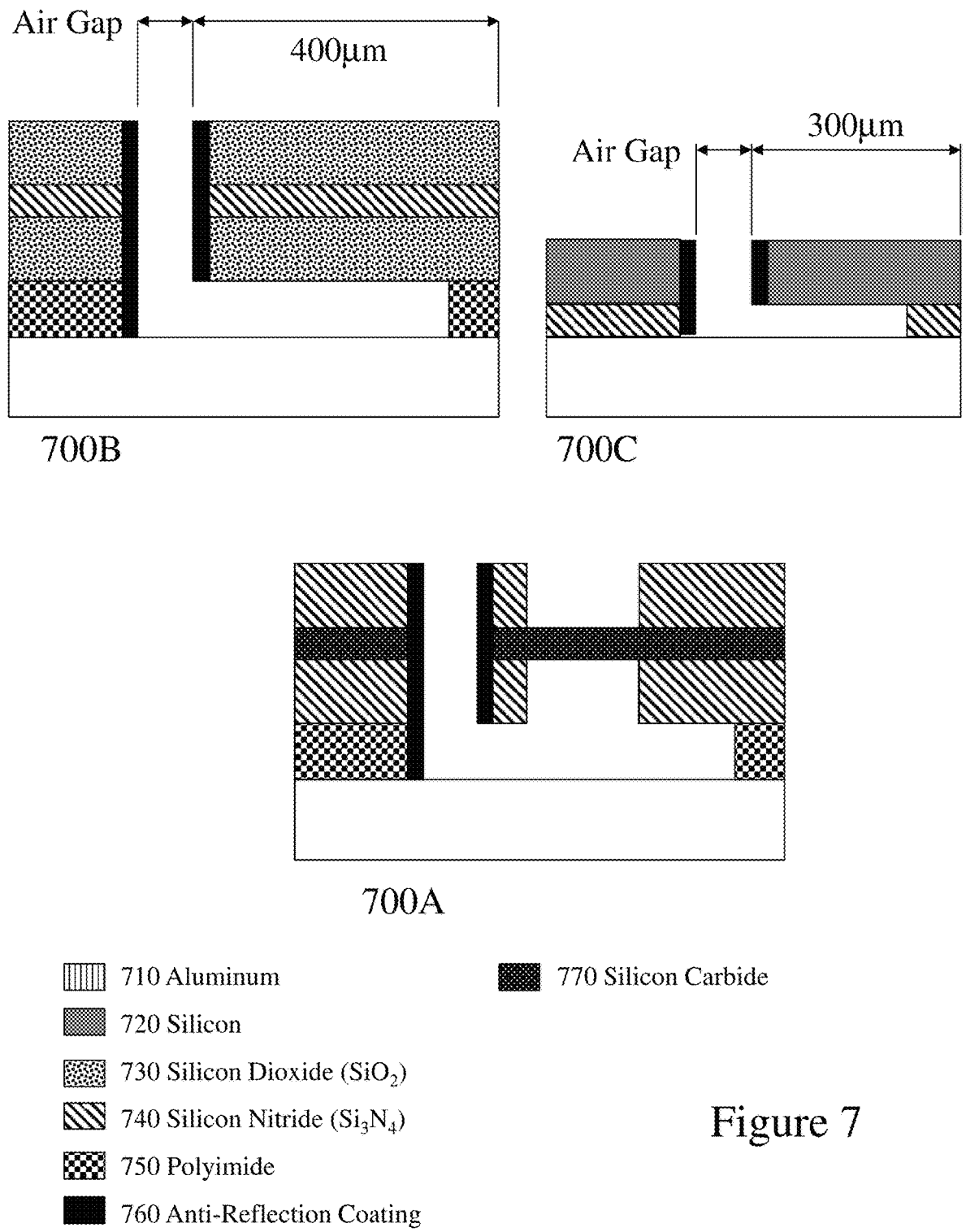
FIG. 7 depicts optical waveguide and MEMS design variants according to embodiments of the invention.

Referring to second waveguide cross-section 700C in FIG. 7 there is depicted a waveguide geometry according to an embodiment of the invention comprising a lower silicon dioxide 730 lower cladding, a silicon 720 core, and air upper cladding. The waveguide cross-section 700C is depicted where the optical waveguide couples via the air gap to the SC-MEMSM which is similarly formed from the same material stack as the optical waveguide.

However, the thickness limit of the silicon (Si) for a single-mode waveguide is 220 nm which is too thin for MEMS devices. However, at a thickness of 1 μm 5 modes exist within the silicon having modal indices of n=3.405, 3.203, 2.845, 2.281, 1.487 and accordingly a rib waveguide geometry is employed in order to select the fundamental mode. Due to the refractive indices the anti-reflection (AR) layer on the air gap of the optical waveguide and SC-MEMSM can be formed from parylene with a refractive index of 1.66. The thickness of the AR coating would be 233 nm.

Referring to Table 5 there is depicted the calculated coupling for varying air gap with varying silicon 720 core thickness. It is evident from this analysis that thinning the silicon 720 core results in a decreasing optical beam waist and decreasing coupling at an initial air gap of 200 nm. Accordingly, an increased thickness is preferred for a pre-determined optical insertion loss limit, e.g. a 1 dB insertion loss penalty (80%).

TABLE 5

Coupling Efficiency with Air Gap Length for Varying Waveguide Geometries

| Si Thickness (nm) | Effective Index | Beam Waist (nm) | Air Gap Length | | | | | |
|---|---|---|---|---|---|---|---|---|
| | | | 200 nm | 500 nm | 750 nm | 1 μm | 2 μm | 3 μm |
| 10,000 | 3.469 | 3,860 | | | | | | 99.02 |
| 5,000 | 3.466 | 1,960 | 99.94 | 99.58 | 99.08 | 98.37 | 93.63 | 86.27 |
| 3,000 | 3.461 | 1,200 | 99.54 | 97.12 | 88.99 | 77.15 | 63.73 | 39.41 |
| 2,000 | 3.451 | 820 | 97.87 | 87.54 | 74.47 | 60.12 | 19.93 | |
| 1,500 | 3.438 | 631 | 94.06 | 69.06 | 45.97 | 28.64 | | |
| 1,000 | 3.404 | 440 | 77.86 | 27.86 | | | | |
| 500 | 3.262 | 252 | 19.22 | | | | | |
| 220 | 2.820 | 162 | | | | | | |

Figure 14:
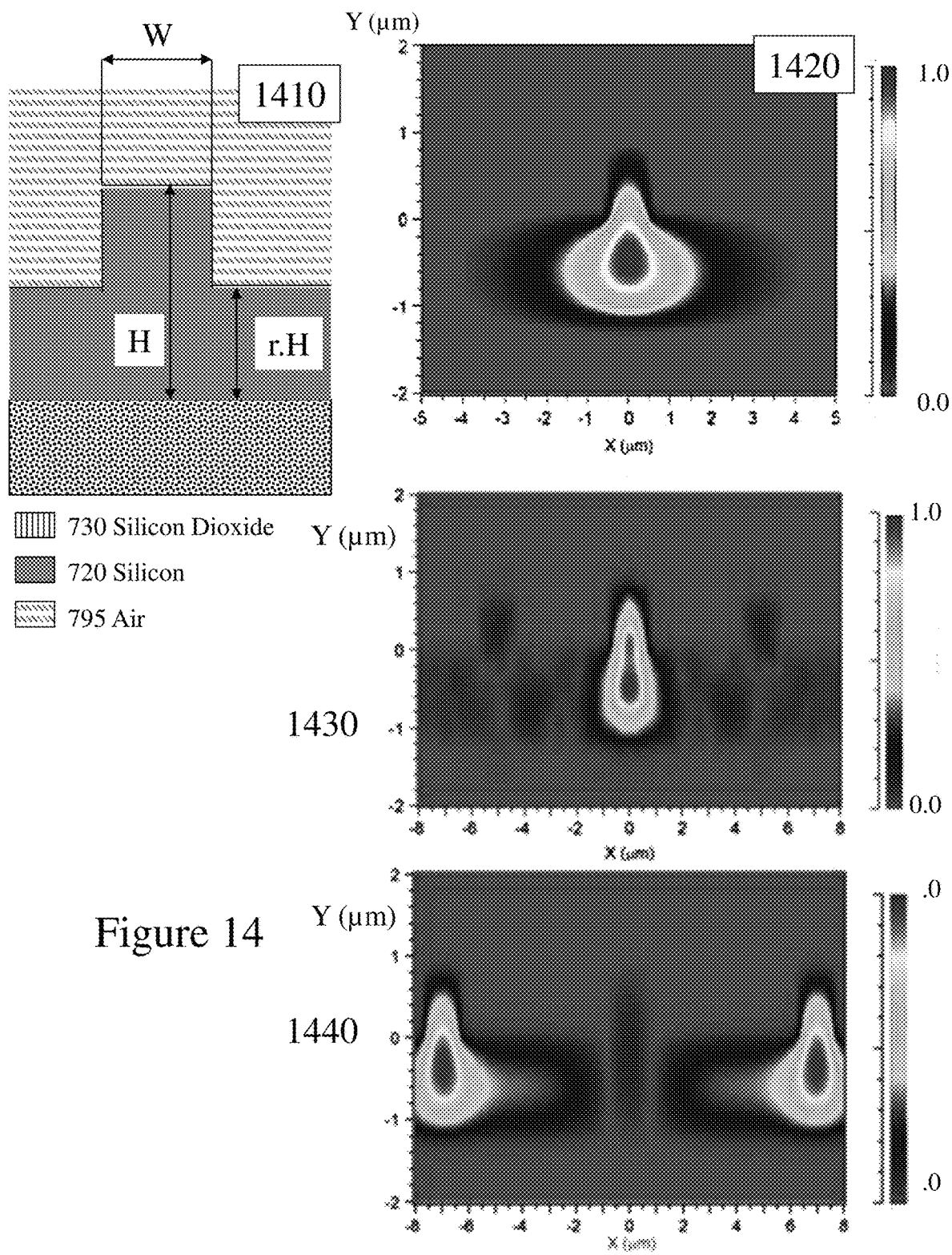
FIG. 14 depicts silicon rib waveguide design and simulations for an isolated waveguide and waveguides within an array.

As depicted in FIG. 14 in first image 1410 a cross-section of the silicon-on-insulator (SOI) rib waveguide is depicted comprising SiO2 730 lower cladding (the insulator) and Si 720 having an original thickness, H, that has been etched to form a rib wherein the remaining Si 720 adjacent the rib is a slab of height r.H. The rib waveguide being air clad. Accordingly, referring to Table 6 below the waveguide geometries for maximum confinement as a function of rib waveguide height, H are presented. An example of the mode structure for a rib waveguide employed is depicted in second schematic 1420.

TABLE 6

Single Mode Rib Waveguides for Maximum Confinement with Varying Rib Height

| Height (H) | 3.40 μm | 2.00 μm | 1.00 μm |
|---|---|---|---|
| Slab (r.H) | 2.04 μm | 1.20 μm | 0.51 μm |
| Width (W) | 2.17 μm | 1.40 μm | 0.52 μm |
| Fundamental Mode Width | 3.00 μm | 2.50 μm | 2.00 μm |

Because of the slab waveguide there can be significant leakage (cross-coupling) between the rib waveguides if they are placed too close to one another. Accordingly, this imposes a lower limit on their separation thereby reducing the number of channels within the devices according to these embodiments of the invention. This is depicted in third and fourth images 1430 and 1440 respectively for a rib waveguide array wherein light is coupled into the central waveguide in third image 1430 and to an adjacent pair of waveguides in fourth image 1440. In each instance, power coupling is evident between the adjacent waveguides. Accordingly, in contrast to the separations of 0.50 μm and 0.75 μm within the silicon nitride design analysis in Section 2B supra the separations within the design analysis for the SOI rib waveguides were 4.50 μm and 5.5 μm respectively.

2C.2: MEMS Circuit Designs

Figure 15:
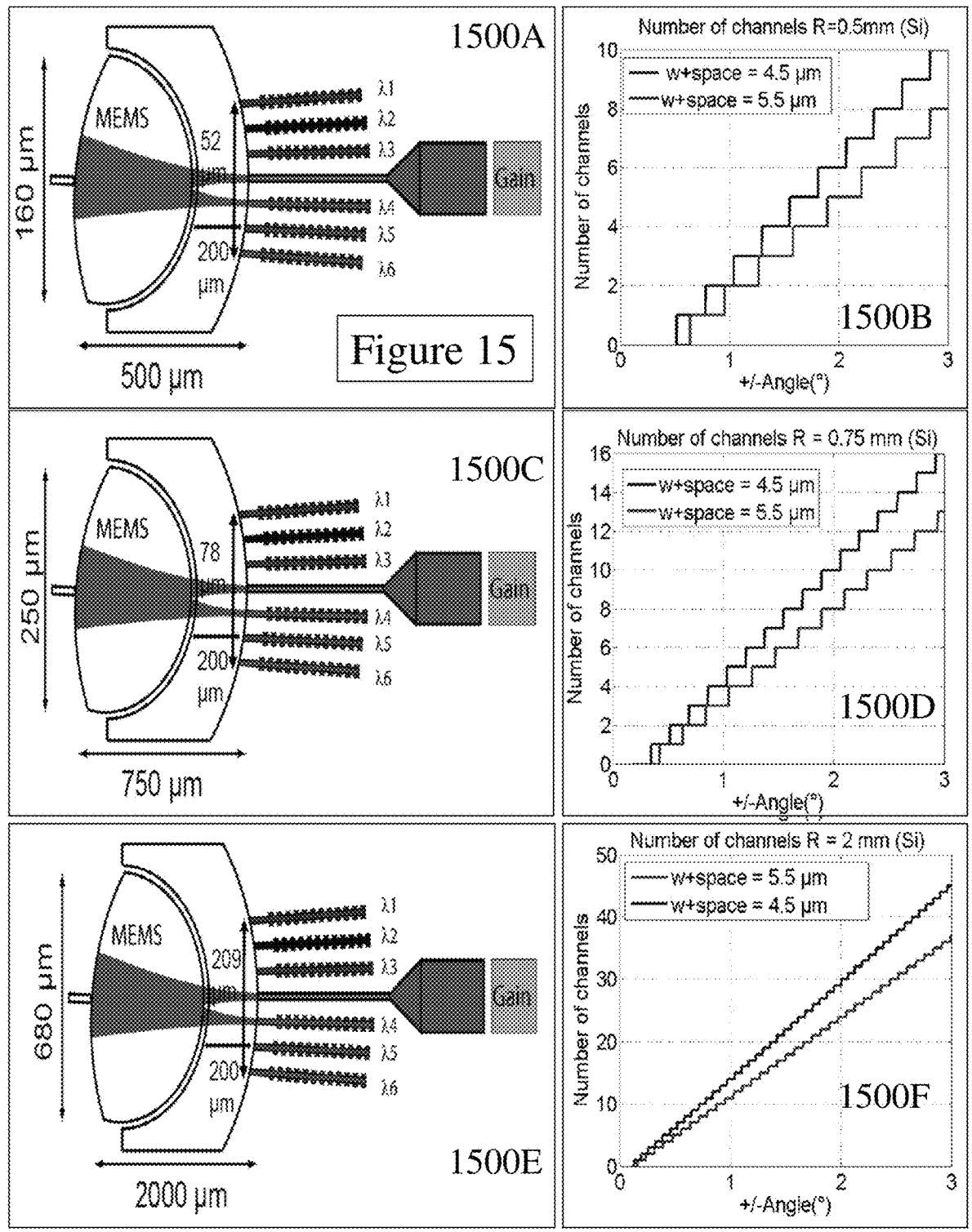
FIG. 15 depicts schematics for silicon rib waveguide based circuits according to embodiments of the invention and their resulting optical channel counts with varying maximum rotation angle of the MEMS mirror.

Referring to FIG. 15 there are depicted first to third circuits 1500A, 1500C, and 1500E respectively for SC-MEMSM with design radii of 0.5 mm, 0.75 mm, and 2.00 mm respectively. In each instance the optical waveguides coupling to the Bragg reflectors are spaced 200 μm away from the edge of the SC-MEMSM and in each instance the distance from the pivot mounting of the SC-MEMSM to the optical waveguides is equal to the radius of the SC-MEMSM. Accordingly, the resulting widths of the SC-MEMSM in the three designs depicted in first to third circuits 1500A to 1500C respectively are 160 μm, 250 μm, and 680 μm. Accordingly considering a maximum angular rotation of the SC-MEMSM as ±3° then the lateral spacing between the upper and lower end waveguides are 52 μm, 78 μm, and 209 μm respectively. Referring to first to third graphs 1500B, 1500D, and 1500F respectively there are therefore depicted the number of accessible channels for optical waveguides having spacings of 4.50 μm and 5.5 μm respectively. Accordingly, for 5.5 μm spaced waveguides the maximum number of channels accessible are 16 (±8 channels from centre), 26 (±13 channels from centre), and 74 (±37 channels from centre) at design radii of 0.5 mm, 0.75 mm, and 2.00 mm respectively. The corresponding maximum numbers of channels accessible for these design radii with 4.50 μm channel spacing are 20, 32, and 90 respectively.

Figure 16:
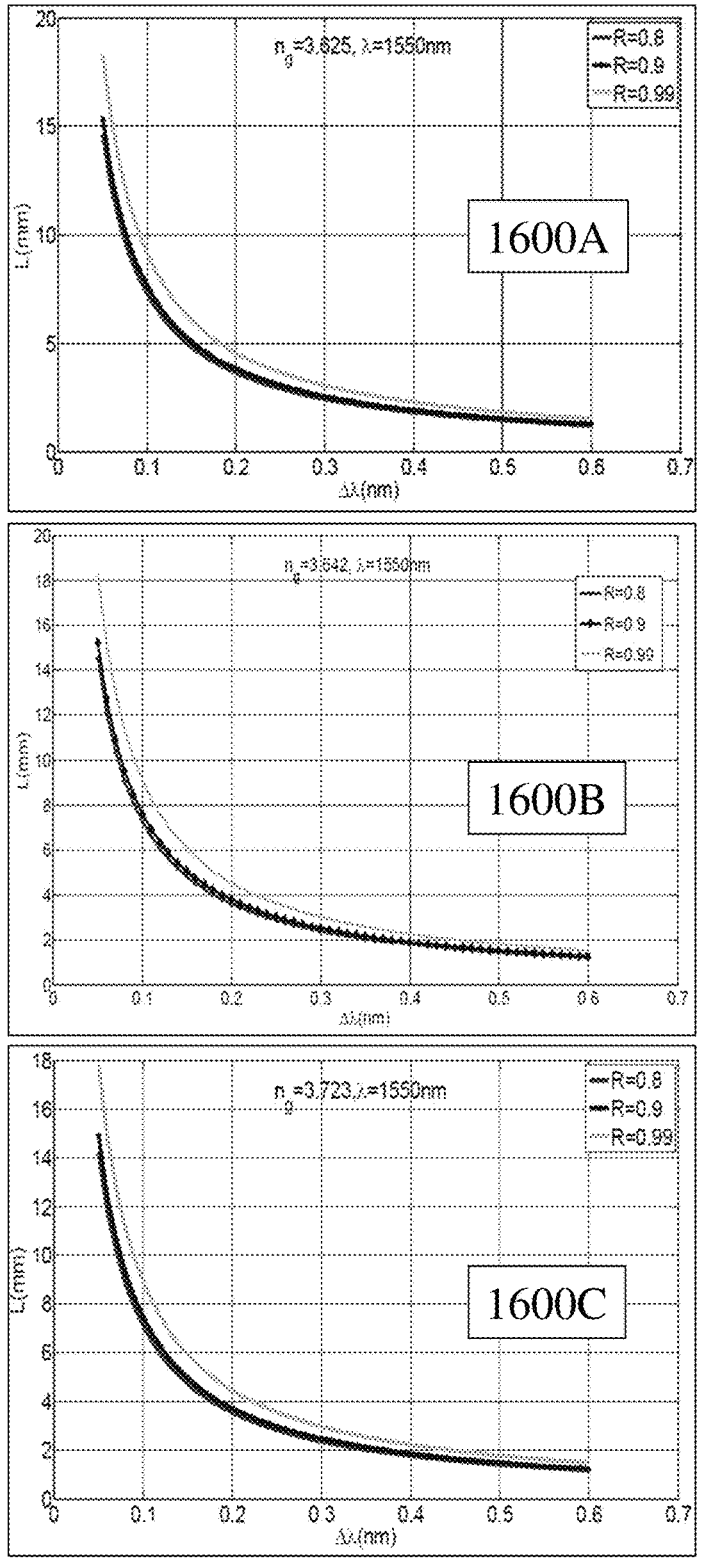
FIG. 16 depicts Bragg grating length versus grating bandwidth for silicon rib waveguides with varying rib depth.
Figure 16:
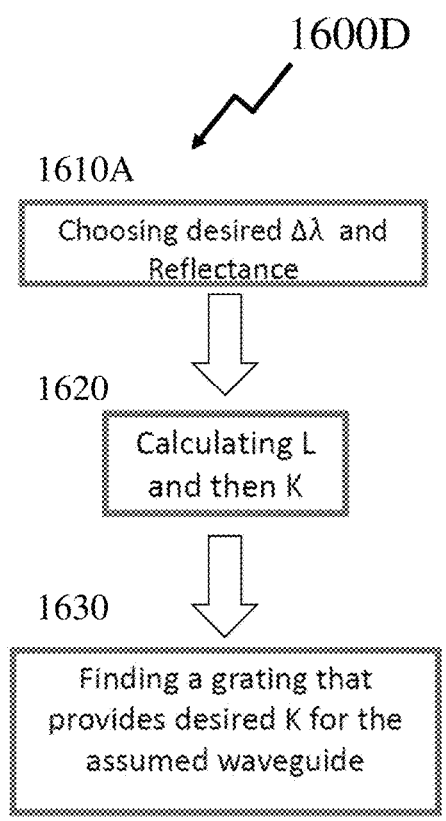

Now referring to FIG. 16 there are depicted first to third graphs 1600A to 1600C respectively depicting the grating length required as a function of Δλ for varying waveguide reflectivity values for 3.40 μm, 2.00 μm and 1.00 μm rib height silicon 720 waveguides. In each instance for a Δλ=0.15 the grating length must be greater than 6 mm. Referring to Tables 7A to 9B there are presented grating assumptions and grating simulation results for cladding modulated first order gratings within each of the 3.40 μm, 2.00 μm and 1.00 μm rib height silicon 720 waveguides respectively where Λ is the pitch of the grating, g the separation of the inner edges of waveguide and grating, and w is the width of the grating elements.

TABLE 7A

Grating Design Parameters for 3.40 μm Silicon Rib Waveguide Designs

| Grating Type | $N_P$ | Λ (nm) | g (nm) | w (nm) |
|---|---|---|---|---|
| A | 21807 | 223 | 800 | 180 |
| B | 7258 | 670 | 200 | 180 |
| C | 7258 | 670 | 200 | 190 |

TABLE 7B

Grating Assumptions and Simulations for 3.40 μm Silicon Rib Waveguide Designs

| | Theoretical Assumptions | | | | Simulation Results | | | |
|---|---|---|---|---|---|---|---|---|
| Design | Δλ (null to null) | R | L (mm) | K | Δλ (null to null) | Δλ (3 dB) | R | L (mm) |
| A | 0.15 | 0.8 | 4.863 | 296 | 0.15 | 0.091 | 0.79 | 4.90 |
| B | | | | | 0.15 | 0.082 | 0.77 | 4.86 |
| C | | | | | 0.15 | 0.088 | 0.80 | 4.86 |

TABLE 8A

Grating Design Parameters for 2.00 μm Silicon Rib Waveguide Designs

| Grating Type | $N_P$ | Λ (nm) | g (nm) | w (nm) |
|---|---|---|---|---|
| A | 16200 | 224 | 800 | 180 |
| B | 21607 | 224 | 950 | 180 |
| C | 7202 | 673 | 500 | 190 |

TABLE 8B

Grating Assumptions and Simulations for 2.00 μm Silicon Rib Waveguide Designs

| | Theoretical Assumptions | | | | Simulation Results | | | |
|---|---|---|---|---|---|---|---|---|
| Design | Δλ (null to null) | R | L (mm) | K | Δλ (null to null) | Δλ (3 dB) | R | L (mm) |
| A | 0.20 | 0.8 | 4.863 | 296 | 0.15 | 0.091 | 0.79 | 4.90 |
| B | 0.15 | | 4.84 | 298 | 0.15 | 0.082 | 0.77 | 4.86 |
| C | | | | | 0.15 | 0.088 | 0.80 | 4.86 |

TABLE 9A

Grating Design Parameters for 1.00 μm Silicon Rib Waveguide Designs

| Grating Type | $N_P$ | Λ (nm) | g (nm) | w (nm) |
|---|---|---|---|---|
| A | 20409 | 232 | 1000 | 180 |
| B | 6803 | 696 | 750 | 180 |

TABLE 9B

Grating Assumptions and Simulations for 1.00 μm Silicon Rib Waveguide Designs

| | Theoretical Assumptions | | | | Simulation Results | | | |
|---|---|---|---|---|---|---|---|---|
| Design | Δλ (null to null) | R | L (mm) | K | Δλ (null to null) | Δλ (3dB) | R | L (mm) |
| A | 0.15 | 0.8 | 4.735 | 232 | 0.155 | 0.091 | 0.84 | 4.734 |
| B | | | 3.735 | 291 | 0.220 | 0.110 | 0.86 | 4.700 |

Accordingly, as depicted in FIG. 16 a design flow 1600D for the Bragg reflectors is depicted wherein in step 1610 the desired Δλ and reflectance R are chosen such that in step 1620 the grating length L and grating wave-vector K. Subsequently in step 1630 the design process is completed by finding a grating design that yields the desired grating wave-vector K for the assumed waveguide.

2C.3: MEMS Process Flow

Figure 17:
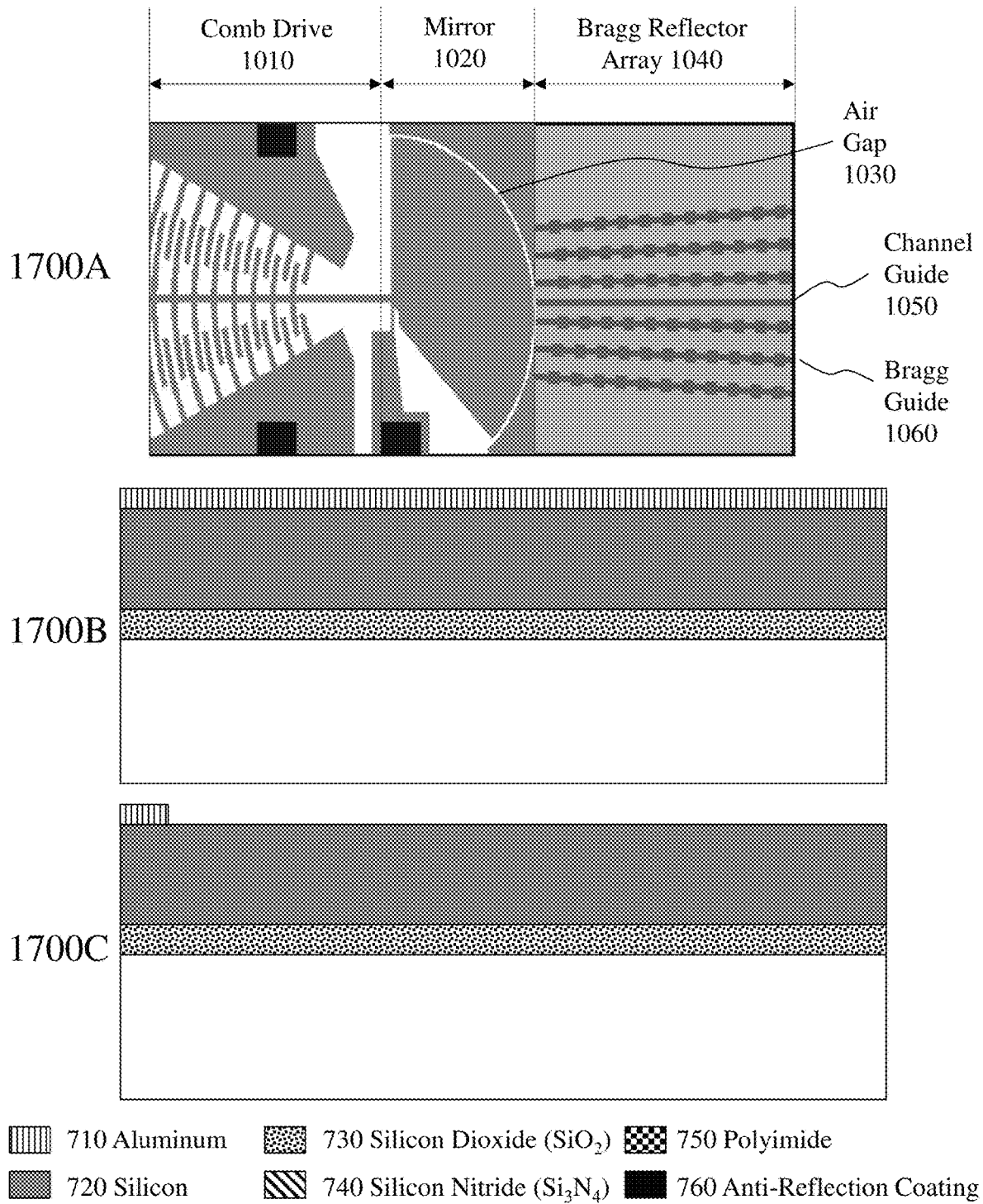
FIGS. 17 to 20 depict an exemplary process flow for manufacturing a Bragg grating waveguide array and a tunable MEMS mirror according to an embodiment of the invention.

Referring to first schematic 1700A in FIG. 17 there is depicted a plan view of a wavelength dependent reflector (WADER) circuit comprising an SC-MEMSM mirror 1020 attached to a comb drive 1010 and then a Bragg reflector array 1040 comprising a central channel waveguide 1050 which couples light into and out of the wavelength dependent reflector circuit and arrays of Bragg waveguides 1060 disposed either side of the channel waveguide. In other embodiments of the wavelength dependent reflector circuit the Bragg waveguides 1060 may be disposed symmetrically either side of the channel waveguide, asymmetrically with different channel counts either side of the channel waveguide, and asymmetrically to one side of the channel waveguide. Such design considerations may be based upon factors including, but not limited to, the angular rotation range of the SC-MEMSM mirror 1020, the number of wavelength channels, the design of the MEMS comb drive 1010, and the design of the electrostatic driver circuit for the MEMS comb drive 1010.

Figure 18:
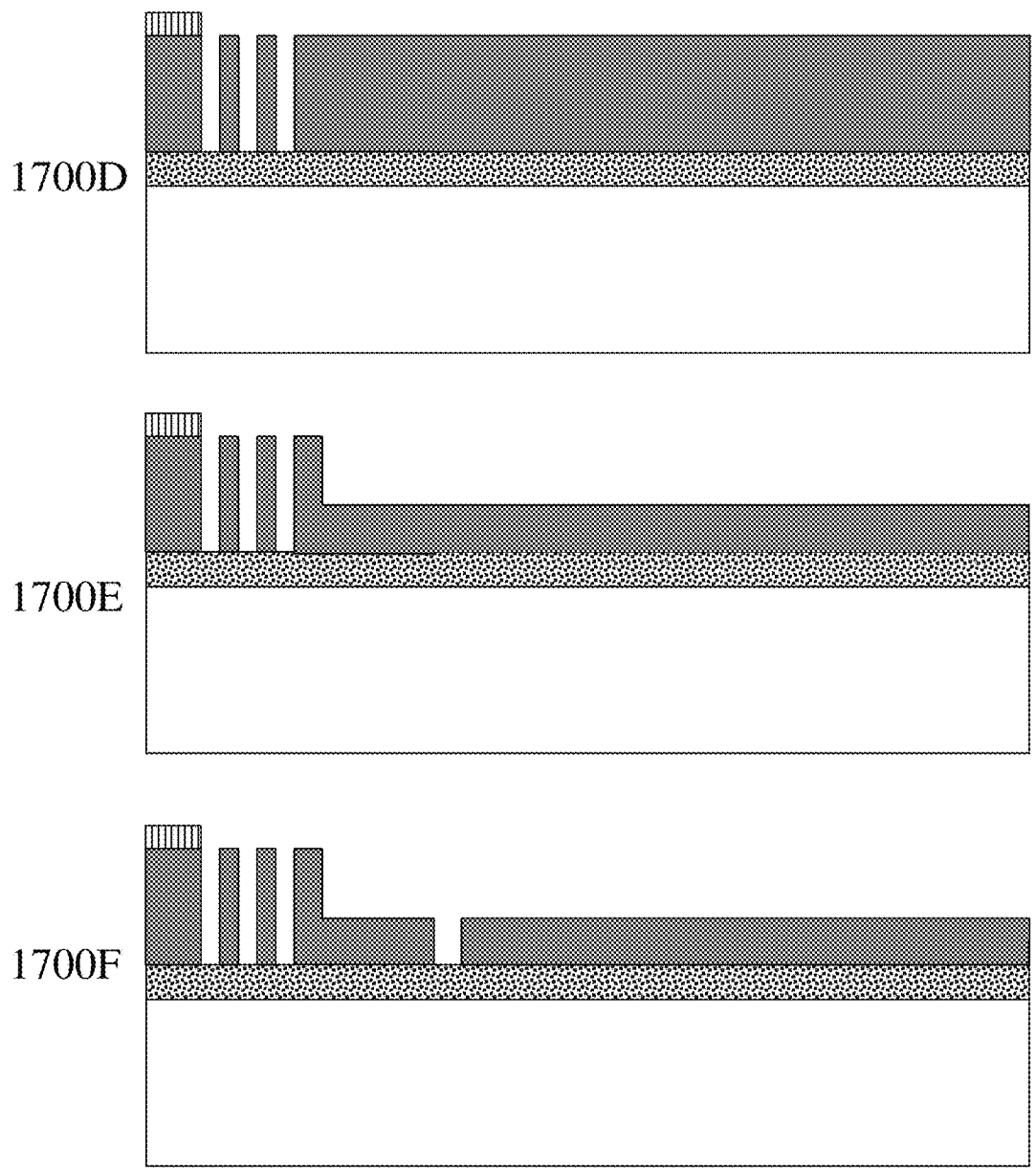

Accordingly, referring to second schematic 1700B in FIG. 17 a cross-section of the WADER circuit is depicted in cross-sectional view comprising silicon dioxide ($SiO_2$) 730, silicon (Si) 720, and aluminum (Al) 710 which has already been patterned and etched in third schematic 1700C. Considering a typical silicon-on-insulator (SOI) substrate then the Si 720 is 5 μm thick. The Al 710 may be sputtered with a thickness of 300 nm which after patterning through a lithography process may be removed using a standard Al wet etch process. Subsequently in fourth schematic 1700D in FIG. 18 the WADER circuit is depicted after the exposed Si 720 has been pattered lithographically and deep etched to remove to form the comb drive using a deep reactive ion etching (DRIE) process using sulphur hexafluoride ($SF_6$) and octafluorocyclobutane ($C_4F_8$) after which the resist is stripped. Next in fifth schematic 1700E in FIG. 18 the WADER circuit is depicted after a 3 μm RIE to etch the Si 720 to form the waveguide regions with a thickness of 2 μm Subsequently in sixth schematic 1700F in FIG. 18 the WADER circuit cross-section is depicted after the air gap has been formed using a RIE etching process with $SF_6$ to etch the 2 μm Si 720 with an aspect ratio of 1:2. Whereas the preceding steps were carried out with a critical dimension of approximately 5 μm the photolithography for the next step of Bragg grating fabrication is performed with electron-beam (e-beam) lithography or photolithography process with a critical dimension of 180 nm. Accordingly, in seventh schematic 1700G in FIG. 19 the Bragg grating sections of the optical Bragg reflectors are etched using an $SF_6$ RIE etching process with an aspect ratio of 1:4.5 to partially etch the Si 720 by removing 800 nm.

Figure 19:
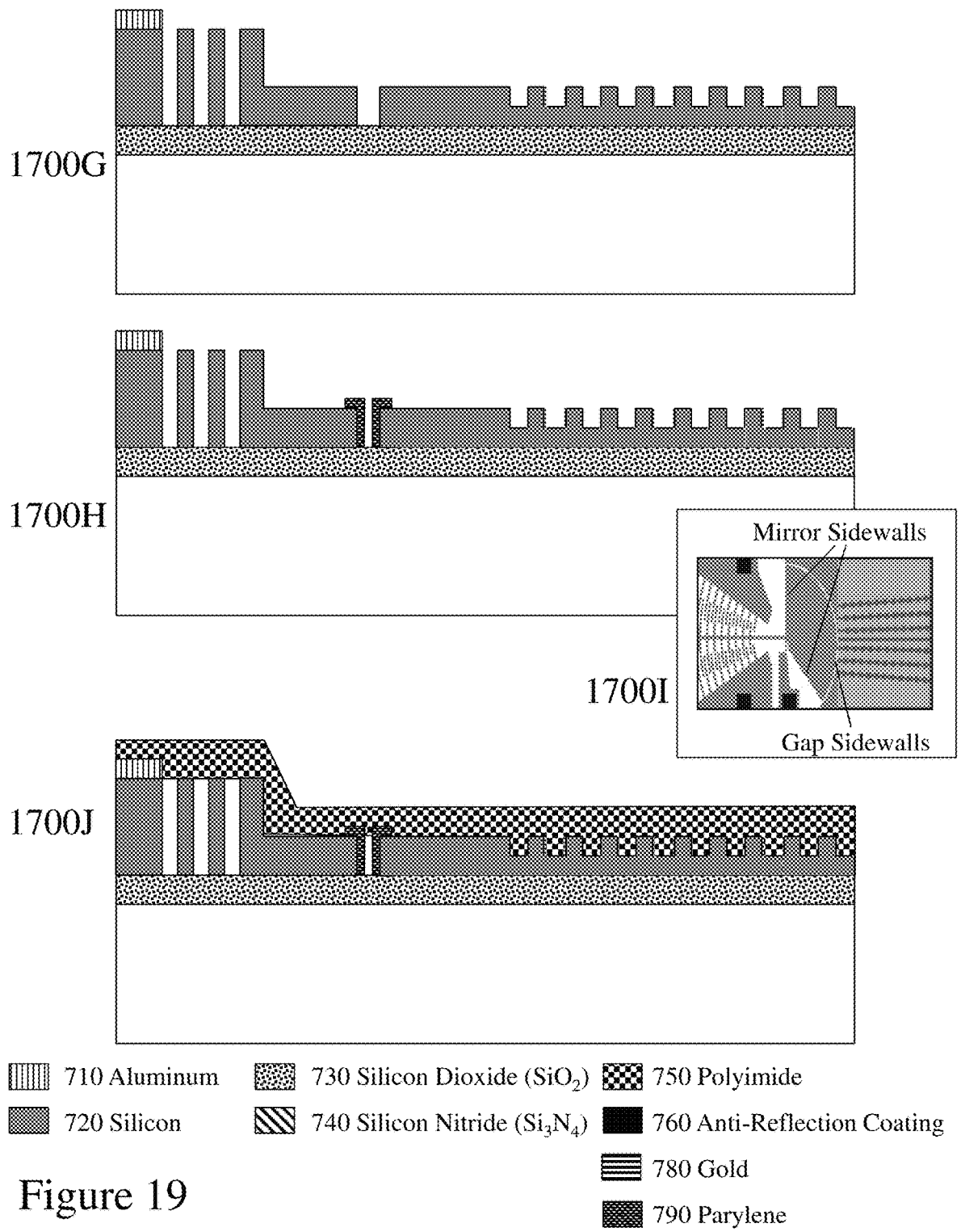

Now referring to eighth schematic 1700H in FIG. 19 a reflective layer, gold (Au) 780, is deposited and patterned onto the SC-MEMSM mirror sidewalls and anti-reflection (AR) coatings are deposited and patterned onto the SC-MEMSM mirror sidewall and optical waveguide sidewall either side of the air gap. The AR coating may be paralyne 790 for example as described supra of thickness 233 nm. Plan schematic 1700I shows the mirror sidewalls and air gap as the cross-section in eighth schematic 1700H is through the SC-MEMSM mirror and its anchor and does not intersect the SC-MEMSM mirror sidewall.

Subsequently as depicted in ninth schematic 1700I the front surface of the WADER circuit is protected for wafer backside processing steps that follow. Accordingly, polyimide 750 with a thickness of 5 μm may be spin-coated onto the wafer and cured, e.g. 300° C. for 2 hours. Alternatively, photoresist or other materials may be employed to coat and protect the wafer prior to backside processing. Optionally at this point the substrate may also be thinned using Chemical Mechanical Polishing (CMP) for example.

Figure 20:
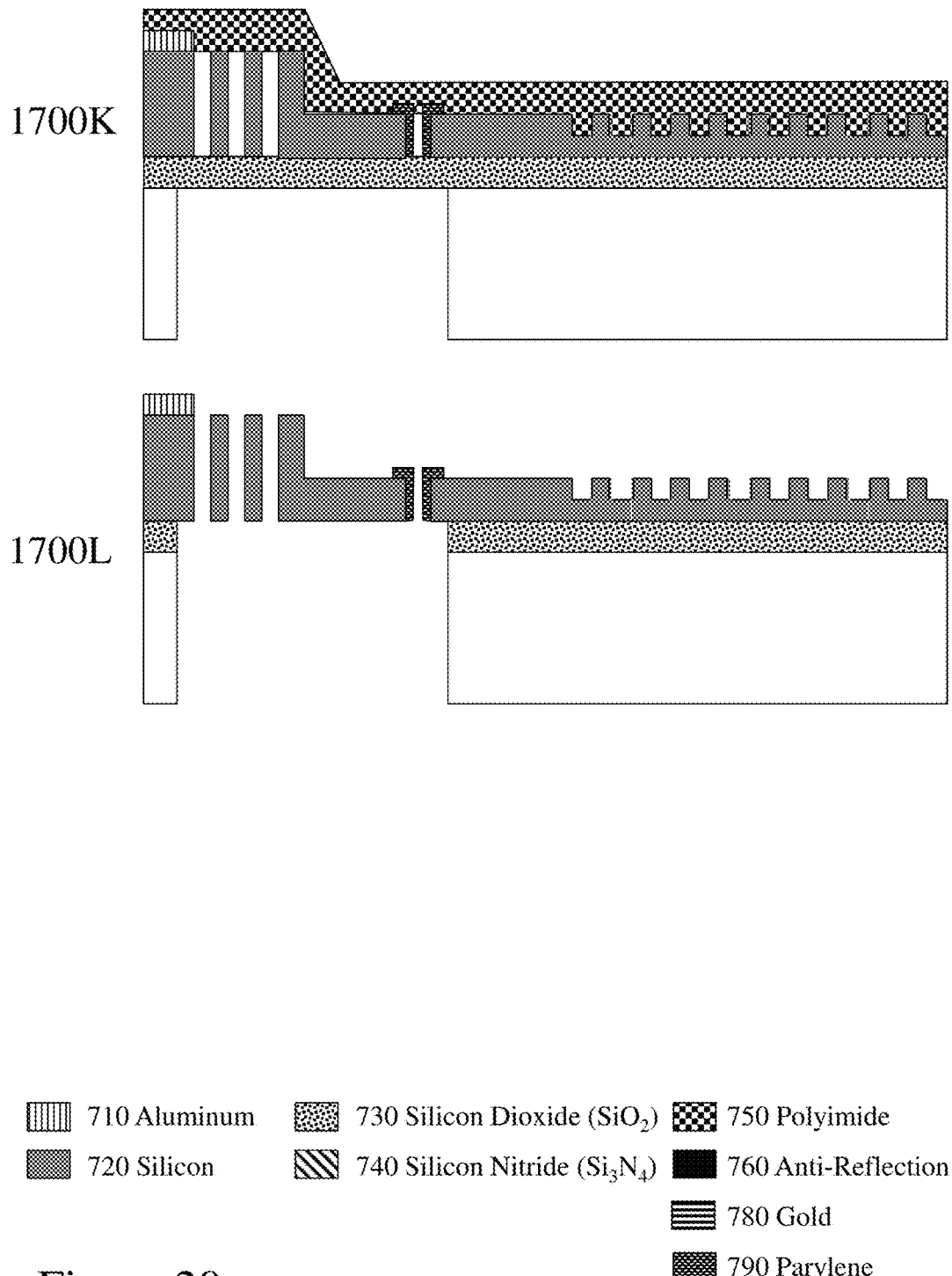

In tenth schematic 1700K in FIG. 20 the substrate, e.g. silicon, is lithographically processed to define the trench below the MEMS comb drive and SC-MEMSM mirror sections of the WADER circuit. This may, for example, be via a DRIE using $SF_6$—$C_4F_8$ stopping at the $SiO_2$ 720 layer. Then in eleventh schematic 1700L the $SiO_2$ 720 is etched from the backside using an RIE process, for example, followed by resist stripping, wafer dicing, polyimide removal by plasma ashing, for example, and mechanical polishing of the WADER circuit die sidewall for connection between the channel waveguide and optical fiber.

3. Semi-Circular MEMS Mirror (SC-MEMSM) Actuator Design

Figure 21:
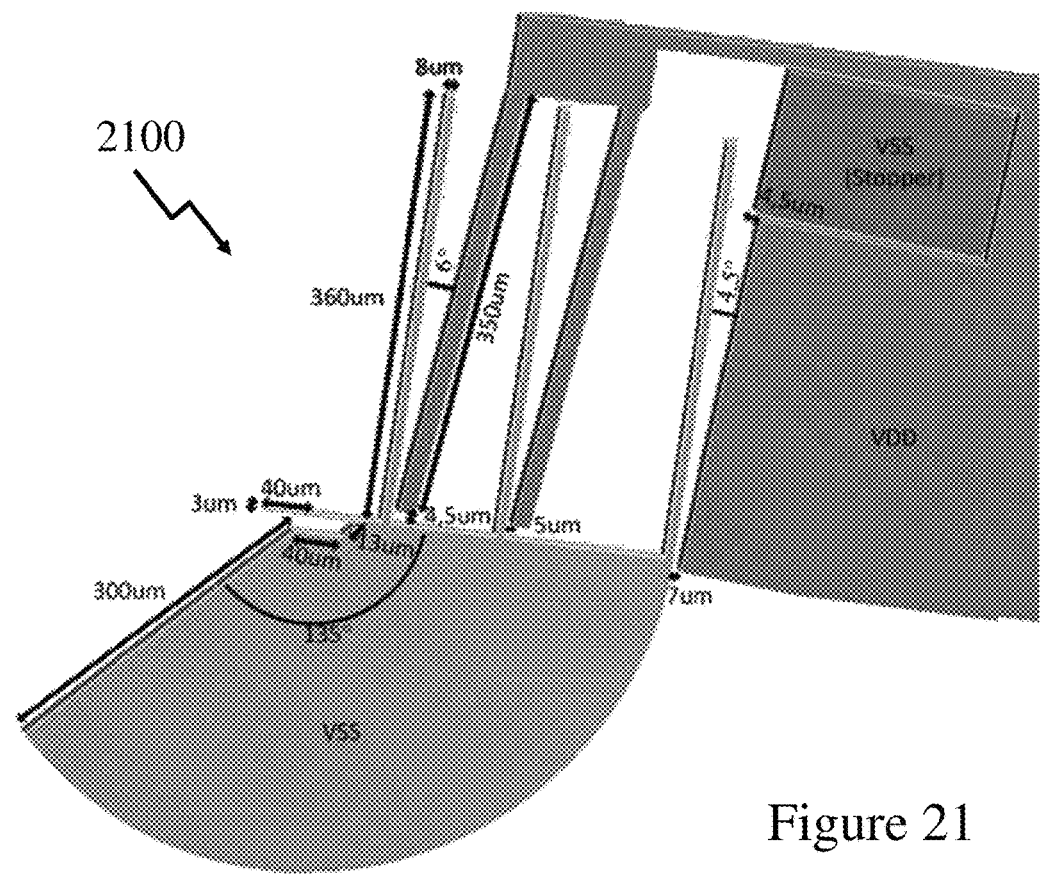
FIG. 21 depicts a semi-circular MEMS mirror (SC-MEMSM) and actuator according to an embodiment of the invention.
Figure 21:
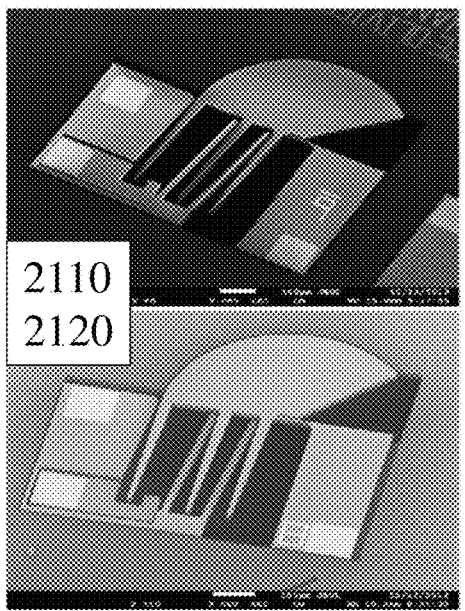
Figure 21:
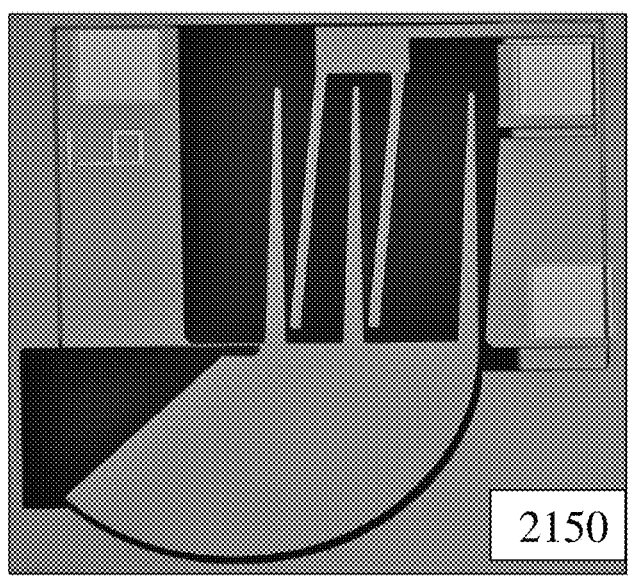

Referring to FIG. 21 there is depicted a semi-circular MEMS mirror (SC-MEMSM) design 2100 according to an embodiment of the invention exploiting electrostatic actuation with slanted fingers. Accordingly as designed the SC-MEMSM will rotate when the 8 μm SC-MEMSM fingers are electrostatically attracted to the drive contacts. The SC-MEMSM finger adjacent the solid $V_{DD}$ electrode is angled at 4.5° whilst the other SC-MEMSM fingers adjacent $V_{DD}$ electrode fingers are angled at 6°. The disc of the SC-MEMSM subtends an arc of 135° and is attached via a 3 μm pivot element to the $V_{SS}$ electrode. However, it would be evident that the mirror shape attached to all the actuators presented herein could be readily modified and/or have any subtending angle. Such design factors will be determined by the optical circuit within which the SC-MEMSM is used. Towards the end of the solid $V_{DD}$ electrode by the SC-MEMSM finger a stopper electrode is provided which is selectively biased to $V_{SS}$. Also depicted in FIG. 21 are first to third scanning electron microscope (SEM) images 2110, 2120, and 2150 respectively for the fabricated SC-MEMSM mirror.

Figure 22B:
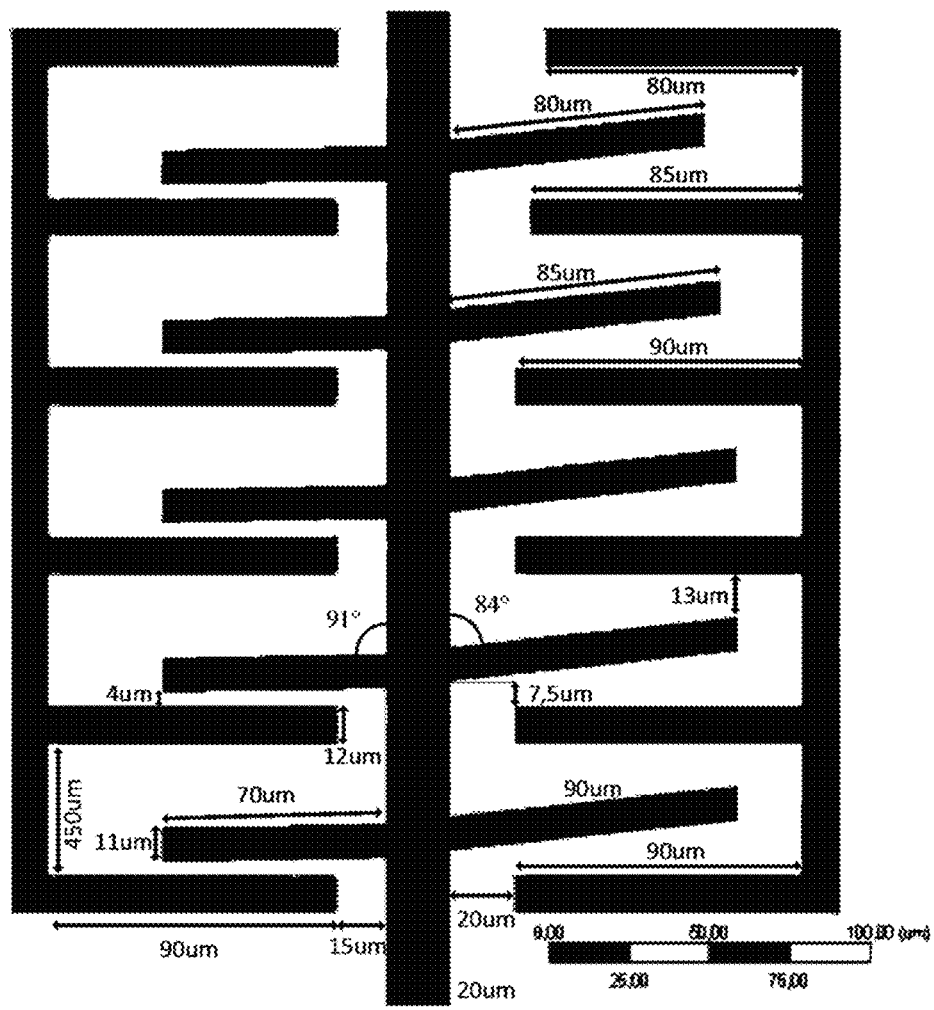
FIG. 22B depicts a detail of the actuator for the SC-MEMSM depicted in FIG. 21A.

Now referring to FIG. 22A there is depicted a semi-circular MEMS mirror (SC-MEMSM) design 2200 according to an embodiment of the invention exploiting electrostatic actuation with a comb drive and slanted finger. Accordingly as designed the SC-MEMSM will rotate when the 11 μm SC-MEMSM fingers within the comb drive are electrostatically attracted to the drive contacts. The SC-MEMSM also comprises a SC-MEMSM finger adjacent the solid $V_{DD}$ electrode is angled at 4.5° whilst the SC-MEMSM comb drive fingers that rotate are angled at 6° where these are attracted towards the other comb drive fingers (right-hand side) and are not angled where these will be repelled away from the other comb drive fingers (left-hand side). The disc of the SC-MEMSM subtends an arc of 135° and is attached via a 3 μm pivot element to the $V_{SS}$ electrode. Towards the end of the solid $V_{DD}$ electrode by the 8 μm SC-MEMSM finger a stopper electrode is provided which is selectively biased to $V_{SS}$. Also depicted in FIG. 22 are first to third scanning electron microscope (SEM) images 2210, 2220, and 2250 respectively for the fabricated SC-MEMSM mirror. Detail for the comb drive portion of the SC-MEMSM drive is depicted in FIG. 22B. Optionally, a second actuator could be added on the other side of the SC-MEMSM mirror to achieve a pull-pull configuration allowing for a greater actuation angle.

Figure 23:
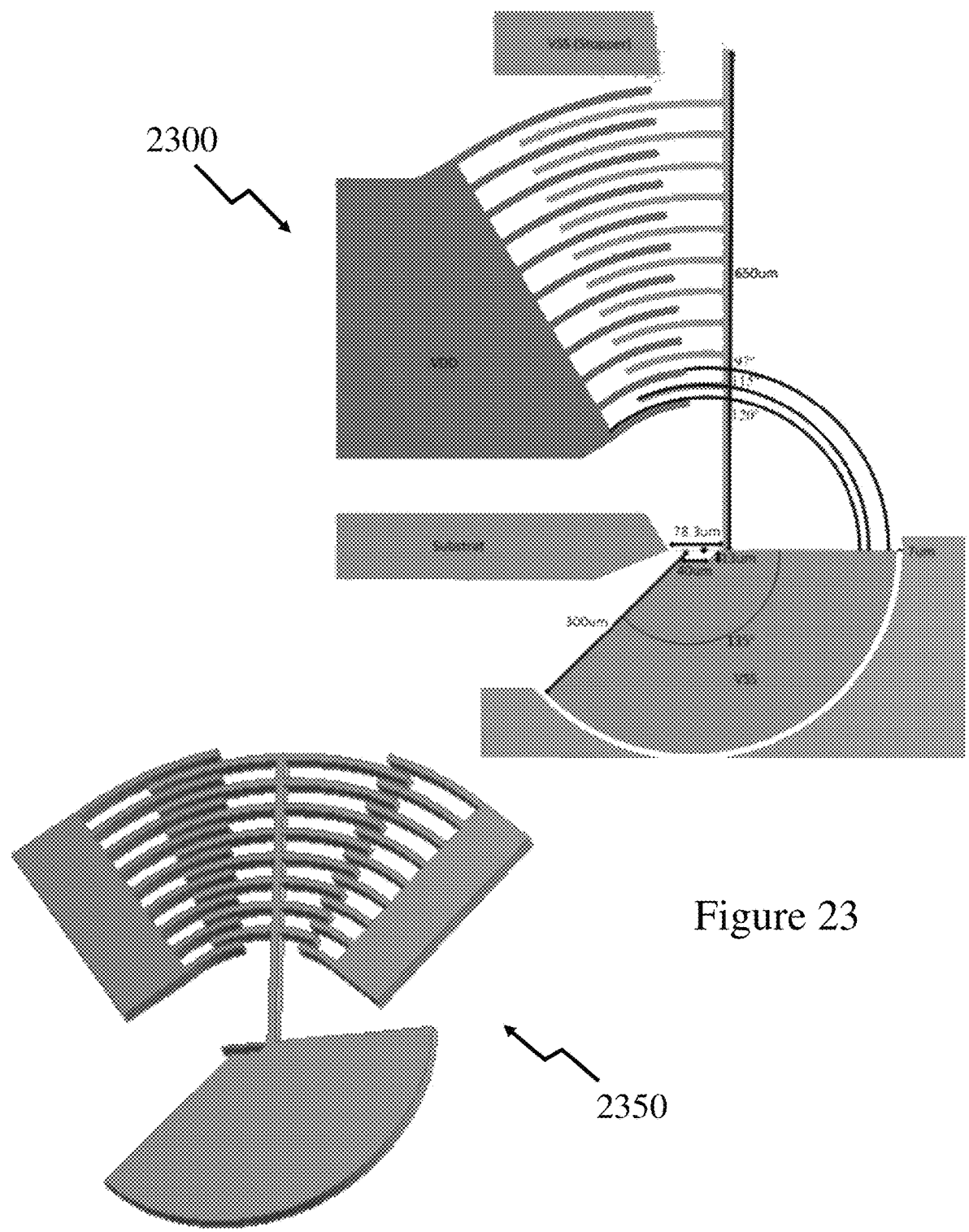
FIG. 23 depicts SC-MEMSMs and actuators according to embodiments of the invention.

Referring to FIG. 23 there is depicted another SC-MEMSM mirror according to an embodiment of the invention wherein the comb drive consists of a plurality of curved fingers biased at $V_{SS}$ which are disposed between the fingers of the electrostatic drive element biased at $V_{DD}$. Optionally, a second electrostatic drive element may be added to the other side end of the SE-MEMSM curved fingers to add another pulling direction and thus increase the actuation angle as shown with SC-MEMSM mirror 2350 in FIG. 23.

Figure 24:
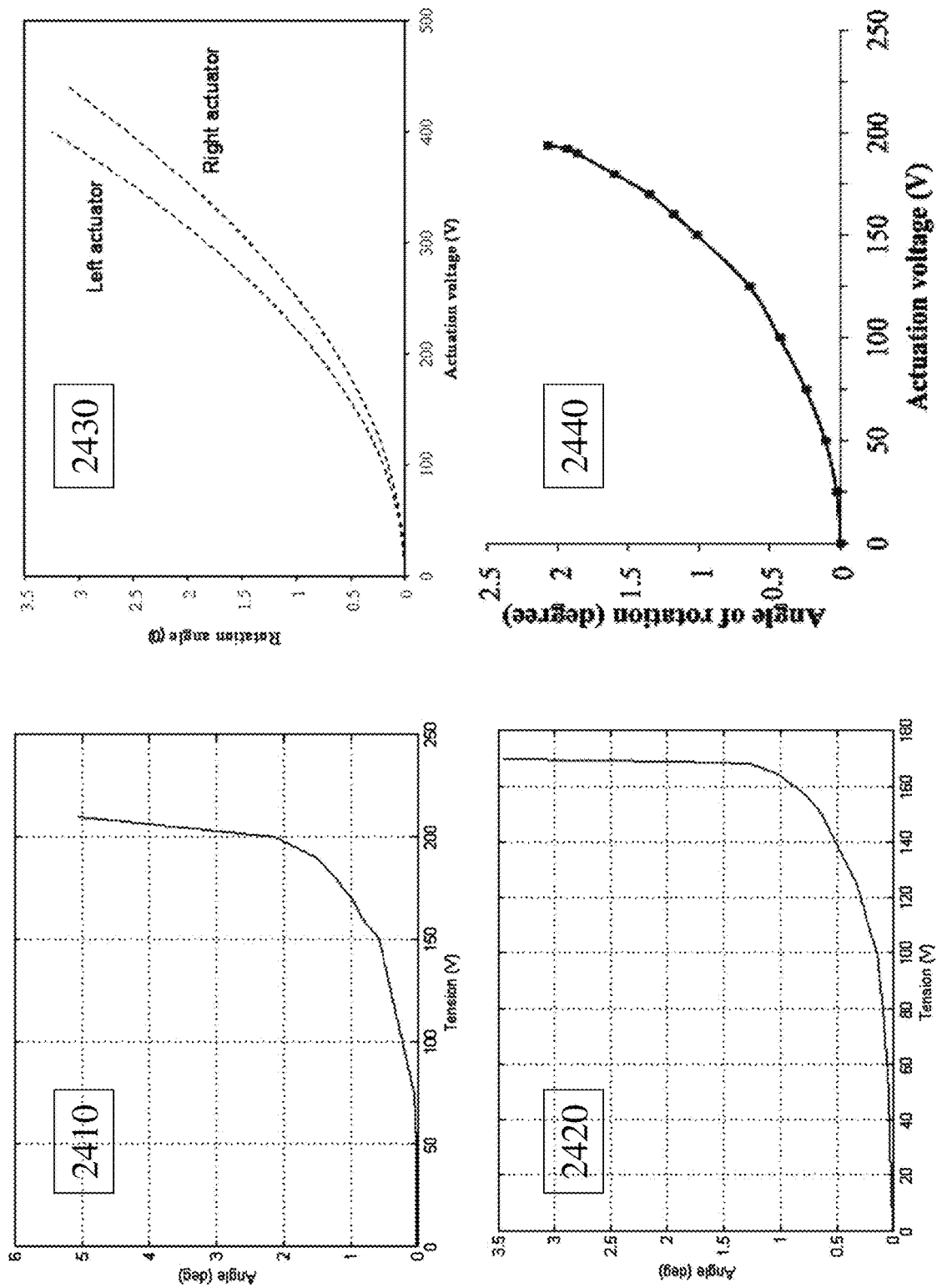
FIG. 24 depicts simulated and measured rotation angle versus electrostatic actuator voltage for the SC-MEMSM and actuator designs according to embodiments of the invention as depicted in FIGS. 21, 22A, and 23.
Figure 25:
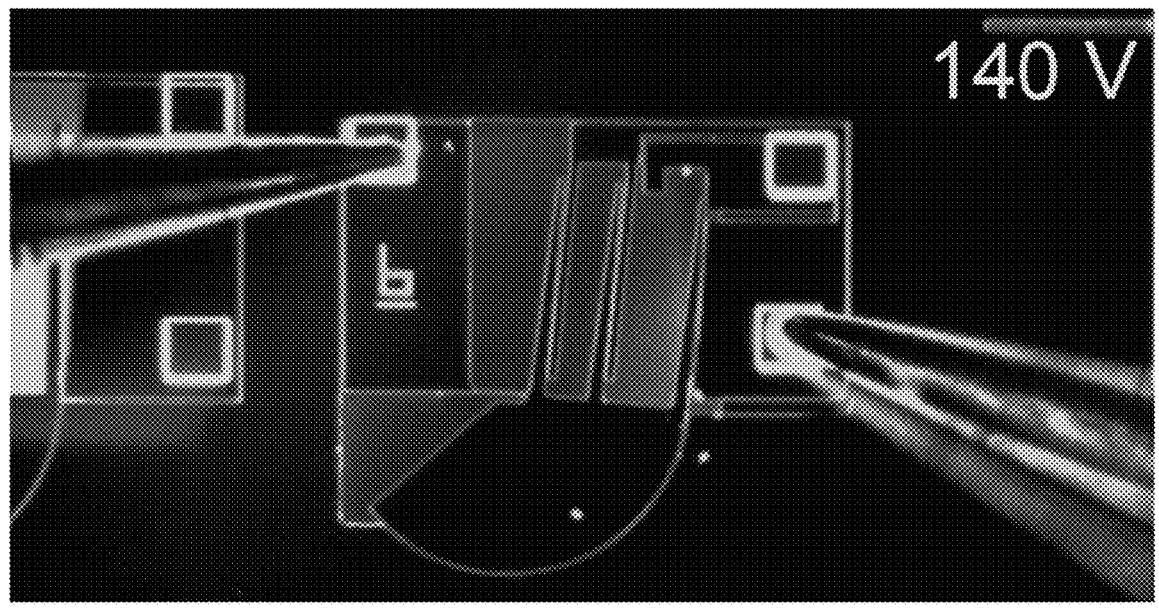
FIG. 25 depicts an optical micrograph of a SC-MEMSM and actuator according to an embodiment of the invention as depicted in FIG. 21 under bias at 140V and the experimental rotation angle versus electrostatic actuator voltage for the design.
Figure 25:
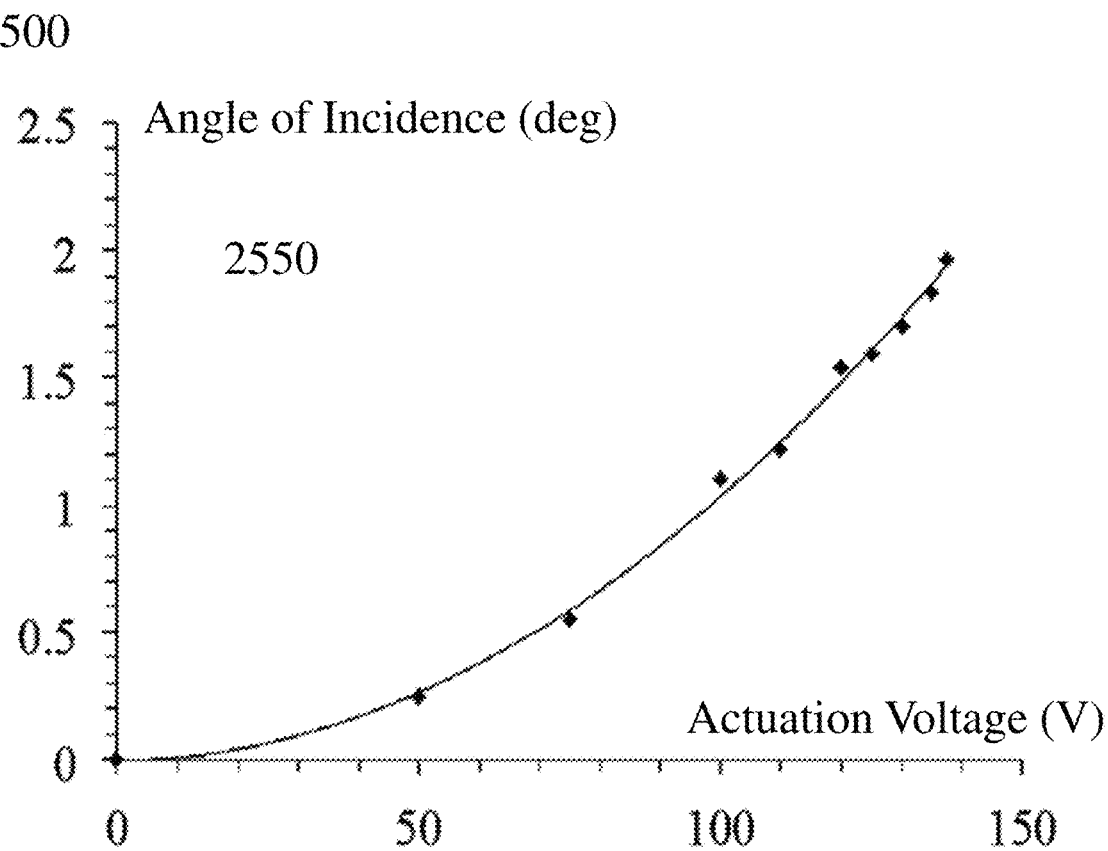

Referring to FIG. 24 there are depicted first to fourth graphs 2410 to 2440 respectively for the SC-MEMSM mirror designs 2100, 2350, 2300, and 2200 respectively. First to third graphs 2410 to 2430 being simulated rotation angle versus voltage plots whereas fourth graph 2440 is a measured rotation angle versus voltage plot. Accordingly these indicate that the required voltage to rotate the SC-MEMSM 2° are approximately 200V, 200V, and 320V respectively from simulations and 170V for the experimental data. FIG. 25 depicts an optical micrograph 2500 of an SC-MEMSM of the design depicted in FIG. 21 biassed at 140V showing the SC-MEMSM rotated around from its unbiased state. Graph 2550 depicts the measured rotation versus voltage wherein a 2° rotation is achieved at 140V. The actuation voltages may be reduced by decreasing the gap size within the respective actuator structures.

4. SC-MEMSM Mirror Design

Within the embodiments of the invention, process flows, and variants discussed and described supra in respect of FIGS. 1 to 25 it would be evident to one skilled in the art that whilst SC-MEMSM designs feature throughout that there are two different classes of SC-MEMSM within these figures that each share a semicircular disk rotating with a small air gap adjacent to a curved planar waveguide structure. However, the rear reflecting mirror surface of the SC-MEMSM differs in the two classes.

The first class is where the rear reflecting mirror surface is a planar mirror such that the optical signals impinging upon it at an angle β° to the normal of the planar surface are reflect and propagate away at an angle β° on the other side of the normal. Such a rear reflecting planar mirror is depicted in FIGS. 4, 6, 10, 17, 21, 22A, 23, 25, and 26. Accordingly a collimated optical signal will reflect and maintain collimation whilst a diverging beam with reflect and still diverge.

The second is a curved back mirror where the reflecting mirror surface has a predetermined profile such that the normal to the mirror surface varies across the surface and hence whilst locally each optical signal will reflect according to the normal at its point of incidence the overall effect of the mirror on beam is determined by the profile of the mirror and the point at which the optical beam impinges. Considering the rear reflecting planar mirror as depicted in FIGS. 1, 2, 8, 15 the surface is concave with respect to the impinging optical beam which is aligned to the axis of the curved mirror surface. As a result the concave rear reflecting mirror results in focusing of a diverging beam such that where the radius of curvature of the rear surface equals its distance from the source of a diverging optical beam it will refocus the beam back at the same distance but laterally offset according to the rotation angle of the SC-MEMSM. Hence, for example the WADER depicted in third schematic 1500E in FIG. 15 has a radius of curvature for the rear reflecting surface of the SC-MEMSM of 2000 μm with the pivot point 2000 μm from the central channel waveguide. The front surface of the SC-MEMSM is the curved surface of radius 300 μm However, it would be evident that other profiles for the rear reflecting mirror surface may be employed according to the functionality of the overall optical circuit and the characteristics of the mirror required. For example, the rear surface may be parabolic to focus an impinging collimated beam or generate a collimated beam from an optical source. In addition, the surface could be corrugated in order to implement a movable dispersive element, e.g. an echelle grating.

Figure 26:
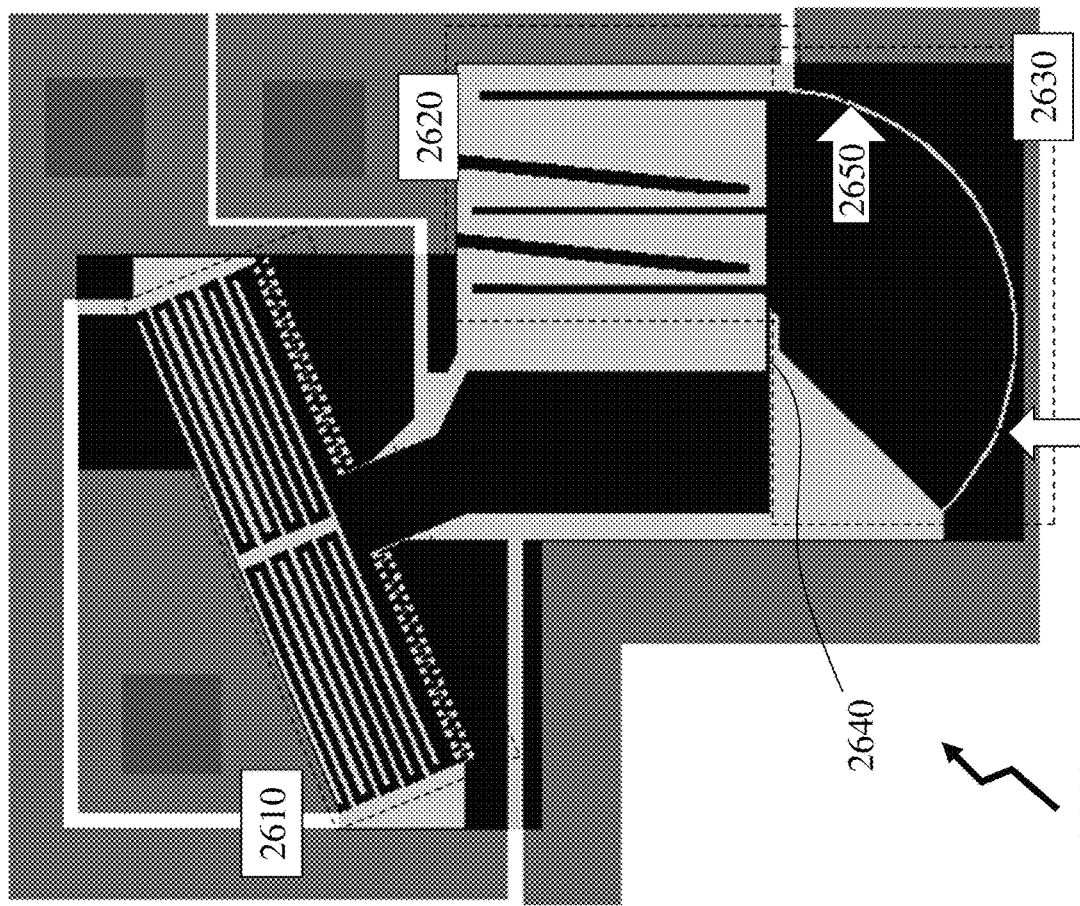
FIG. 26 depicts a SC-MEMSM and actuator with an additional linear actuator to adjust the separation of the SC-MEMSM from the adjacent structure according to an embodiment of the invention.

As discussed supra with respect to the design and performance of the optical circuits comprising SC-MEMSM elements the size of the gap can factor significantly into this performance. In some optical circuits the SC-MEMSM mirror is employed once to set the device containing the optical circuit, e.g. setting the wavelength of a wavelength tunable transmitter at installation into the network. In others the SC-MEMSM mirror may be periodically or aperiodically set according to a resetting of the device rather than continuously scanned as occurs within the OCT device. In these instances the inventors have established a modified SC-MEMSM 2600 as depicted in FIG. 26 wherein the anchor 2640 for the SC-MEMSM mirror 2630 is moveable through the action of an electrostatic translational (linear) actuator 2610 once rotated by SC-MEMSM drive 2620. Accordingly, the electrostatic linear actuator 2610 may push the SC-MEMSM mirror 2630 towards the surface of the optical circuit after it is rotated through SC-MEMSM drive 2620. Once the rotation is complete the electrostatic linear actuator 2610 may be employed, for example, to close the gap to a predetermined value, close the gap till the SC-MEMSM is in friction contact with the optical circuit, close the gap until the SC-MEMSM contacts short stoppers 2650 on the other side of the air gap, or close the gap to a predetermined value and apply a dithering to the gap such as described below in respect of Section 6. It would be evident that the translational actuator 2610 allows the gap dimension to be reduced significantly from the fabricated one, thereby reducing the optical loss in the air gap as well as the cost of manufacturing and increasing yields of the MEMS.

Figure 27:
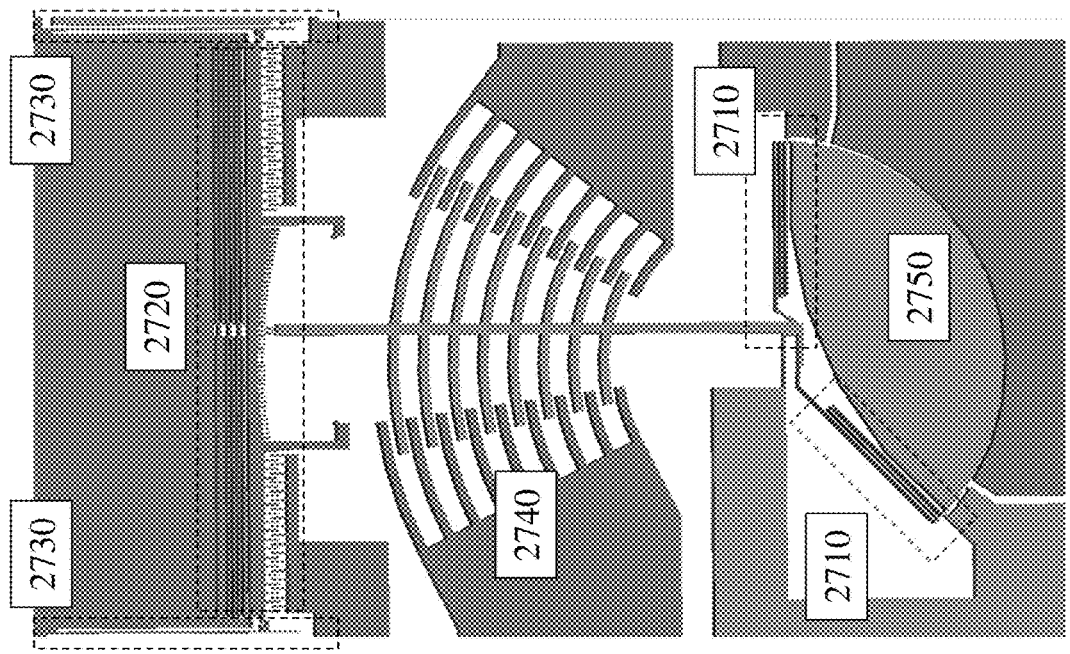
FIG. 27 depicts an alternate SC-MEMSM design according to an embodiment of the invention with rotational actuator in combination with gap actuator to adjust the SC-MEMSM gap and latching/locking actuators to maintain SC-MEMSM position once set.
Figure 31:
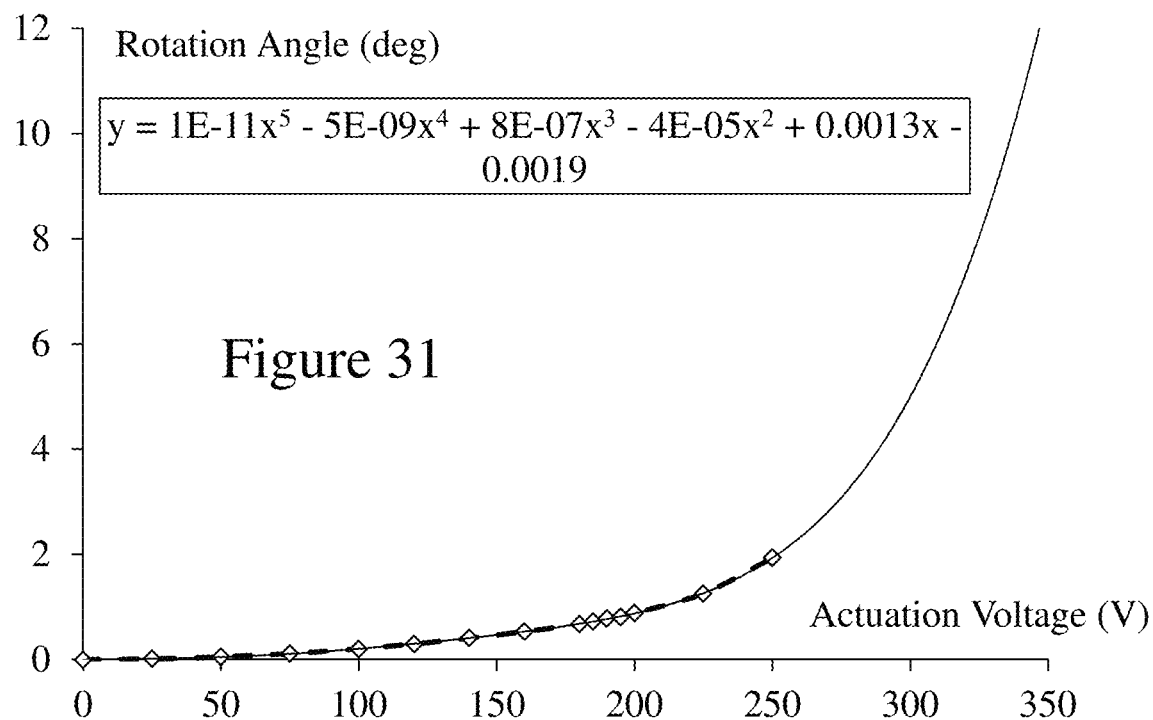
FIG. 31 depicts the simulated rotation angle versus electrostatic voltage for a SC-MEMSM design such as depicted in FIG. 27.
Figure 36:
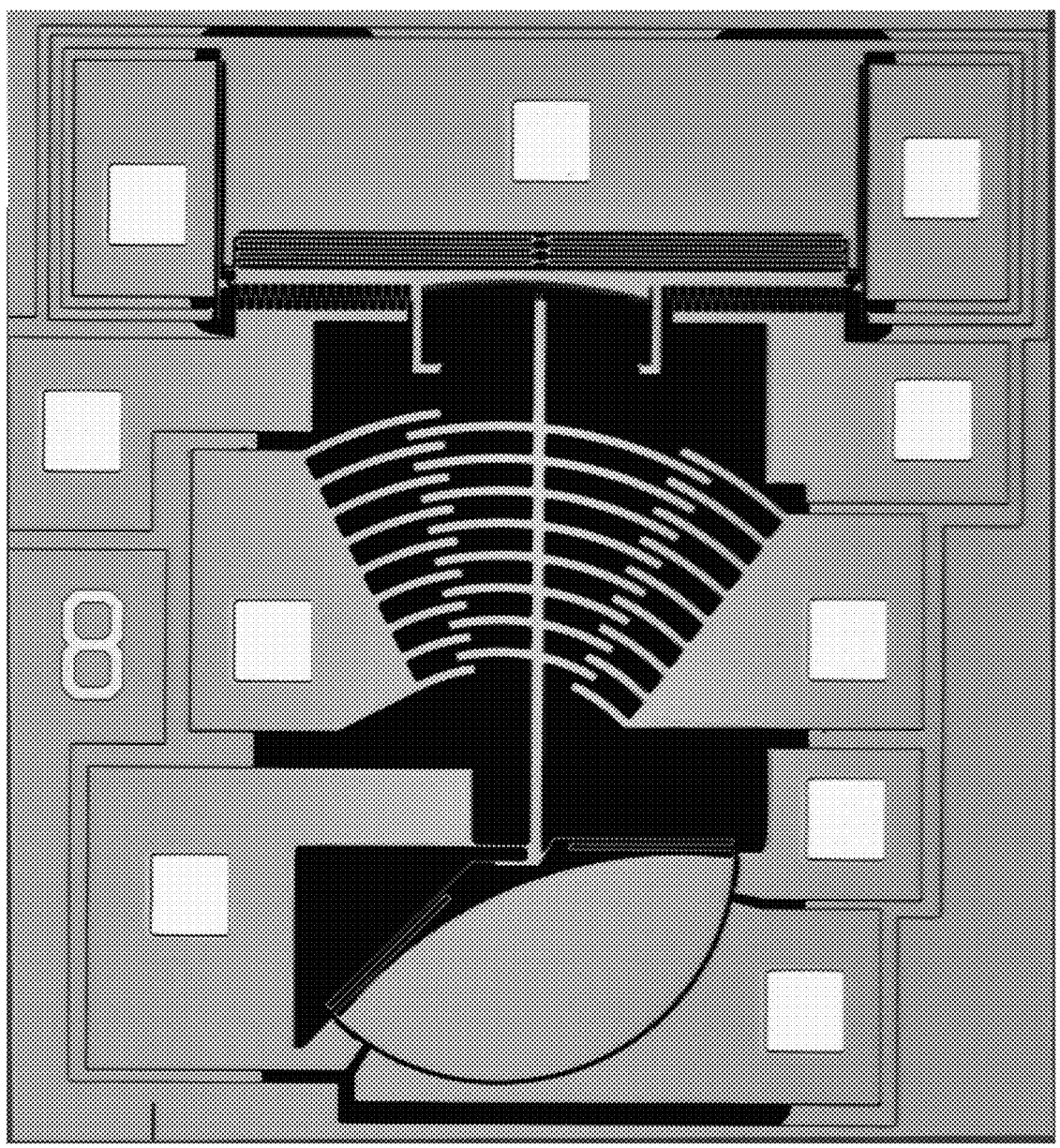
FIG. 36 depicts an optical micrograph of a fabricated SC-MEMSM as depicted schematically in FIG. 27 employing rotator MEMSM actuator, gap closer actuator, latching actuator and latching locks.

Now referring to FIG. 27 there is depicted another variant of an SC-MEMSM according to an embodiment of the invention employing a rotational actuator 2740 controlling the rotation of a MEMS mirror 2750 in combination with gap actuators 2710 to adjust the MEMSM gap and latching actuator 2720/locking actuators 2730 to maintain MEMSM position once set. The MEMS rotational actuator 2740 comprises 8 arcuate electrodes of width 12 μm with different radius to the ground electrodes disposed at either end such that on one end the gaps are 10 μm/7 μm to the outer/inner electrode and at the other end they are 7 μm/10 μm. The arm between rotational actuator 2740 and MEMS mirror 2750 has a width of 12 μm. The MEMS mirror 2750 itself has a rear surface (reflecting surface) of radius 550 μm and a front surface radius of 300 μm. Referring to FIG. 31 there is depicted the simulated rotation angle versus electrostatic voltage for a MEMSM design such as depicted in FIG. 27 indicating that a rotation angle of 5° can be achieved for 350V electrostatic potential. An optical micrograph of the SC-MEMSM depicted in FIG. 27 is presented in FIG. 36.

5. MEMS Gap Actuator

Figure 28:
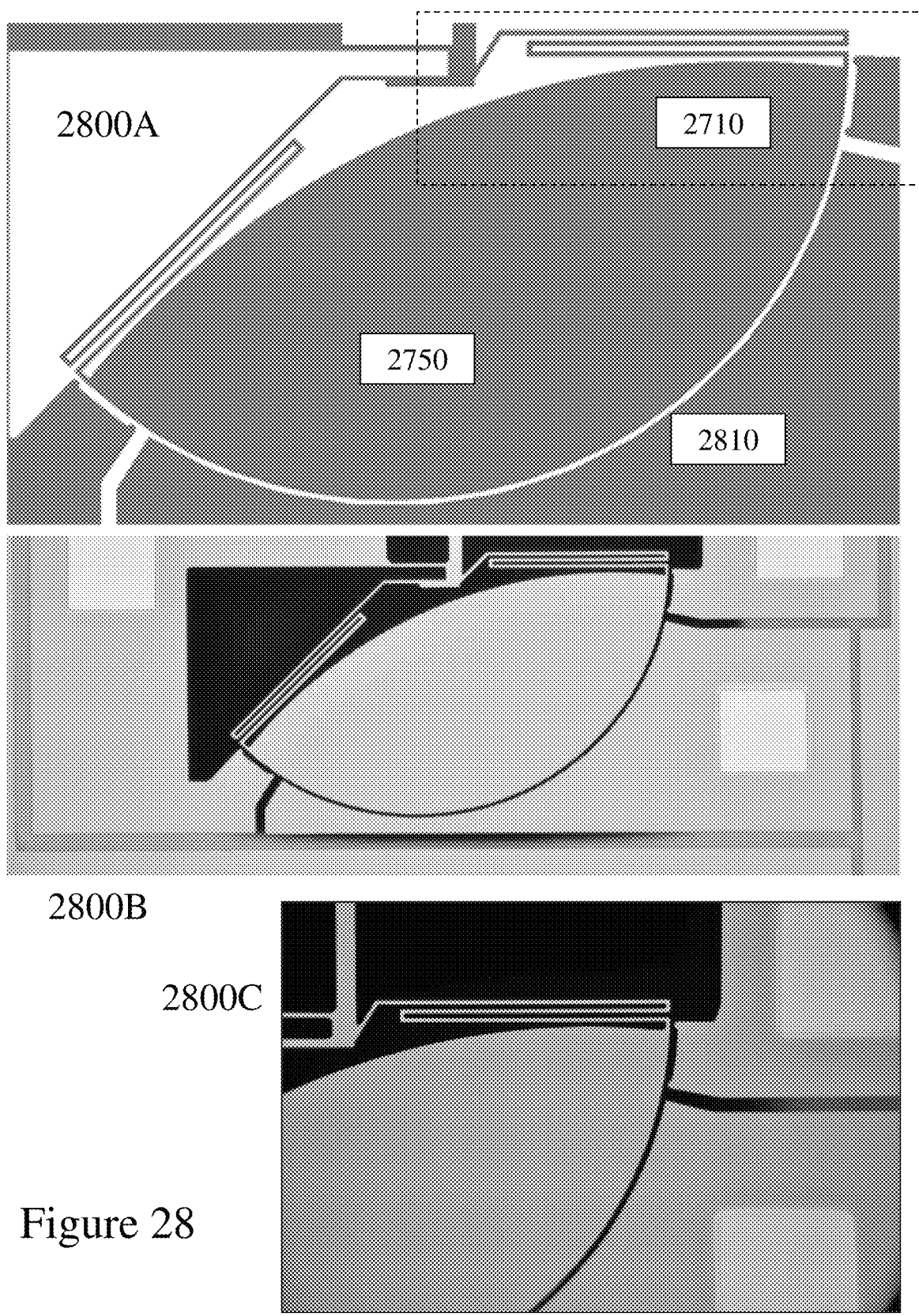
FIG. 28 depicts an example of a gap actuator for SC-MEMSM devices according to an embodiment of the invention.
Figure 32:
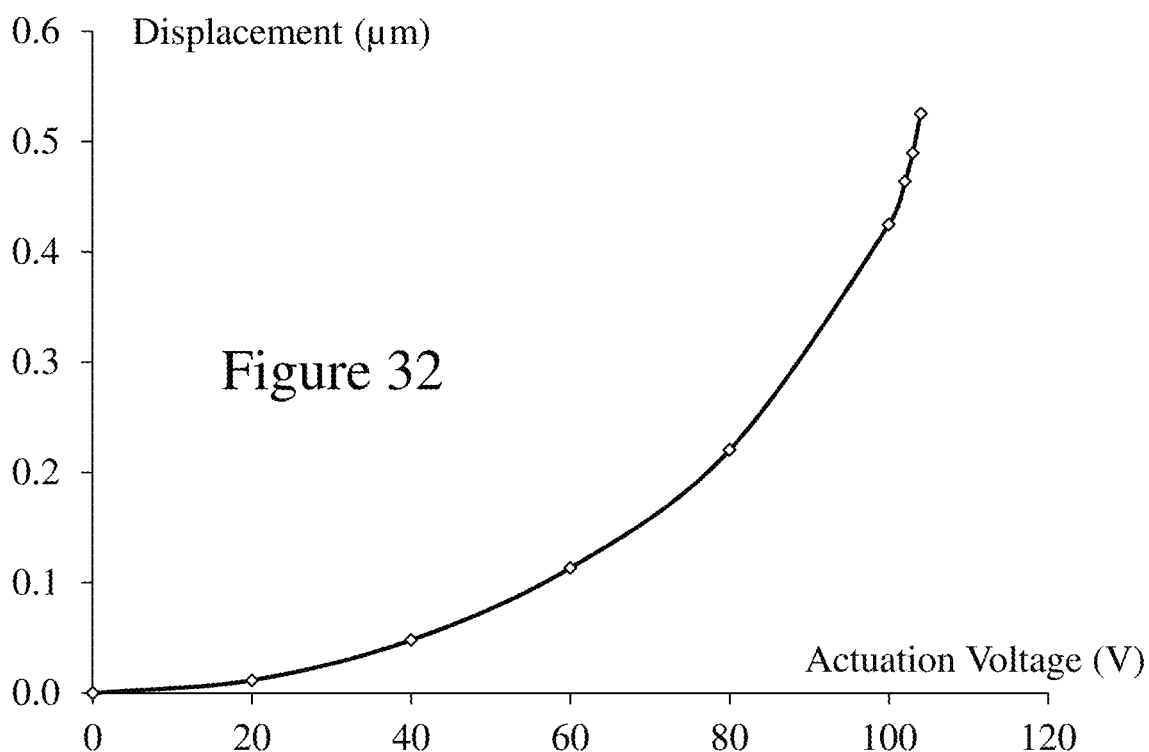
FIG. 32 depicts the displacement versus electrostatic voltage for a SC-MEMSM gap actuator such as depicted in FIG. 28.

As indicated within FIG. 27 the SC-MEMSM according to an embodiment of the invention employs a pair of gap actuators 2710 which are depicted in FIG. 28 in first image 2800A together with the MEMS mirror and facet 2810 of the circuit of which the SC-MEMSM forms part. Second and third images 2800B and 2800C in FIG. 28 depict optical micrographs of the structure as fabricated. In operations the gap actuators 2710 allow the front surface of the MEMS mirror 2750 to be moved relative to facet 2810. Accordingly, the optical gap between the front surface of the MEMS mirror 2750 and facet 2810 can be adjusted and/or eliminated. Referring to FIG. 32 depicts the displacement versus electrostatic voltage for a MEMSM gap actuator 2710 is depicted indicated a movement of approximately 0.5 μm at an electrostatic potential of 100V.

The MEMSM gap actuators 2710 are intended to bring the MEMS mirror 2750 closer to the fixed portion of the optical integrated circuit, e.g. facet 2810. This allows for a reduction in optical loss within the air gap. The minimum separation is defined by the fabrication process grid size utilised to create stoppers and not the separation dictated by the minimal feature size of the process. This allows the inventors to significantly reduce the size of the air gap between the mirror and the input and output waveguides when the gap is closed, and hence to minimize optical propagation losses. Within the exemplary embodiment depicted in FIG. 28 the gap closer structure developed was implemented with a fabrication process having a 3 μm minimum feature size consist of two springs of three sections of length 205 μm and width 3 μm attaching each side of the mirror to the mast, namely the beam connecting the MEMS mirror 2750 to the rotational actuator. These springs allow a movement towards the actuator that reduces the gap to a "fixed" distance managed by the "stoppers" on each side of the actuator. Those stoppers being 3 μm "dimples" to prevent mirror adhesion to the actuator. The gap closer closes the gap using a 100V actuation voltage as shown from the measurements in FIG. 32.

6. MEMS Latching Actuator

Figure 29:
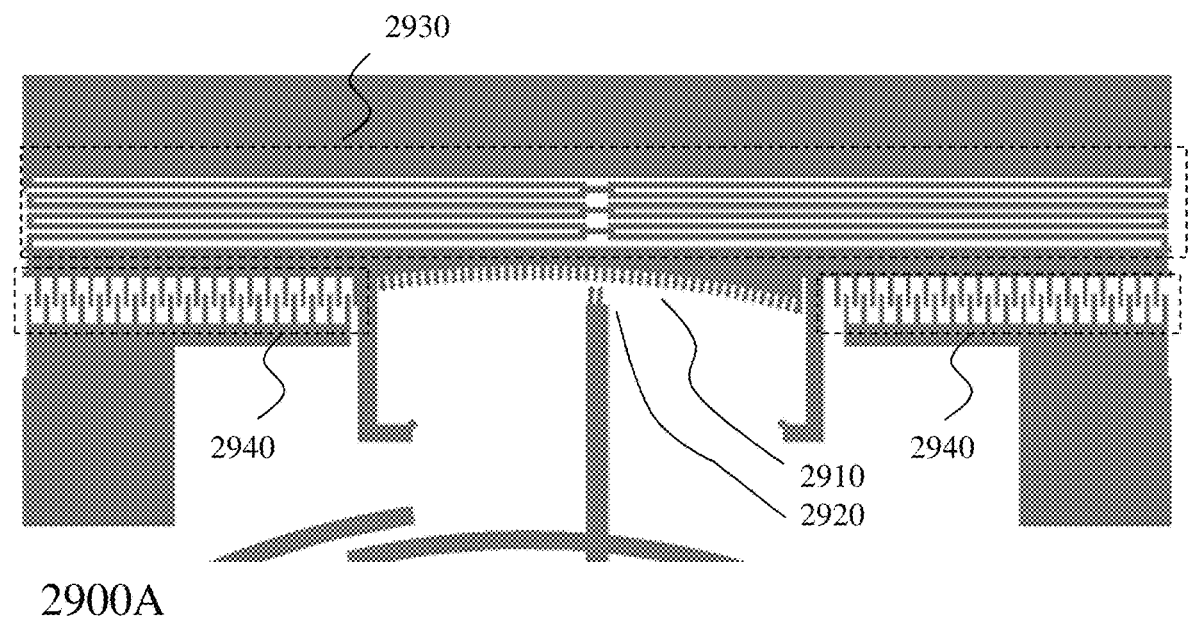
FIG. 29 depicts an example of a latching actuator for SC-MEMSM devices according to an embodiment of the invention.
Figure 29:
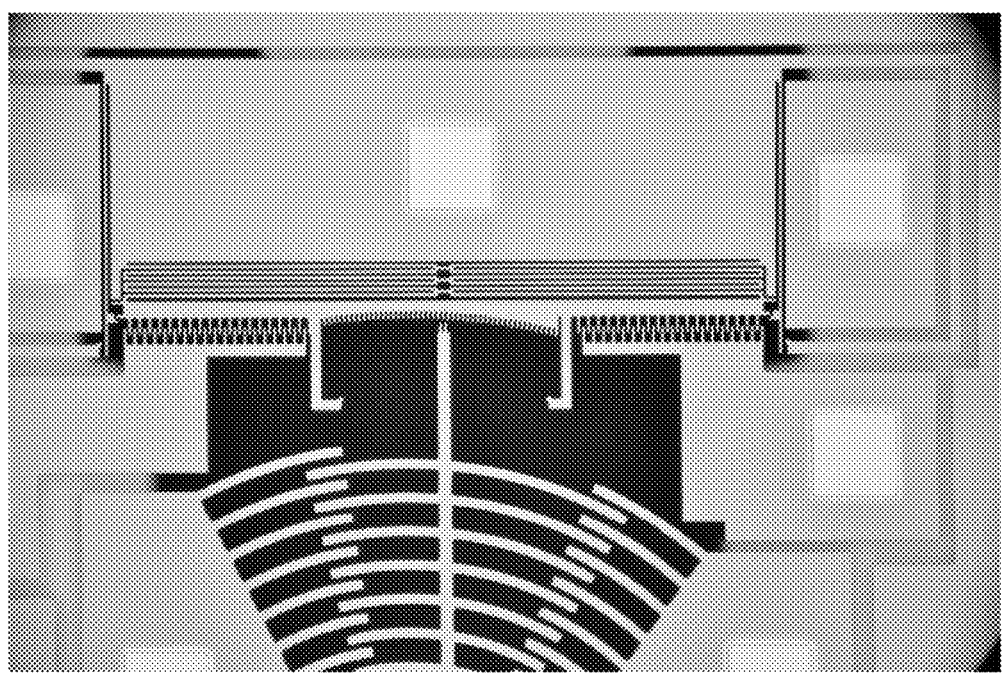
Figure 30:
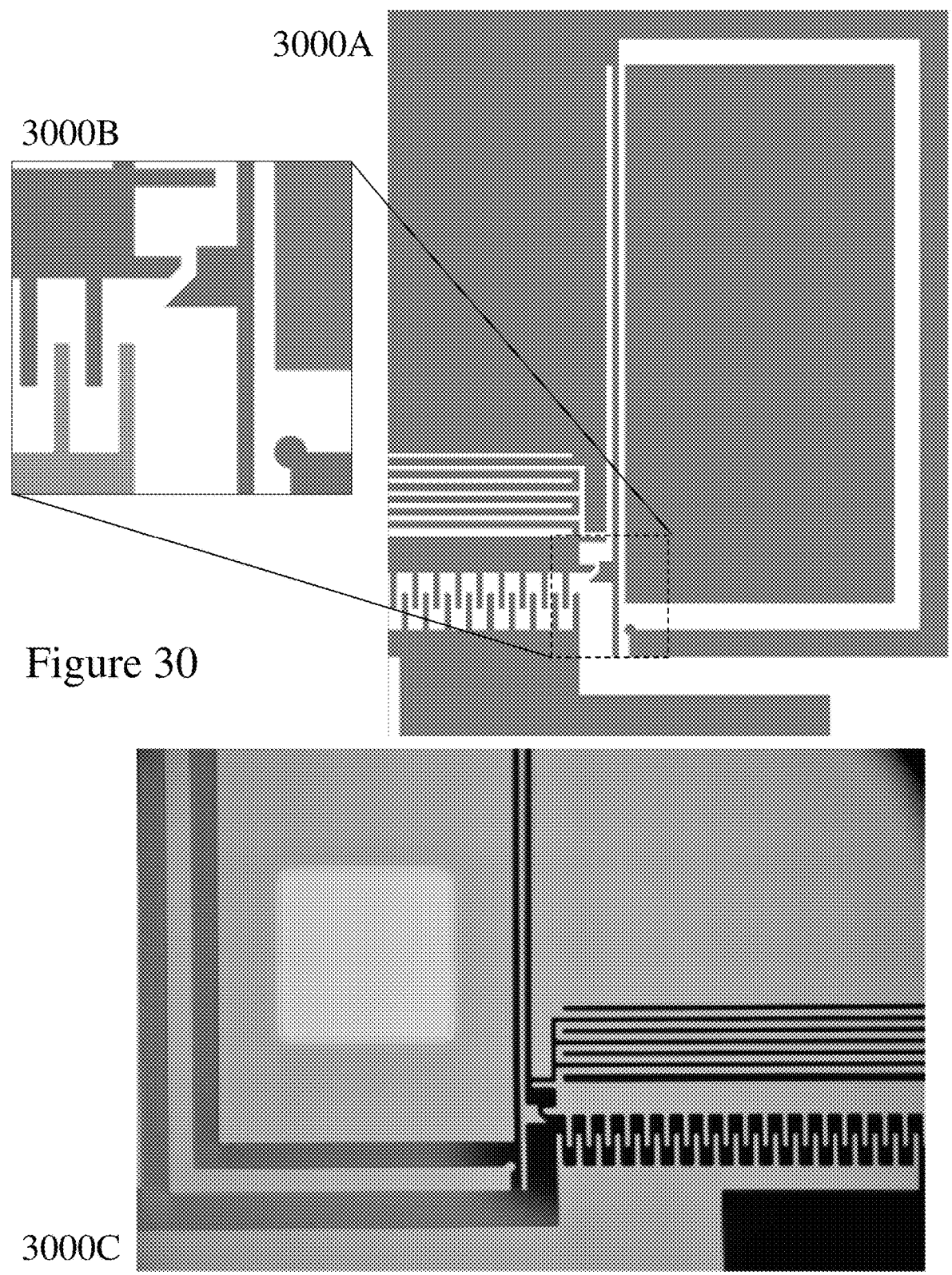
FIG. 30 depicts an example of a latching lock for a latching actuator for SC-MEMSM devices according to an embodiment of the invention.
Figure 33:
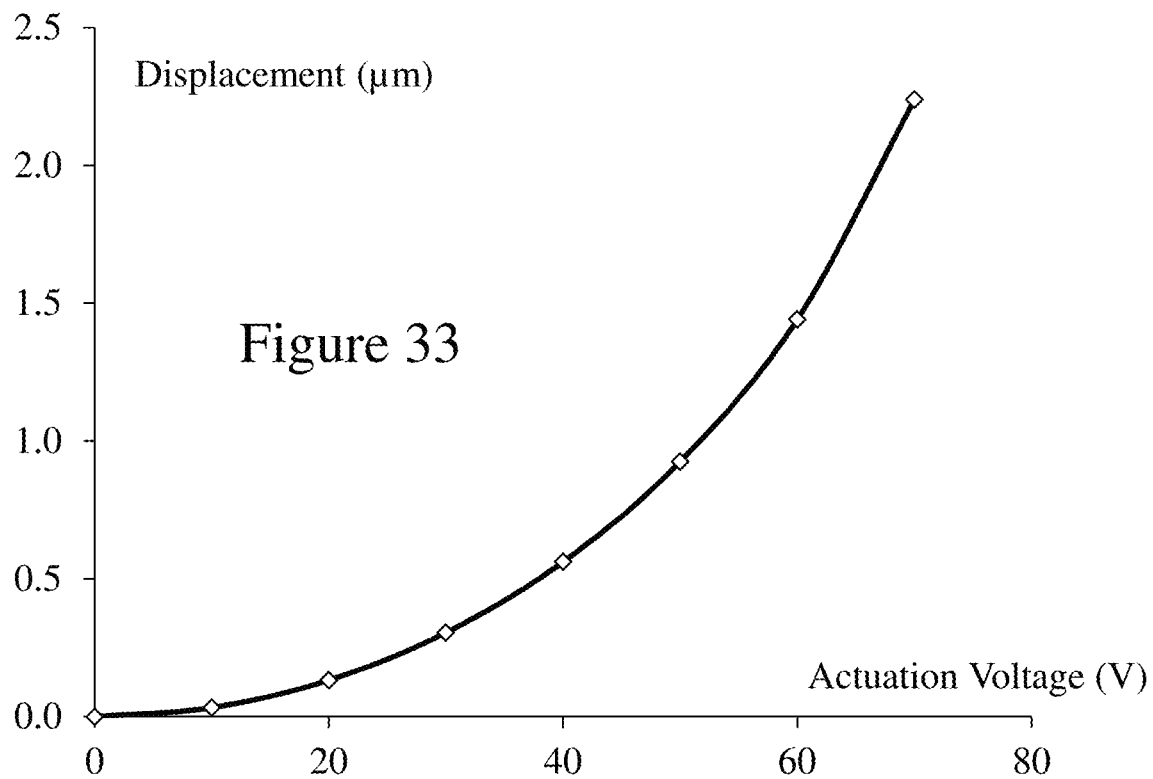
FIG. 33 depicts the displacement versus electrostatic voltage for a SC-MEMSM latching structure such as depicted in respect of FIG. 29 for latching the rotation angle of MEMS mirror.
Figure 34:
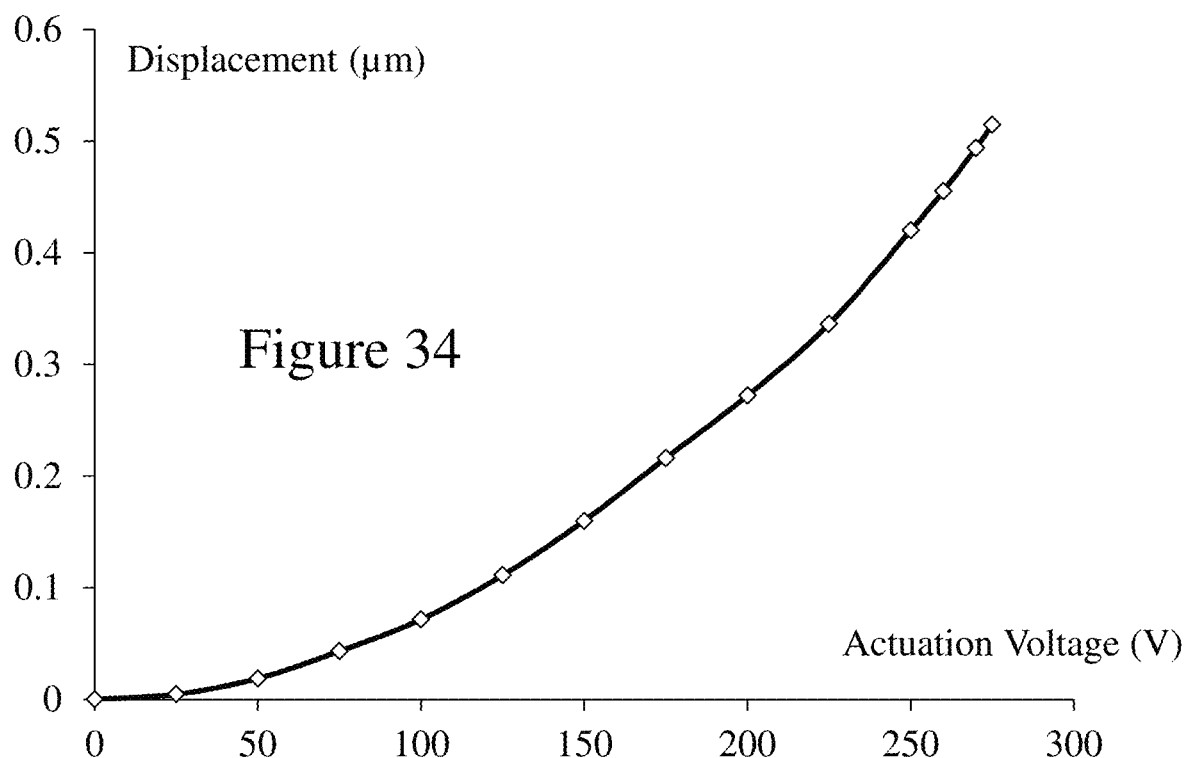
FIG. 34 depicts the displacement versus electrostatic voltage for a SC-MEMSM latching lock such as depicted in respect of FIG. 30 for locking the latch mechanism allowing it to maintain position without applied electrostatic control.

Once the MEMS mirror has been rotated to the appropriate angle for alignment it would be beneficial to lock the mirror into position allowing the electrostatic voltage to be removed and improving the optical integrated circuits performance against vibration and mechanical shock, for example. Referring to FIG. 29 in first image 2900A there is depicted an example of a latching actuator for MEMSM devices according to an embodiment of the invention employing mast teeth 2910 on the end of the mast 2920 (connecting beam from the rotational actuator to the MEMS mirror distal to the MEMS mirror which engage with latch teeth 2910 under control of the latching actuator 2930 which provides for movement of the latch teeth 2910 when the latch locks, not depicted but depicted in FIG. 30. The latching actuator 2930 exploits electrostatic actuators 2940. Second image 2900B in FIG. 29 depicts an optical micrograph of a fabricated latching structure which is depicted in first image 2900A. Referring to FIG. 30 there is depicted detail of the latching lock at the end of the latching structures 2940 in first and second images 3000A and 3000B with an optical micrograph of the fabricated structure in third image 3000C. FIG. 33 depicts the displacement versus electrostatic voltage for the MEMSM latching structure such as depicted in respect of FIG. 29 for the latching mechanism indicating 2.5 µm displacement at approximately 80V. FIG. 34 depicts the displacement of the latch lock under electrostatic actuation.

Accordingly, the latching actuator locks the mast position and consequently immobilizes the mirror at a specific angle. Moreover, this stopping action is reinforced upon activation of the gap closer through the torsion of the mast. Within the exemplary embodiment depicted in FIG. 29 the latch structure was developed for implementation with a fabrication process having a 3 µm minimum feature size. As such the structure comprises a curved rack with 48 tooth, where each teeth is 3 µm wide and 11 µm deep and allow the mast the get inserted in between teeth. The mast is able to be locked into place and it can do so for 19 different positions within an 8 degree coverage, which give an angular resolution of approximately 0.45 degrees. It would be evident that alternate designs would provide for different angular resolution. The electrostatic actuator of the latch is using two linear racks of 18 teeth of width 3 µm and length 15 µm allowing a displacement of 8 µm of the latch, anchored by 2 springs arms of 3.5 µm thickness and 375 µm long including 3 spires. This structure requires an 80V actuation voltage to lock the mast into position with a displacement of approximately 2.5 µm as depicted in FIG. 32.

Whilst the latching described in respect of FIG. 29 allows the rotation angle of the MEMS mirror to be locked it does not prevent resetting of the MEMS mirror position under failure of power to the module or failure of the electrostatic control circuit. Accordingly, as described in respect of FIG. 30 the latch lock prevents the latch from going back to its initial position after it reaches the locked position. This allows for the MEMS mirror to remain in its set position once the actuation voltage is removed from the actuators, simplifying its use under a set-and-forget usage paradigm or in order to make the system more energy efficient and able to survive power outages. Accordingly, no DC bias is required once the latch lock has been engaged to keep the mirror in position.

Within the exemplary embodiment depicted in respect of FIG. 30 the latch lock was developed to be implemented with the same fabrication process having a 3 µm minimum feature size consistent with the other MEMS elements. The latch lock as depicted in FIG. 30 consists of a mast that can be moved out of the way of the latch by an electrostatic actuator at approximately 350V, see FIG. 34. This frees the motion of the latch relative to the latch lock. When the latch is in position, the voltage is removed and the lock physically blocks the latch into position, preventing it from springing back into its unlatched state. This structure therefore allows a lock that does not require any voltage to maintain its lock. Rather actuating the latch is only required to move the latch lock for latch motion. The angled structure of the latch lock does not allow the release of the latch without latch lock actuation.

7. MEMS Pull-in Reduction

In many MEMS devices a phenomenon referred to as "pull-in" which describes a failure of the device through collapse of a microbeam for example in resonators or the failure of the spring forces within a MEMS element to overcome the electrostatic attraction such that oppositely charged elements snap together. Accordingly, in the prior art implementing a MEMS spring has been viewed as one solution to the issue. However, these are typically complex structures with large footprint.

Figure 35:
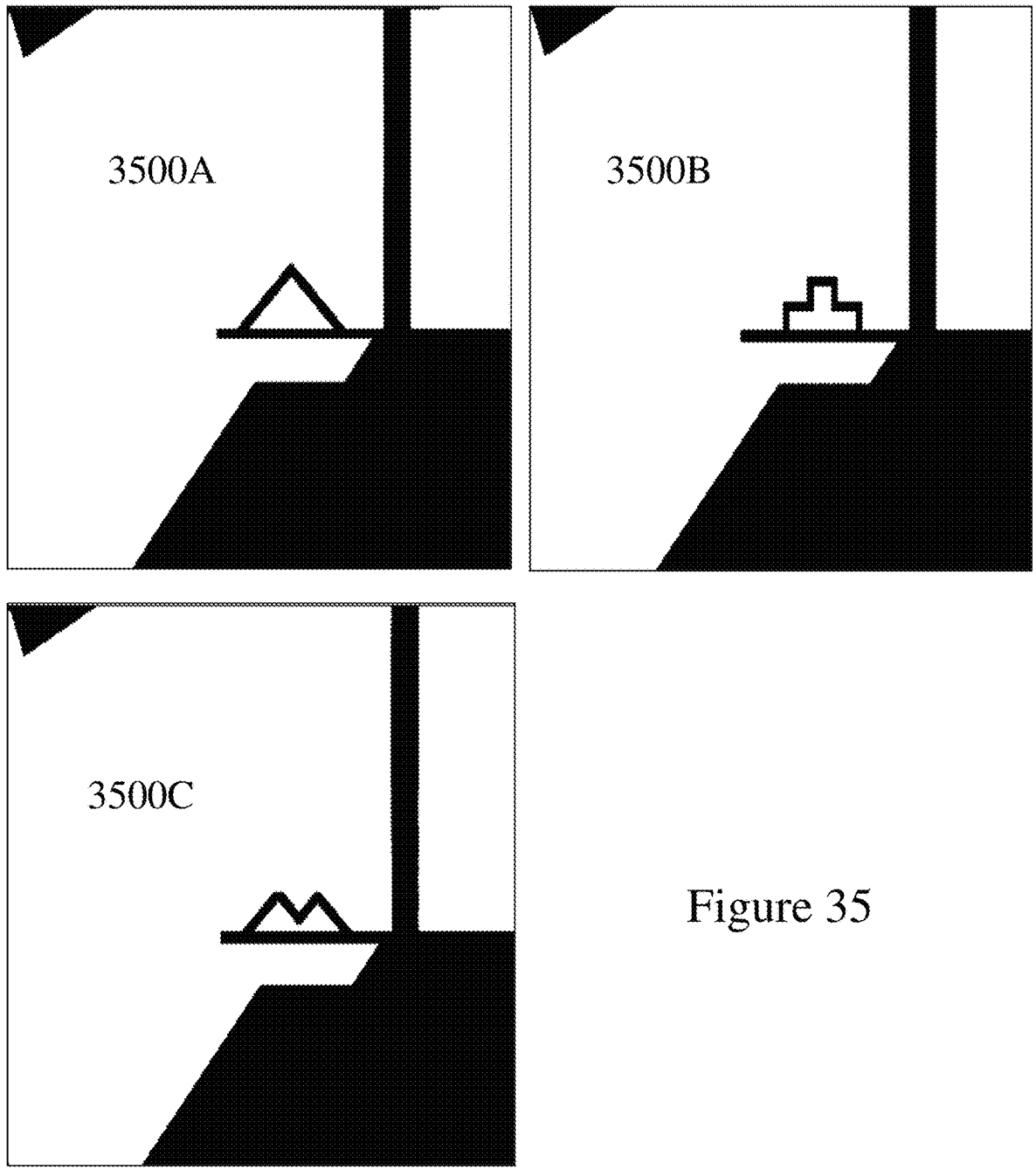

Referring to FIG. 35 there are depicted first to third anchor variations 3500A to 3500C respectively according to an embodiment of the invention wherein a MEMS anchor spring is installed at the anchor to offset the effect of pull-in. As depicted the MEMS anchor spring may be triangular, stepped pyramidic, and dual triangle according to the required strength and its dimensions adjusted to establish the point within the MEMS actuation that it engages as well as the dimensions of its structure modified according to the elastic characteristics sought. Other shapes and geometries may be employed including coil, rectangular, etc.

Beneficially the MEMS anchor spring according to embodiments of the invention provides for a simplification of the structure and reduces the footprint compared with prior art springs on the MEMS structure. Additionally, the MEMS anchor spring reduces elastic stress and plastic deformation of the spring as the MEMS anchor spring is only required to handle a small displacement rather than the full displacement. It also reduces the risk of short-circuits when placed close to other structures.

8. Temperature Compensation and Control

As discussed supra in respect of FIG. 26 lateral motion under an electrostatic comb drive can be employed to vary the optical gap between the SC-MEMSM mirror and the optical waveguide(s). Whilst the gap may be reduced or closed to reduce the inherent loss present within the optical system the gap may also be modulated yielding a low frequency dither signal which may be used to adjust aspects of the operation of the optical circuit and/or optical system incorporating the SC-MEMSM mirror according to embodiments of the invention. For example, the modulated gap signal may be used to provide directly temperature compensation for example through a signal from a temperature sensor or as an optically based temperature sensor to provide feedback to other control circuits and/or elements for similarly managing the performance of the optical circuit and/or optical system.

This dynamic gap actuation could also be applied to others components of the WADER. For example, when the Si 720 and SiO2 730 are etched from the backside using ME/DRIE processes as depicted in the tenth and eleventh schematics 1000J and 1000K in FIG. 13 and eleventh and twelfth schematics 1700K and 1700L in FIG. 20 then the Bragg reflectors may be similarly "released" by removing the Si 720 and SiO2 730. Accordingly, the Bragg reflectors could be actuated mechanically if they were suspended in order to allow for their tuning and thus achieve temperature compensation. Alternatively, they may be electrically activated through heaters wherein the substrate Si 720 removal and SiO2 730 etching provide for a significant reduction in the thermal mass to be controlled.

It would be evident that this mechanical compensation could be included within a feedback loop that would essentially be using an accurate temperature sensor to establish the correct mirror gap size and the Bragg reflector deflection. This integrated control allows for a more compact control and regulation subsystem.

Within embodiments of the invention described above in respect of FIGS. 1 through 34 then it would be evident to one skilled in the art that the embodiments have been described with respect to a pair of specific applications. However, in other embodiments of the invention:

the Bragg gratings may be employed to filter forward propagating signals that proceed to other portions of the optical circuit and/optical system;

the Bragg gratings may be employed to reflect a predetermined portion and propagate the remainder;

the SC-MEMSM mirror and/or the optical circuit may couple to free space optics rather than waveguide optical circuit elements;

the SC-MEMSM mirror may scan an optical signal;

the Bragg gratings may be formed using other techniques than cladding modulated first order gratings including, but not limited to, waveguide width variations, different optical materials, doping, ion implantation, and photoinduced refractive index variations;

the Bragg gratings may be uniform, sampled, apodized, chirped, and tilted.

Echelle gratings can be incorporated within the structure to achieve diffractive mirrors;

other photonic integrated circuit optical filters may be implemented for wavelength filtering such as Fabry-Perot filters and ring resonators for example.

Within embodiments of the invention described above in respect of FIGS. 1 through 34 then it would be evident to one skilled in the art that the embodiments have been described with respect to particular configurations. However, in other embodiments of the invention and wavelength tunable transmitters, receivers, and transceivers the Bragg gratings may be:

sequential in wavelength across the device;
pseudo-randomly sequenced; and
according to a predetermined wavelength plan.

Within embodiments of the invention described above in respect of FIGS. 1 through 34 then it would be evident to one skilled in the art that the embodiments have been described with respect to particular configurations. However, in other embodiments of the invention configurations may:

exploit multiple SC-MEMSM elements for increased angular range;

exploit paired SC-MEMSM elements to select/deselect a specific wavelength in different portions of an optical device;

exploit additional optical elements within the planar waveguide;

collimating/focusing transmissive grating;
collimating/focusing reflective grating;
polarizers;
multiple optical amplifiers coupling to multiple channel waveguides;
machined waveguide lens;
index induced waveguide lens; and
waveguide Fresnel lens.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device comprising:
a rotatable microelectromechanical system (R-MEMS) formed upon a substrate comprising a platform coupled to a MEMS actuator for rotating the platform relative to the substrate, the platform having at least a front surface and a back surface;
a first planar waveguide disposed on the platform supporting optical signal propagation within a predetermined wavelength range, the planar waveguide having a first surface disposed proximate the front surface of the platform and a second surface disposed towards the back surface of the platform; and
an optical circuit formed upon the substrate supporting optical signal propagation within the predetermined wavelength range, the optical circuit having a facet disposed adjacent to the front surface, wherein
the front surface, first surface, and facet have a predetermined geometrical shape in a plane parallel to the substrate.

2. The device according to claim 1, wherein
in a first configuration:
the second surface of the first planar waveguide has the predetermined geometrical shape in the plane parallel to the substrate and reflects optical signals propagating within the first planar waveguide within the predetermined wavelength range;
the predetermined geometrical shape is an arc of circle;
the facet and front surface have a common centre point for their respective arcs of circles but different radii to define a gap between the facet and front surface;
the second surface has a predetermined radius; and
the optical circuit comprises a second planar waveguide which has the facet of the optical circuit formed within it and a plurality of channel optical waveguides coupled to the second planar waveguide wherein each of channel waveguide of the plurality of channel optical waveguides is coupled to the second planar waveguide at a predetermined position such that it is substantially at the predetermined radius from the second surface for a predetermined rotation of the R-MEMS;
in a second configuration:
the second surface of the first planar waveguide is a reflective dispersive element for optical signals propagating within the first planar waveguide within the predetermined wavelength range;
the predetermined geometrical shape is an arc of circle;

the facet and front surface have a common centre point for their respective arcs of circles but different radii to define a gap between the facet and front surface; and the optical circuit comprises a second planar waveguide which has the facet of the optical circuit formed within it and a plurality of channel optical waveguides coupled to the second planar waveguide wherein each of channel waveguide of the plurality of channel optical waveguides is coupled to the second planar waveguide at a predetermined position such that it is proximate a focus of the reflective dispersive element for a predetermined rotation of the R-MEMS; and in a third configuration:

the second surface of the first planar waveguide has a second predetermined geometrical shape in the plane parallel to the substrate and reflects optical signals propagating within the first planar waveguide within the predetermined wavelength range;

the predetermined geometrical shape is an arc of circle;

the second predetermined geometrical shape is parabolic;

the facet and front surface have a common centre point for their respective arcs of circles but different radii to define a gap between the facet and front surface; and the optical circuit comprises a second planar waveguide which has the facet of the optical circuit formed within it and a plurality of channel optical waveguides coupled to the second planar waveguide wherein each of channel waveguide of the plurality of channel optical waveguides is coupled to the second planar waveguide at a predetermined position such that it is proximate a focus of the parabolic mirror formed by the reflective second surface for a predetermined rotation of the R-MEMS.

3. The device according to claim 1, further comprising
a linear translational microelectromechanical actuator coupled to the R-MEMS, wherein
the second surface of the first planar waveguide has the predetermined geometrical shape in the plane parallel to the substrate and reflects optical signals propagating within the first planar waveguide within the predetermined wavelength range;
the predetermined geometrical shape is an arc of circle;
the facet and front surface have a first predetermined radius; and
in a first position the linear translational microelectromechanical actuator establishes a gap between the facet and front surface allowing for rotation of the R-MEMS relative to the optical circuit; and
in a second position the linear translational microelectromechanical actuator brings the front surface into contact with the facet.

4. The device according to claim 1, further comprising
an anchor attached to the substrate; wherein
the anchor is coupled to the R-MEMS between the platform and the MEMS actuator.

5. The device according to claim 1, further comprising
a linear translational microelectromechanical actuator coupled to the R-MEMS;
a plurality of stoppers disposed at predetermined positions relative to the facet of the optical circuit; wherein
the linear translational microelectromechanical actuator adjusts the size of a gap between the front surface of the platform and the facet of the optical circuit; and a minimum gap the between the front surface of the platform and the facet of the optical circuit is defined by predetermined positions of the plurality of stoppers as at the minimum gap the front surface of the platform abuts the plurality of stoppers.

6. The device according to claim 1, further comprising
a linear translational microelectromechanical actuator coupled to the R-MEMS;
at least one spring of a plurality of springs; wherein
the linear translational microelectromechanical actuator adjusts the size of a gap between the front surface of the platform and the facet of the optical circuit;
the MEMS actuator comprises a first non-rotating portion and a second rotating portion;
the platform and the second rotating portion of the MEMS actuator are joined solely by the at least one spring of the plurality of springs.

7. The device according to claim 6, further comprising
a plurality of stoppers disposed at predetermined positions relative to the facet of the optical circuit; wherein
a minimum gap between the front surface of the platform and the facet of the optical circuit is defined by predetermined positions of the plurality of stoppers as at the minimum gap the front surface of the platform abuts the plurality of stoppers.

8. The device according to claim 6, further comprising
a plurality of stoppers disposed at predetermined positions relative to the facet of the optical circuit; wherein
the plurality of stoppers prevent adhesion of the platform to the portion of the device comprising the optical circuit.

9. The device according to claim 1, further comprising
a linear translational microelectromechanical actuator;
a mast connected to a rotating portion of the MEMS actuator distal to the platform;
a plurality of first teeth disposed on the end of the mast distal to its connection to the MEMS actuator;
a plurality of second teeth disposed on the linear translational microelectromechanical actuator; wherein
in a first position the linear translational microelectromechanical actuator disengages the second teeth from the first teeth allowing the MEMS actuator to rotate the platform; and
in a second position the linear translational microelectromechanical actuator engages a subset of the second teeth with the first teeth locking the rotation angle of the MEMS actuator and platform relative to the optical circuit.

10. The device according to claim 9, further comprising
a second linear translational microelectromechanical actuator; wherein
with the linear translational microelectromechanical actuator in the second position and absent any actuation the second linear translational microelectromechanical actuator engages the linear translational microelectromechanical actuator thereby locking it in the second position; and
with the second linear translational microelectromechanical actuator actuated the linear translational microelectromechanical actuator can be transitioned from the second position to the first position.

11. The device according to claim 1, further comprising
an anchor attached to the substrate; and
an anchor spring; wherein
the anchor is coupled to the R-MEMS between the platform and the MEMS actuator;
the anchor spring is attached to the anchor; and the anchor spring engages against a predetermined portion of the R-MEMS once the MEMS actuator has rotated past a predetermined angle in order to counter a pull-in effect arising from electrostatic actuation of the R-MEMS.

12. The device according to claim 11, wherein
the anchor sprint at least one of:
   increases the elastic nature of the microelectromechanical element once the predetermined angle has been reached; and
   the anchor spring is one of triangular, stepped pyramidic dual triangular, rectangular and a coil.

13. The device according to claim 1, wherein
the platform is formed from a first ceramic material;
the first planar waveguide and optical circuit each comprise a core formed from a second ceramic material.

14. The device according to claim 13, wherein
either:
   the first ceramic material is silicon;
   the second ceramic material is either silicon carbide or silicon nitride;
or
   the second predetermined ceramic material is one of silicon carbide (SiC), silicon nitride ($Si_3N_4$), aluminum nitride (AlN), alumina ($Al_2O_3$), zirconia ($ZrO_2$), and diamond (C).

15. The device according to claim 1, further comprising
an actuator coupled to the R-MEMS for adjusting a gap between the facet and the first surface; wherein
the gap is modulated by a dither signal applied to the actuator; and
a signal generated in dependence upon the modulated gap is employed by a control circuit to manage one or more aspects of performance of an optical system comprising at least the optical circuit and the planar waveguide.

16. The device according to claim 1, wherein
at least one of:
   the optical circuit couples to free space optical elements; and
   the device is one of a pair of paired devices within an optical device.

17. The device according to claim 1, wherein
the MEMS actuator is one of a plurality of MEMS actuators coupled to each other to increase the angular range of rotation for at least one of a predetermined actuation signal applied to the plurality of MEMS actuators and a maximum angular motion of the plurality of MEMS actuators.

18. A device comprising:
a rotatable microelectromechanical system (R-MEMS) formed upon a substrate comprising a platform coupled to a MEMS actuator for rotating the platform relative to the substrate, the platform having at least a front surface and a back surface;
a first optical circuit disposed on the platform supporting optical signal propagation within a predetermined wavelength range, the first optical circuit having a first surface disposed proximate the front surface of the platform and a second surface disposed towards the back surface of the platform; and
a second optical circuit formed upon the substrate supporting optical signal propagation within the predetermined wavelength range, the optical circuit having a facet disposed adjacent to the front surface, wherein
the front surface, first surface, and facet have a predetermined geometrical shape in a plane parallel to the substrate.

19. The device according to claim 18, wherein
the first optical circuit comprises a planar waveguide; and
the first optical circuit also comprises a second surface disposed towards the back surface of the platform.

20. The device according to claim 18, wherein
a first portion of the second optical circuit is disposed relative to a first portion of the first optical circuit when the R-MEMS is rotated to a first position; and
the first portion of the second optical circuit is disposed relative to a second portion of the first optical circuit when the R-MEMS is rotated to a second position.

21. A device comprising:
a rotatable microelectromechanical system (R-MEMS) formed upon a substrate comprising a platform coupled to a MEMS actuator for rotating the platform relative to the substrate, the platform having at least a front surface and a back surface;
a first optical circuit comprising at least one optical waveguide disposed on the platform supporting optical signal propagation within a predetermined wavelength range, the first optical circuit having a first surface disposed proximate the front surface of the platform and a second surface disposed towards the back surface of the platform; and
a second optical circuit formed upon the substrate supporting optical signal propagation within the predetermined wavelength range, the optical circuit having a facet disposed adjacent to the front surface, wherein
the front surface, first surface, and facet have a predetermined geometrical shape in a plane parallel to the substrate.

22. The device according to claim 21, wherein
a first portion of the second optical circuit is disposed relative to a first portion of the first optical circuit when the R-MEMS is rotated to a first position; and
the first portion of the second optical circuit is disposed relative to a second portion of the first optical circuit when the R-MEMS is rotated to a second position.

* * * * *